US008916863B2

(12) United States Patent
Ukeda et al.

(10) Patent No.: US 8,916,863 B2
(45) Date of Patent: Dec. 23, 2014

(54) ORGANIC THIN-FILM TRANSISTOR AND METHOD OF MANUFACTURING ORGANIC THIN-FILM TRANSISTOR

(75) Inventors: Takaaki Ukeda, Osaka (JP); Akihito Miyamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/006,776

(22) PCT Filed: Sep. 5, 2012

(86) PCT No.: PCT/JP2012/005628
§ 371 (c)(1),
(2), (4) Date: Sep. 23, 2013

(87) PCT Pub. No.: WO2013/046547
PCT Pub. Date: Apr. 4, 2013

(65) Prior Publication Data
US 2014/0014934 A1   Jan. 16, 2014

(30) Foreign Application Priority Data

Sep. 26, 2011   (JP) .................................. 2011-209333
Oct. 5, 2011   (JP) .................................. 2011-221187

(51) Int. Cl.
*H01L 51/10*   (2006.01)
*H01L 51/40*   (2006.01)
*H01L 51/05*   (2006.01)

(52) U.S. Cl.
CPC ........ *H01L 51/0545* (2013.01); *H01L 51/0558* (2013.01); *H01L 51/102* (2013.01)
USPC ............................................. 257/40; 438/99

(58) Field of Classification Search
USPC ............................................. 257/40; 438/99
See application file for complete search history.

(56) References Cited

U.S. PATENT DOCUMENTS 7,692,188 B2   4/2010   Cho et al.
7,858,971 B2   12/2010   Song et al.
(Continued)

FOREIGN PATENT DOCUMENTS

JP   2007-300116   11/2007
JP   2008-022008   1/2008
(Continued)

OTHER PUBLICATIONS

U.S. Appl. No. 13/968,571 to Yuko Okumoto et al., filed Aug. 16, 2013.
(Continued)

*Primary Examiner* — Daniel Shook
(74) *Attorney, Agent, or Firm* — Greenblum & Bernstein P.L.C.

(57) ABSTRACT

A transistor manufacturing method includes: forming a gate electrode above a substrate; forming a gate insulator above the gate electrode; forming source and drain electrodes above the gate insulator; forming a sacrificial layer above the source and drain electrodes; forming a partition wall layer above the sacrificial layer; forming an opening by patterning the partition wall layer to partly expose the sacrificial layer; removing the sacrificial layer to expose the source and drain electrodes; and forming an organic semiconductor layer to cover the source and drain electrodes and the gate insulator, wherein the source and drain electrodes occupy 50% or more of a surface area of the opening, and the source and drain electrodes are spaced apart at an interval smaller than an average granular diameter of crystals each of which is at least partly positioned above the source or drain electrode.

26 Claims, 29 Drawing Sheets

(56) References Cited

U.S. PATENT DOCUMENTS

| | | |
|---|---|---|
| 8,324,612 B2 | 12/2012 | Lee et al. |
| 2005/0279999 A1 | 12/2005 | Lee et al. |
| 2006/0052195 A1* | 3/2006 | Hu et al. .................. 474/122 |
| 2007/0254429 A1 | 11/2007 | Cho et al. |
| 2008/0012024 A1 | 1/2008 | Song et al. |
| 2010/0090204 A1 | 4/2010 | Chuman et al. |
| 2010/0213461 A1 | 8/2010 | Akimoto et al. |
| 2011/0084261 A1 | 4/2011 | Sekiya et al. |
| 2013/0187177 A1 | 7/2013 | Nanai et al. |
| 2013/0328033 A1 | 12/2013 | Okumoto et al. |
| 2013/0328034 A1 | 12/2013 | Okumoto et al. |
| 2013/0328035 A1 | 12/2013 | Okumoto et al. |

FOREIGN PATENT DOCUMENTS

| | | |
|---|---|---|
| JP | 4224038 | 2/2009 |
| JP | 2009-200484 | 9/2009 |
| JP | 2010-3747 | 1/2010 |
| JP | 2010-226097 | 10/2010 |
| JP | 2010-267752 | 11/2010 |
| JP | 2011-54877 | 3/2011 |
| WO | 2008/117395 | 10/2008 |

OTHER PUBLICATIONS

U.S. Appl. No. 13/968,559 to Yuko Okumoto et al., filed Aug. 16, 2013.

U.S. Appl. No. 14/113,971 to Takaaki Ukeda et al., filed Oct. 25, 2013.

Search report from International Search Report in PCT/JP2012/005628, mail date is Oct. 2, 2012.

* cited by examiner (a)        (b)

(a)

(b)

(c)

(d)

(e)

(f)

ORGANIC THIN-FILM TRANSISTOR AND METHOD OF MANUFACTURING ORGANIC THIN-FILM TRANSISTOR

TECHNICAL FIELD

The present invention relates to an organic thin-film transistor including a channel layer made of an organic material and a method of manufacturing an organic thin-film transistor.

BACKGROUND ART

Conventionally, a liquid display device or a display device of an active matrix driving type such as an organic electro luminescence (EL) display device includes a thin-film transistor called a TFT.

In general, display device on the market includes thin-film transistors having semiconductor layers made of silicon. In recent years, organic thin-film transistors having semiconductor layers made of organic materials have been focused on. Organic materials have characteristics of being flexible because of molecular coupling by intermolecular attraction dissimilar to atomic coupling in the case of a silicon crystal. Accordingly, use of organic thin-film transistors makes it possible to realize electric devices which are lighter, thinner, and more flexible than electric devices including silicon thin-film transistors. For this reason, applications of organic thin-film transistors to next-generation display devices, electric paper, etc. have been proposed. For example, Patent Literature 1 discloses organic thin-film transistors of a bottom gate type.

FIG. 31 is a cross-sectional view of a structure of a conventional organic thin-film transistor. As shown in FIG. 31, the conventional organic thin-film transistor 100 includes the following formed sequentially above a substrate 101: a gate electrode 102; a gate insulator 103; a pair of a source electrode 104S and a drain electrode 104D; a partition wall part (bank) 106 above the gate electrode 102; and an organic semiconductor layer 107 formed in an opening of the partition wall part 106 using an ink jet method. Furthermore, a protection film 108 is formed above the organic semiconductor layer 107, and an interlayer insulator 109 is formed to cover the protection film 108.

CITATION LIST

Patent Literature

[PTL 1]
Japanese Unexamined Patent Application Publication No. 2008-022008

SUMMARY OF INVENTION

Technical Problem

However, there have been demands for TFTs having characteristics more excellent than those of conventional organic thin-film transistors.

The present invention was made to achieve this object, with an aim to provide an organic thin-film transistor having more excellent TFT characteristics and a method of manufacturing the organic thin-film transistor.

Solution to Problem

In order to solve the above problem, an organic thin-film transistor manufacturing method according to an aspect of the present invention includes: forming a gate electrode above a substrate; forming a gate insulator above the gate electrode; forming a source electrode and a drain electrode spaced apart above the gate insulator; forming a sacrificial layer above the source electrode and the drain electrode; forming a partition wall layer above the sacrificial layer; forming an opening by patterning the partition wall layer to expose the gate insulator between the source electrode and the drain electrode and expose a part of the sacrificial layer above the source electrode and the drain electrode; removing the exposed part of the sacrificial layer to expose the source electrode and the drain electrode; and forming, in the opening, an organic semiconductor layer to cover exposed top surfaces of the source electrode and the drain electrode and a top surface of the gate insulator, wherein the exposed top surfaces of the source electrode and the drain electrode in the opening occupy 50% or more of a surface area of the opening, and the source electrode and the drain electrode are spaced apart at an interval which is smaller than an average granular diameter of crystals each of which is at least partly positioned above at least one of the source electrode and the drain electrode among the crystals of the organic semiconductor layer.

Advantageous Effects of Invention

According to the present invention, it is possible to realize an organic thin-film transistor having excellent TFT characteristics.

BRIEF DESCRIPTION OF DRAWINGS

FIG. 1A is a cross-sectional view of a structure of an organic thin-film transistor according to Embodiment 1 of the present invention.
FIG. 1B is a cross-sectional view of a structure of a wired substrate including the organic thin-film transistor according to Embodiment 1 of the present invention.
FIGS. 2(a) to 2(g) are composed of cross-sectional views for explaining processes in a method of manufacturing the organic thin-film transistor according to Embodiment 1 of the present invention.
FIGS. 3(a) to 3(g) are composed of cross-sectional views for explaining processes in the method of manufacturing the organic thin-film transistor according to Embodiment 1 of the present invention.
FIG. 4 is a diagram for explaining a problem in a conventional organic thin-film transistor.
FIGS. 5(a) to 5(c) are composed of cross-sectional views for explaining characteristic processes in the method of manufacturing the organic thin-film transistor according to Embodiment 1 of the present invention.
FIG. 6A is an SEM photograph of a surface of the conventional organic thin-film transistor shown in FIG. 4.

FIG. 6C is a diagram showing a relationship (transfer characteristics) between the conventional organic thin-film transistor shown in FIG. 4 and the organic thin-film transistor according to Embodiment 1 of the present invention shown in FIG. 1A.

FIGS. 7(a) and 7(b) are composed of diagrams each showing a relationship of (i) a distance between a source electrode and a drain electrode and (ii) a maximum crystal grain diameter G in an organic semiconductor layer.

FIG. 8 is composed of a top plan view and a cross-sectional view of a structure of an organic thin-film transistor according to Comparison example 1.

FIG. 9A is composed of a top plan view and a cross-sectional view of the structure of the organic thin-film transistor according to Embodiment 1 of the present invention.

FIG. 9B is composed of a top plan view and a cross-sectional view of a structure of another organic thin-film transistor according to Embodiment 1 of the present invention.

FIG. 10A is a cross-sectional view of a structure of an organic thin-film transistor according to Variation 1 of Embodiment 1 of the present invention.

FIG. 10B is a cross-sectional view of a structure of a wired substrate including the organic thin-film transistor according to Variation 1 of Embodiment 1 of the present invention.

FIG. 11A is a cross-sectional view of a structure of an organic thin-film transistor according to Variation 2 of Embodiment 1 of the present invention.

FIG. 11B is a cross-sectional view of a structure of a wired substrate including the organic thin-film transistor according to Variation 2 of Embodiment 1 of the present invention.

FIG. 11C is an enlarged cross-sectional view of an area enclosed by broken lines shown in FIG. 11A, that is, an enlarged cross-sectional view of a part of the organic thin-film transistor according to Variation 2 of Embodiment 1 of the present invention.

FIG. 12A is a cross-sectional view of a structure of an organic thin-film transistor according to Embodiment 2 of the present invention.

FIG. 12B is a cross-sectional view of a structure of a wired substrate including the organic thin-film transistor according to Embodiment 2 of the present invention.

FIGS. 13(a) to 13(f) are composed of cross-sectional views for explaining processes in the method of manufacturing the organic thin-film transistor according to Embodiment 2 of the present invention.

FIGS. 14(a) to 14(e) are composed of cross-sectional views for explaining processes in the method of manufacturing the organic thin-film transistor according to Embodiment 2 of the present invention.

FIG. 15A is a cross-sectional view of a structure of an organic thin-film transistor according to Variation 1 of Embodiment 2 of the present invention.

FIG. 15B is a cross-sectional view of a structure of a wired substrate including the organic thin-film transistor according to Variation 1 of Embodiment 2 of the present invention.

FIG. 16A is a cross-sectional view of a structure of an organic thin-film transistor according to Variation 2 of Embodiment 2 of the present invention.

FIG. 16B is a cross-sectional view of a structure of a wired substrate including the organic thin-film transistor according to Variation 2 of Embodiment 2 of the present invention.

FIG. 16C is an enlarged cross-sectional view of an area enclosed by broken lines shown in FIG. 16A, that is, an enlarged cross-sectional view of a part of the organic thin-film transistor according to Variation 2 of Embodiment 2 of the present invention.

FIG. 17A is a cross-sectional view of a structure of an organic thin-film transistor according to Embodiment 3 of the present invention.

FIG. 17B is a cross-sectional view of a structure of a wired substrate including the organic thin-film transistor according to Embodiment 3 of the present invention.

FIGS. 18(a) to 18(f) are composed of cross-sectional views for explaining processes in the method of manufacturing the organic thin-film transistor according to Embodiment 3 of the present invention.

FIGS. 19(a) to 19(f) are composed of cross-sectional views for explaining processes in the method of manufacturing the organic thin-film transistor according to Embodiment 3 of the present invention.

FIGS. 20(a) to 20(d) are composed of cross-sectional views for explaining characteristic processes in the method of manufacturing the organic thin-film transistor according to Embodiment 3 of the present invention.

FIG. 21A is a cross-sectional view of a structure of an organic thin-film transistor according to Variation 1 of Embodiment 3 of the present invention.

FIG. 21B is a cross-sectional view of a structure of a wired substrate including the organic thin-film transistor according to Variation 1 of Embodiment 3 of the present invention.

FIG. 22A is a cross-sectional view of a structure of an organic thin-film transistor according to Variation 2 of Embodiment 3 of the present invention.

FIG. 22B is a cross-sectional view of a structure of a wired substrate including the organic thin-film transistor according to Variation 2 of Embodiment 3 of the present invention.

FIG. 22C is an enlarged cross-sectional view of an area enclosed by broken lines shown in FIG. 22A, that is, an enlarged cross-sectional view of a part of the organic thin-film transistor according to Variation 2 of Embodiment 3 of the present invention.

FIG. 23A is a cross-sectional view of a structure of an organic thin-film transistor according to Embodiment 4 of the present invention.

FIG. 23B is a cross-sectional view of a structure of a wired substrate including the organic thin-film transistor according to Embodiment 4 of the present invention.

FIGS. 24(a) to 24(f) are composed of cross-sectional views for explaining processes in the method of manufacturing the organic thin-film transistor according to Embodiment 4 of the present invention.

FIGS. 25(a) to 25(f) are a cross-sectional view for explaining processes in the method of manufacturing the organic thin-film transistor according to Embodiment 4 of the present invention.

FIG. 26A is composed of cross-sectional views of structures of an organic thin-film transistor according to Variation 1 of Embodiment 4 of the present invention.

FIG. 26B is a cross-sectional view of a structure of a wired substrate including the organic thin-film transistor according to Variation 1 of Embodiment 4 of the present invention.

FIG. 27A is a cross-sectional view of a structure of an organic thin-film transistor according to Variation 2 of Embodiment 4 of the present invention.

FIG. 27B is a cross-sectional view of a structure of a wired substrate including the organic thin-film transistor according to Variation 2 of Embodiment 4 of the present invention.

FIG. 27C is an enlarged cross-sectional view of an area enclosed by broken lines shown in FIG. 27A, that is, an enlarged cross-sectional view of a part of the organic thin-film transistor according to Variation 2 of Embodiment 4 of the present invention.

FIG. 28 is a partially cutaway perspective view of an organic EL display device according to Embodiment 5 of the present invention.

FIG. 29 is a diagram showing a circuit structure of pixels in the organic EL display device according to Embodiment 5 of the present invention.

FIG. 30A shows a top plan view of a structure of an organic thin-film transistor according to Comparison example 2.

FIG. 30B is a top plan view of a structure of an organic thin-film transistor according to a variation of the present invention.

FIG. 31 is a cross-sectional view of a structure of a conventional organic thin-film transistor.

FIGS. 32(a) to 32(f) are composed of cross-sectional views for explaining processes in a method of manufacturing a conventional organic thin-film transistor.

FIGS. 33(a) to 33(d) are composed of cross-sectional views for explaining processes in the method of manufacturing the conventional organic thin-film transistor.

DESCRIPTION OF EMBODIMENTS (Underlying Knowledge Resulted in Aspect of the Present Invention)

The underlying knowledge resulted in an aspect of the present invention is described first.

Figure 31:
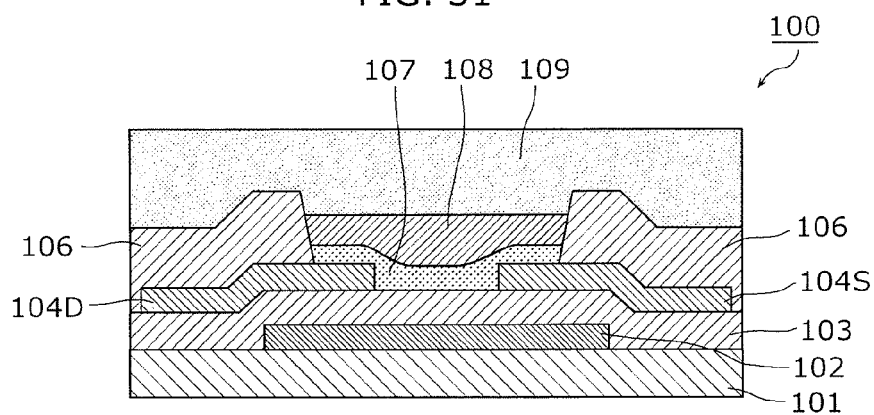
[FIG. 31]

The Inventors have keenly studied conventional organic thin-film transistors, and found that residues resulting from patterning of a partition wall part (bank) enclosing an organic semiconductor layer are a factor of deterioration in characteristics of TFTs. Hereinafter, this factor is described in terms of a manufacturing method with reference to FIG. 32 and FIG. 33. Each of FIG. 32 and FIG. 33 is composed of cross-sectional views of processes of a method of manufacturing a conventional organic thin-film transistor shown in FIG. 31.

Figure 32:
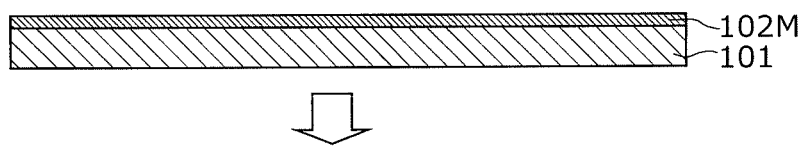
[FIG. 32]
Figure 32:
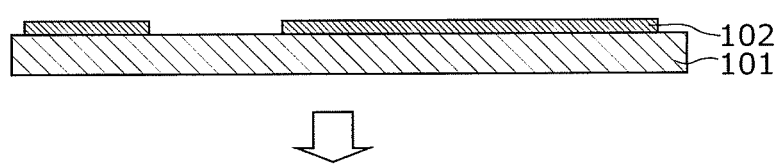
Figure 32:
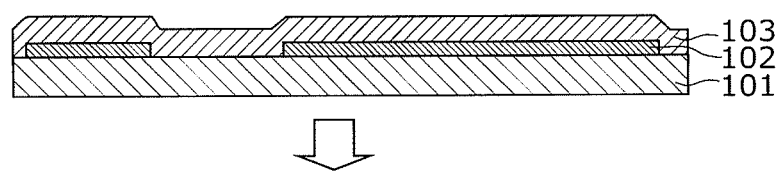
Figure 32:
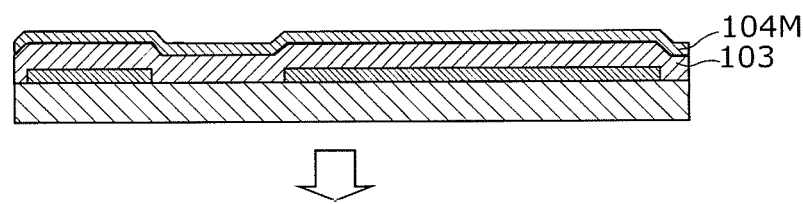
Figure 32:
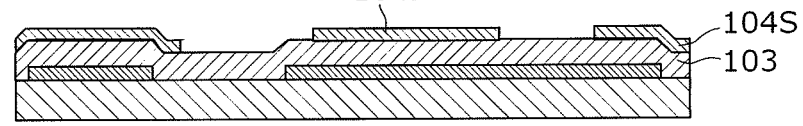
Figure 32:
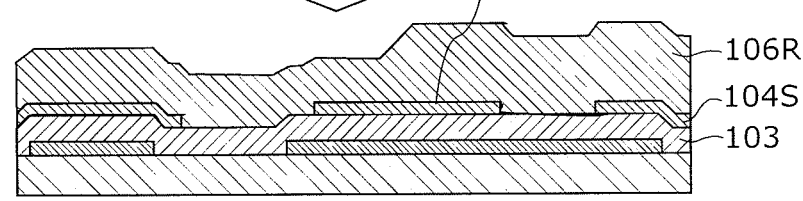
Figure 33:
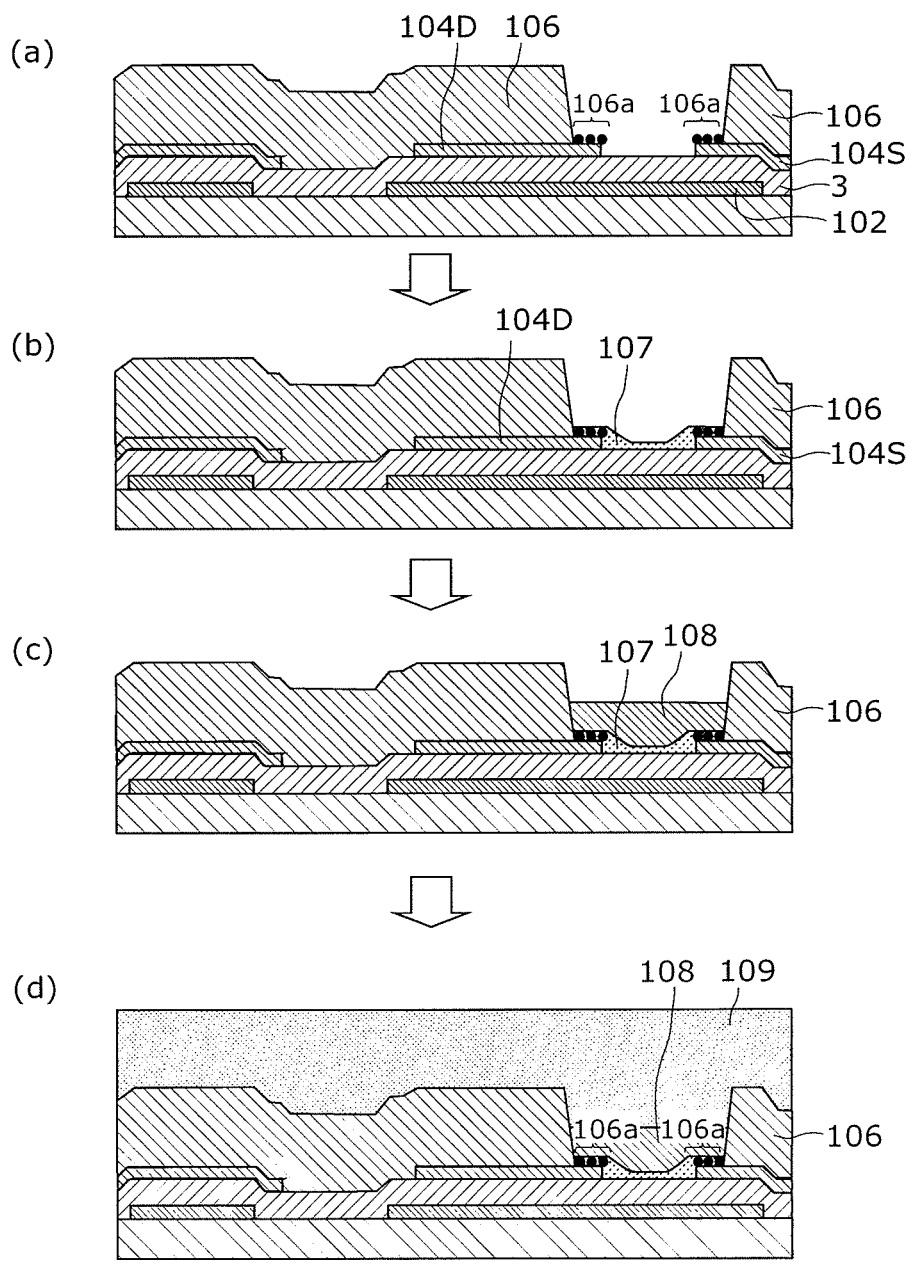
[FIG. 33]

In the conventional manufacturing method: first, as shown in (a) of FIG. 32, a first metal film (gate metal film) 102M is formed above a substrate 101; and then, as shown in (b) of FIG. 32, the first metal film 102M is patterned to form a gate electrode 102 having a predetermined shape. Subsequently, as shown in (c) of FIG. 32, a gate insulator 103 is formed above the substrate 101 to cover the gate electrode 102.

Subsequently, as shown in (d) of FIG. 32, a second metal film (a source drain metal film) 104M above the gate insulator 103, and then, as shown in (e) of FIG. 32, the second metal film 104M is patterned to form a pair of a source electrode 104S and a drain electrode 104D having a predetermined shape.

Next, as shown in (f) of FIG. 32, a partition wall layer 106R is formed entirely above the substrate 101 to cover the source electrode 104S and the drain electrode 104D. Subsequently, as shown in (a) of FIG. 33, the partition wall layer 106R is exposed and developed to form an opening above the gate electrode 102 so that the source electrode 104S and the drain electrode 104D are partly exposed and a partition wall part 106 is formed to have a predetermined shape.

Next, as shown in (b) of FIG. 33, an organic semiconductor layer 107 is formed by applying a solution including an organic semiconductor material to the opening of the partition wall part 106 using an ink jet method, and performing heat treatment on the solution to crystallize the organic semiconductor material. Subsequently, as shown in (C) of FIG. 33, a protection film 108 is formed in the opening of the partition wall part 106; and, as shown in (d) of FIG. 33, an interlayer insulator 109 is formed entirely above the substrate 101 including the protection film 108.

As a result of keen study of the conventional organic thin-film transistors, as shown in (a) of FIG. 33, the Inventors of the present invention found that the partition wall layer 106R remains as residues 106a above each of the end portions of the source electrode 104S and the drain electrode 104D exposed when the opening is formed in the partition wall layer 106R, and that the residues 106a are the factor of deterioration in the characteristics of the TFT. In other words, the residues 106a of the partition wall layer 106R hamper crystallization of the organic semiconductor layer 107 above the source electrode 104S and the drain electrode 104D and increase contact resistances between (i) each of the source electrode 104S and the drain electrode 104 and (ii) the organic semiconductor layer 7, and thereby deteriorates the characteristics of the TFT.

In particular, in order that the partition wall part 106 has repellency to liquid, an organic material including a functional additive such as a fluorine additive may be used as a material for the partition wall layer 106R. In this case, although the partition wall layer 106R is developed and patterned with its intrinsic function maintained, the functional additive is particularly likely to remain, at the time of the development, to be the residues 106a of the partition wall layer 106R above the source electrode 104S and the drain electrode 104D.

Based on this knowledge, the Inventors of the present invention were able to obtain a new idea of being able to suppress deterioration in TFT characteristics by preventing the partition wall layer from remaining as residues on the source electrode and the drain electrode and in contact with the organic semiconductor layer.

Based on this idea, an organic thin-film transistor manufacturing method according to an aspect of the present invention was made to include: forming a gate electrode above a substrate; forming a gate insulator above the gate electrode; forming a source electrode and a drain electrode spaced apart above the gate insulator; forming a sacrificial layer above the source electrode and the drain electrode; forming a partition wall layer above the sacrificial layer; forming an opening by patterning the partition wall layer to expose the gate insulator between the source electrode and the drain electrode and expose a part of the sacrificial layer above the source electrode and the drain electrode; removing the exposed part of the sacrificial layer to expose the source electrode and the drain electrode; and forming, in the opening, an organic semiconductor layer to cover exposed top surfaces of the source electrode and the drain electrode and a top surface of the gate insulator, wherein the exposed top surfaces of the source electrode and the drain electrode in the opening occupy 50% or more of a surface area of the opening, and the source electrode and the drain electrode are spaced apart at an interval which is smaller than an average granular diameter of crystals each of which is at least partly positioned above at least one of the source electrode and the drain electrode among the crystals of the organic semiconductor layer.

According to this aspect, the residues of the partition wall layer at the time when the opening is formed in the partition wall layer are removed by etching together with the sacrificial layer exposed in the opening. In this way, it is possible to achieve excellent crystallizability of the organic semiconductor layer at the interface between the source electrode and the drain electrode, and to suppress increase in the contact resistances. Accordingly, it is possible to realize the organic thin-film transistor having excellent ON-characteristics.

Furthermore, according to this aspect, the occupation rate of the source electrode and the drain electrode with respect to the opening is 50% or more, and the interval (length of a channel) between the source electrode and the drain electrode is smaller than the average granular diameter of crystals each of which is at least partly positioned above at least one of the source electrode and the drain electrode among the crystals of the organic semiconductor layer. This makes it possible to grow the organic semiconductor layer to have crystals of large granules each of which is at least partly positioned above at least one of the source electrode and the drain electrode. As a result, it is possible to reduce the number of grain boundaries between the source electrode and the drain electrode, and to thereby increase the carrier mobility.

In addition, in the organic thin-film transistor manufacturing method according to the aspect of the present invention, in a top plan view, the source electrode exposed in the opening and the gate electrode may overlap in a first area, the drain electrode exposed in the opening and the gate electrode may overlap in a second area, and each of the first and second areas may have, along a channel direction, a side having a length larger than the interval between the source electrode and the drain electrode.

In this way, it is possible to sufficiently accelerate an area in which the thickness of the organic semiconductor layer is less likely to vary at one or both of the sides of the channel area, and to thereby accelerate the crystal growth of the organic semiconductor layer above the source electrode and the drain electrode. As a result, it is possible to accelerate the crystal growth of the organic semiconductor layer above the source electrode and the drain electrode, and to thereby yield crystals having large grain diameters. Accordingly, it is possible to realize the organic thin-film transistor having excellent TFT characteristics.

In addition, in the organic thin-film transistor manufacturing method according to the aspect of the present invention, in a top plan view, the gate electrode may have an end portion positioned outward from the opening.

In this way, since the gate electrode is formed entirely in the opening, it is possible to reduce variation in the film thickness of the organic semiconductor layer in the opening. Accordingly, it is possible to realize the organic thin-film transistor having excellent TFT characteristics.

Alternatively, in the organic thin-film transistor manufacturing method according to the aspect of the present invention, in a top plan view, the gate electrode may have an end portion positioned inward from the opening.

In this way, since the end portion of the gate electrode is in the opening, it is possible to reduce parasitic capacitance between the gate electrode and the source electrode (the drain electrode), compared to the case of forming a gate electrode entirely in the opening. Accordingly, it is possible to increase operation speed of the device by using the thin-film transistor according to this aspect.

In addition, in the organic thin-film transistor manufacturing method according to the aspect of the present invention, the opening may be rectangular, the source electrode may be a comb-shaped electrode having a comb-tooth portion formed along a first side of the opening, the drain electrode may be a comb-shaped electrode having a comb-tooth portion formed along a second side of the opening, the drain electrode being disposed such that at least one tooth of the comb-tooth portion of the drain electrode is positioned between teeth of the comb-tooth portion of the source electrode, and at least one of the comb-tooth portion of the source electrode and the comb-tooth portion of the drain electrode may have a tip which is apart from a third side different from the first side and the second side of the opening.

In this aspect, at least one of the tips of the comb-tooth portions of the comb-shaped source electrode and drain electrode is apart from the third side of the opening. In this way, it is possible to form the transistor so that the portion in contact with the inner peripheral portion of the opening is not included in the channel area. Thus, it is possible to reduce the influence to the TFT characteristics even if the diameters of the crystal grains in the organic semiconductor layer are small in the inner peripheral portion of the opening. Accordingly, it is possible to realize the organic thin-film transistor having excellent TFT characteristics.

In addition, in the organic thin-film transistor manufacturing method according to the aspect of the present invention, the forming of a source electrode and a drain electrode spaced apart and the forming of a sacrificial layer may include: forming a metal film above the gate insulator; forming the sacrificial layer above the metal film; patterning the sacrificial layer; and patterning the metal film to form the source electrode and the drain electrode.

According to this aspect, it is possible to form by patterning the sacrificial layer, the source electrode, and the drain electrode in separate processes.

Alternatively, in the organic thin-film transistor manufacturing method according to the aspect of the present invention, the forming of a source electrode and a drain electrode spaced apart and the forming of a sacrificial layer may include: forming a metal film above the gate insulator; forming the sacrificial layer above the metal film; and collectively patterning the sacrificial layer and the metal film.

According to this aspect, since the sacrificial layer and the metal film are patterned collectively, it is possible to form, by patterning, the sacrificial layer, the source electrode, and the drain electrode to have the same shape.

In addition, in the organic thin-film transistor manufacturing method according to the aspect of the present invention, the sacrificial layer may include one of a metal, a metal alloy, or a metal compound. In this case, the sacrificial layer preferably has a sheet resistance lower than a sheet resistance of the source electrode and a sheet resistance of the drain electrode.

In this way, it is possible to change the resistance states of the source electrode and the drain electrode to low resistance states. Furthermore, it is possible to reduce the resistance in the wiring made of the same material as those of the source electrode and the drain electrode.

Alternatively, in the organic thin-film transistor manufacturing method according to the aspect of the present invention, the sacrificial layer may include an insulation material.

In this way, it is possible to form the sacrificial layer using an insulation material.

In addition, in the organic thin-film transistor manufacturing method according to the aspect of the present invention, the sacrificial layer may include a material having repellency to liquid.

With the sacrificial layer having repellency to liquid, the organic semiconductor material applied in the opening gathers around the center (above the gate electrode) of the opening. Thus, it is possible to form a thick organic semiconductor layer above the gate electrode. In this way, it is possible to increase the ON-current characteristics, and to thereby realize the organic thin-film transistor having excellent TFT characteristics.

In addition, in the organic thin-film transistor manufacturing method according to the aspect of the present invention, the sacrificial layer may include a fluorine additive.

In this way, it is possible to easily provide the sacrificial layer with repellency to liquid.

In addition, in the organic thin-film transistor manufacturing method according to the aspect of the present invention, in the forming of an organic semiconductor layer, the organic semiconductor layer may be formed by applying, to the opening, an organic semiconductor solution for forming the organic semiconductor layer and performing heat treatment on the organic semiconductor solution.

In addition, an organic thin-film transistor according to an aspect of the present invention includes: a substrate; a gate electrode above the substrate; a gate insulator above the gate electrode; a source electrode and a drain electrode above the gate insulator; a sacrificial layer above the source electrode and the drain electrode; a partition wall part above the sacrificial layer, and having an opening in which the gate insulator above the gate electrode is exposed; and an organic semiconductor layer in the opening, wherein the sacrificial layer is exposed, in the opening, the source electrode and the drain electrode, the organic semiconductor layer covers, in the opening, exposed top surfaces of the source electrode and the drain electrode and a top surface of the gate insulator, the exposed top surfaces of the source electrode and the drain electrode in the opening occupy 50% or more of a surface area of the opening, and the source electrode and the drain electrode are spaced apart at an interval which is smaller than an average granular diameter of crystals each of which is at least partly positioned above at least one of the source electrode and the drain electrode among the crystals of the organic semiconductor layer.

According to this aspect, since the sacrificial layer is formed so that the source electrode and the drain electrode are exposed in the opening, there is no residue of the partition wall layer on the exposed source and drain electrodes. In this way, it is possible to achieve excellent crystallizability of the organic semiconductor layer at the interfaces with the source electrode and the drain electrode, and to suppress increase in the contact resistances. Accordingly, it is possible to realize the organic thin-film transistor having excellent ON-characteristics.

Furthermore, according to this aspect, the occupation rate of the source electrode and the drain electrode with respect to the opening is 50% or more, and the interval (length of a channel) between the source electrode and the drain electrode is smaller than the average granular diameter of crystals each of which is at least partly positioned above at least one of the source electrode and the drain electrode among the crystals of the organic semiconductor layer. This makes it possible to grow the organic semiconductor layer to have crystals of large granules each of which is at least partly positioned above at least one of the source electrode and the drain electrode. As a result, it is possible to reduce the number of grain boundaries between the source electrode and the drain electrode, and to thereby increase the carrier mobility.

In addition, in the organic thin-film transistor according to the aspect of the present invention, in a top plan view, the source electrode exposed in the opening and the gate electrode may overlap in a first area, the drain electrode exposed in the opening and the gate electrode may overlap in a second area, and each of the first and second areas may have, along a channel direction, a side having a length larger than the interval between the source electrode and the drain electrode.

In this way, it is possible to sufficiently secure an area in which the thickness of the organic semiconductor layer is less likely to vary at one or both of the sides of the channel area, and to thereby accelerate the crystal growth of the organic semiconductor layer above the source electrode and the drain electrode. As a result, it is possible to accelerate the crystal growth of the organic semiconductor layer above the source electrode and the drain electrode, and to thereby yield crystals having large grain diameters. Accordingly, it is possible to realize the organic thin-film transistor having excellent TFT characteristics.

In addition, in the organic thin-film transistor according to the aspect of the present invention, in a top plan view, the gate electrode may have an end portion positioned outward from the opening.

In this way, since the gate electrode is formed entirely in the opening, it is possible to reduce variation in the film thickness of the organic semiconductor layer in the opening. Accordingly, it is possible to realize the organic thin-film transistor having excellent TFT characteristics.

Alternatively, in the organic thin-film transistor according to the aspect of the present invention, in a top plan view, the gate electrode may have an end portion positioned inward from the opening.

In this way, since the end portion of the gate electrode is in the opening, it is possible to reduce parasitic capacitance between the gate electrode and the source electrode (the drain electrode), compared to the case of forming a gate electrode entirely in the opening. Accordingly, it is possible to increase operation speed of the device by using the thin-film transistor according to this aspect.

In addition, in the organic thin-film transistor according to the aspect of the present invention, the opening may be rectangular, the source electrode may be a comb-shaped electrode having a comb-tooth portion formed along a first side of the opening, the drain electrode may be a comb-shaped electrode having a comb-tooth portion formed along a second side of the opening, the drain electrode being disposed such that at least one tooth of the comb-tooth portion of the drain electrode is positioned between teeth of the comb-tooth portion of the source electrode, and at least one of the comb-tooth portion of the source electrode and the comb-tooth portion of the drain electrode may have a tip which is apart from a third side different from the first side and the second side of the opening.

In this way, it is possible to form the transistor so that the portion in contact with the inner peripheral portion of the opening is not included in the channel area. Thus, it is possible to reduce the influence to the TFT characteristics even if the diameter of the crystal grains in the organic semiconductor layer is small in the inner peripheral portion of the opening. Accordingly, it is possible to realize an organic thin-film transistor having excellent TFT characteristics.

CL19

In addition, in the organic thin-film transistor according to the aspect of the present invention, the sacrificial layer may be above a part of the source electrode and a part of the drain electrode.

In addition, in the organic thin-film transistor according to the aspect of the present invention, the sacrificial layer may have a top-plan-view shape identical to top-plan-view shapes of the source electrode and the drain electrode in an area other than the opening of the partition wall layer.

In addition, in the organic thin-film transistor according to the aspect of the present invention, the sacrificial layer may have, at a side of the opening, an edge which is vertically flat with an edge of the opening in the partition wall layer.

Alternatively, in the organic thin-film transistor according to the aspect of the present invention, the sacrificial layer may have, at a side of the opening, an edge which is positioned outward from an edge of the opening in the partition wall layer.

In addition, in the organic thin-film transistor according to the aspect of the present invention, the sacrificial layer may include one of a metal, a metal alloy, or a metal compound. In this case, the sacrificial layer preferably has a sheet resistance lower than a sheet resistance of the source electrode and a sheet resistance of the drain electrode.

Alternatively, in the organic thin-film transistor according to the aspect of the present invention, the sacrificial layer may include an insulation material.

In addition, in the organic thin-film transistor according to the aspect of the present invention, the sacrificial layer may include a material having repellency to liquid.

In addition, in the organic thin-film transistor according to the aspect of the present invention, the sacrificial layer may include a fluorine additive.

In addition, in the organic thin-film transistor according to the aspect of the present invention, the organic semiconductor layer may be a layer formed using a coating method.

Hereinafter, descriptions are given of embodiments of an organic thin-film transistor and a method of manufacturing an organic thin-film transistor according to the present invention. It is to be noted that the embodiments described below show preferable specific examples of the present invention. Accordingly, the numerical values, shapes, materials, structural elements, the arrangement and connection states of the structural elements, steps (processes), the processing order of the steps etc. shown below are mere examples, and therefore do not limit the scope of the present invention. Therefore, among the structural elements in the following exemplary embodiments, structural elements not recited in any one of the independent claims are described as arbitrary structural elements. It is to be noted that each of the diagram is a schematic diagram, and is not a precise one.

In addition, the organic thin-film transistor according to the present invention is applicable, for example, as a switching element or the like of each pixel in a TFT array substrate as will be described later. The TFT array substrate includes: a plurality of pixels arranged in a matrix; video signal lines (source lines) formed along the column direction of the pixels; and scanning lines (gate lines) formed along the row direction of the pixels.

[Embodiment 1]

Figure 1A:
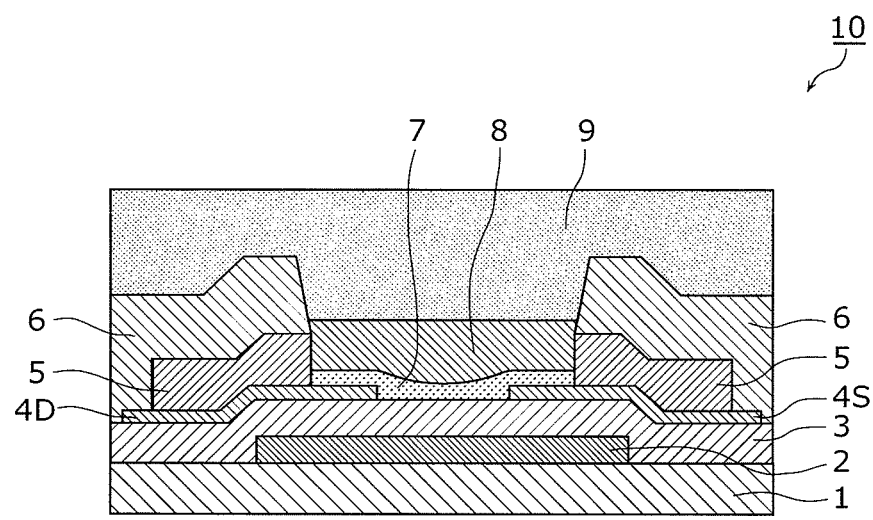
[FIG. 1A]
Figure 1B:
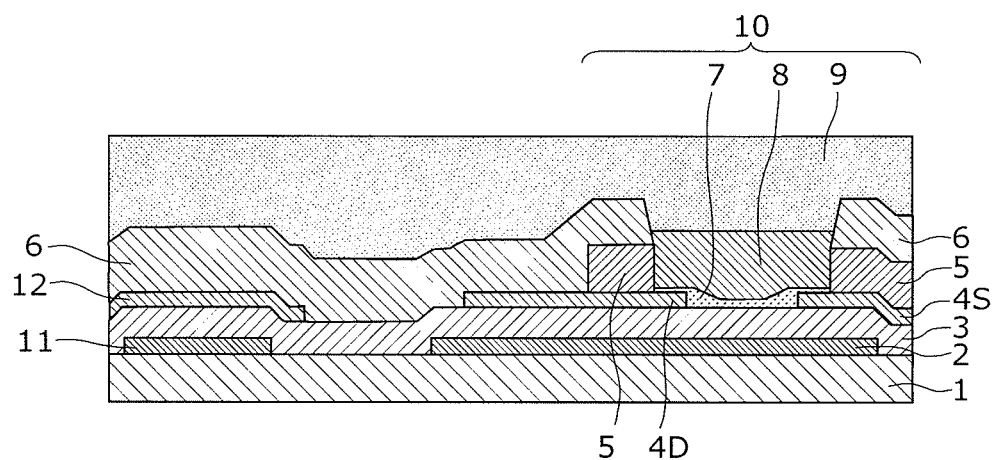
[FIG. 1B]

First, with reference to FIG. 1A and FIG. 1B, a description is given of an organic thin-film transistor 10 according to Embodiment 1 of the present invention. FIG. 1A is a cross-sectional view of a structure of an organic thin-film transistor according to Embodiment 1 of the present invention.

As shown in FIG. 1A, the organic thin-film transistor 10 according to this embodiment is a TFT of a bottom gate type and a p-type (p-channel), and includes a substrate 1, a gate electrode 2, a gate insulator 3, a source electrode 4S, a drain electrode 4D, a sacrificial layer 5, a partition wall part 6 having an opening formed correspondingly to a channel part 8 (an organic semiconductor layer 7), and an organic semiconductor layer 7 formed in the opening of the partition wall part 6. Furthermore, the organic thin-film transistor 10 includes a protection film 8 and an interlayer insulator 9. Hereinafter, structural elements of the organic thin-film transistor 10 are described in detail.

The substrate 1 is a glass substrate made of silica glass or non-alkali glass. The substrate 1 may be a flexible substrate or the like having flexibility such as a plastic film.

The gate electrode 2 is formed by patterning to have a predetermined shape above the substrate 1. The gate electrode 2 is made of a conductive material, an alloy including a conductive material, or the like, and has a single-layer structure or a multi-layer structure. For example, the gate electrode 2 is formed using molybdenum (Mo), aluminium (Al), copper (Cu), tungsten (W), titanium (Ti), chromium (Cr), molybdenum tungsten (MoW), or the like.

Figure 9A:
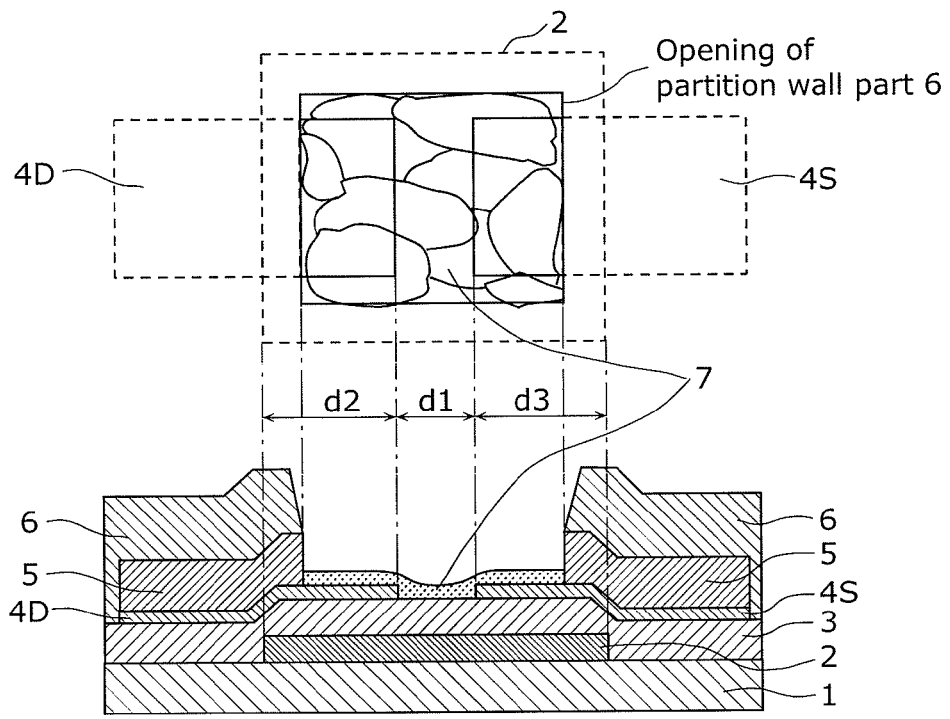
[FIG. 9A]
Figure 9B:
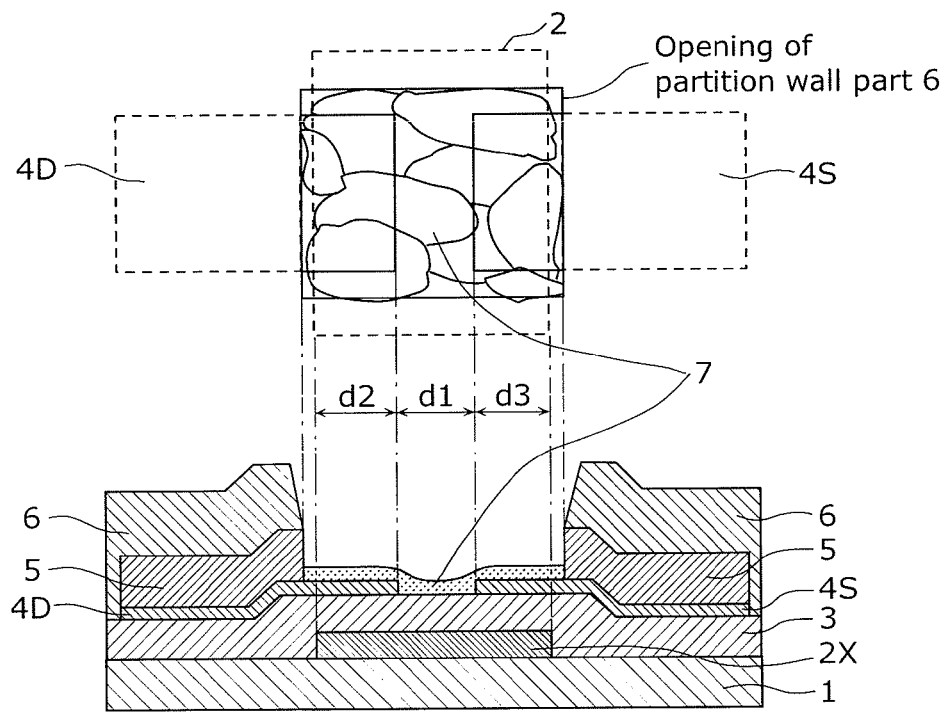
[FIG. 9B]

The gate electrode 2 is formed below the entire opening portion in each of FIG. 1A to FIG. 5 in a top plan view. However, the gate electrode 2 is formed below part of the opening portion as shown in FIG. 9B.

The gate insulator 3 is formed above the gate electrode 2. In this embodiment, the gate insulator 3 is formed above the entire substrate 1 to cover the gate electrode 2. The gate insulator 3 can be formed using an inorganic insulator which is a single layer film or a stacked-layer film such as a silicon oxide film or a silicon nitride film. In addition, the gate insulator 3 can be formed using an organic insulator such as polyimide, polyvinyl phenol, and polypropylene.

The paired source electrode 4S and drain electrode 4D are formed apart above the gate insulator 3 so that they are arranged above the gate electrode 2 facing at a predetermined interval. In addition, the source electrode 4S and drain electrode 4D facing each other are formed to have end portions exposed in the opening of the partition wall part 6. In other words, the end portions at the opening side of the source electrode 4S and drain electrode 4D are positioned in the opening portion of the partition wall part 6 in a top plan view.

In addition, each of the source electrode 4S and the drain electrode 4D is made of a conductive material or an alloy including a conductive material and has a single-layer structure or a multi-layer structure. For example, each of the source electrode 4S and drain electrode 4D is made of Mo, W, Cu, Al, nickel (Ni), aurum (Au), argentums (Ag), MoW, molybdenum nitride (MoN), or the like.

In this embodiment, the source electrode 4S and the drain electrode 4D are in contact with the organic semiconductor layer 7 which is a channel layer, and desirably have a HOMO work function larger than the HOMO work function of the organic semiconductor layer 7. For example, the source electrode 4S and the drain electrode 4D can be formed using a metal such as Au, Ni, MoW or MoN, or a metal alloy or a metal compound including Au, Ni, MoW or MoN, or the like. In this way, it is possible to achieve a contact resistance smaller than contact resistance obtainable as an effect of removing residues in the partition wall layer 6R as will be described later. Thus, it is possible to achieve the organic thin-film transistor having further excellent ON characteristics. For example, it is possible to achieve an excellent ohmic contact with the organic semiconductor layer 7 (in general, a p-type organic semiconductor has a work function of approximately 5.0 eV) using the source electrode 4S and the drain electrode 4D made of Au (having a work function of 5.1 eV), $MoWO_x$ (having a work function of 5.3 eV), or Ni (having a work function of 5.2 eV). Thus, it is possible to form the organic thin-film transistor having a low ON resistance and excellent ON characteristics, and to thereby enhance the performance of a display panel including the transistor.

In consideration of equalizing the film thickness of the organic semiconductor layer 7, the source electrode 4S and the drain electrode 4D are preferably formed to have a film thickness twice as large as the organic semiconductor layer 7, and for example, can have a film thickness in a range of 25 nm to 100 nm.

The sacrificial layer 5 is formed above the source electrode 4S and the drain electrode 4D so that the source electrode 4S and the drain electrode 4D are exposed in the opening of the partition wall part 6. In this embodiment, the sacrificial layer 5 is formed above a part of the source electrode 4S and a part of the drain electrode 4D so that the sacrificial layer 5 above the parts face each other in the opening of the partition wall part 6. In addition, in this embodiment, the sacrificial layer 5 exists only around the channel area.

The sacrificial layer 5 is a layer for removing residues on the top surface thereof when the partition wall part 6 is formed by patterning. The residues are removed together with the sacrificial layer 5 at the sacrifice of the sacrificial layer 5 when the sacrificial layer 5 on which the residues are present is removed. In this embodiment, the end portion which is of the sacrificial layer 5 and exposed in the opening is removed by dry etching, so that the sacrificial layer 5 has, at the side of the opening, an edge which becomes vertically flat with an edge of the opening in the partition wall part 6. In other words, the sacrificial layer 5 and the opening are formed to have the opening-side edge and the edge which are continuous and vertically flat.

In addition, the sacrificial layer 5 is made of a material different from the material of the source electrode 4S and the drain electrode 4D. As the material for the sacrificial layer 5, it is possible to use an insulation material or a metal material such as a metal, a metal alloy, and a metal compound. In addition, it is preferable to use, as the material for the sacrificial layer 5, a material having a large etching selection ratio with each of the materials of the source electrode 4S, the drain electrode 4D, and the partition wall part 6. In this way, with the etching selection ratio between the sacrificial layer 5 and each of the source electrode 4S (the drain electrode 4D) and the partition wall part 6, and it is possible to easily and selectively remove only the part which is of the sacrificial layer 5 and in the opening of the partition wall part 6.

More specifically, it is possible to use an inorganic insulation material such as an oxide film or an organic insulation material when forming the sacrificial layer 5 using an insulation material. When forming the sacrificial layer 5 using a metal material, it is possible to identify the sacrificial layer 5 as the source electrode 4S and the drain electrode 4D since the sacrificial layer 5 has a conductivity. In this case, it is preferable that the sacrificial layer 5 be made of a material having a sheet resistance lower than the sheet resistances of the source electrode 4S and the drain electrode 4D, and can be made of Al, Cu, or the like. In this way, it is possible to substantially reduce the resistance values of the source electrode 4S and the drain electrode 4D including the sacrificial layer 5, and to thereby change the states of the source electrode 4S and the drain electrode 4D into low resistance states.

The partition wall part 6 is formed above the gate insulator 3 to cover the drain electrode 4D and the sacrificial layer 5. The opening of the partition wall part 6 is formed above the gate electrode 2 to separate the organic semiconductor layer 7 into segments for the respective pixels, so that the opening has a rectangular shape in a top plan view in this embodiment. The partition wall part 6 is a bank defining the peripheral area of the organic semiconductor layer 7, and has a function for blocking flow of the organic semiconductor solution applied in the opening to form the organic semiconductor layer 7. In this embodiment, the sacrificial layer 5 is formed above the source electrode 4S and the drain electrode 4D, and thus the opening-side inner wall of the sacrificial layer 5 functions as a bank above the source electrode 4S and the drain electrode 4D.

The opening of the partition wall part 6 is formed to partly expose the source electrode 4S, the drain electrode 4D, and the gate insulator 3. It is possible to form an opening by forming the partition wall portion of the partition wall part 6 using a photosensitive material such as a resist, and by partly exposing and developing the photosensitive resin. It is preferable that the surface of the partition wall part 6 be subject to a predetermined surface treatment using fluorine or the like so that the surface has repellency to liquid.

The organic semiconductor layer 7 is enclosed by the partition wall portions (the inner walls in the opening) of the partition wall part 6 (sacrificial layer), and the outer periphery of the organic semiconductor layer 7 is defined by the inner wall surfaces. In other words, the organic semiconductor layer 7 is formed to cover an exposed part of the top surface of the source electrode 4S in the opening, the top surface of the gate insulator 3, and an exposed part of the top surface of the drain electrode 4D in the opening.

The organic semiconductor layer 7 can be formed by applying a predetermined solvent made of an organic material to the inside of the opening of the partition wall part 6 using a printing method such as an ink jet method, to crystallize the solvent. Examples of materials used to form the organic semiconductor layer 7 include a soluble porphyrin, pentacene, phthalocyanine-based, or organic material.

The protection film 8 is formed above the organic semiconductor layer 7 to protect the organic semiconductor layer 7. In this embodiment, the protection film 8 is formed to cover the organic semiconductor layer 7 in the opening of the partition wall part 6 (sacrificial layer 5). The protection film 8 has an outer periphery defined by the sacrificial layer 5 and the inner walls of the opening of the partition wall part 6.

Preferably, the protection film 8 includes a photo crosslinkable material. When light is irradiated to the photo crosslinkable material, the molecules thereof are bonded, resulting in a finer molecule structure and a strong polymer bonding In this way, it is possible to efficiently prevent water, oxygen, or impurities from infiltrating the organic semiconductor layer 7. Examples of photo crosslinkable materials include a high polymer material such as an acrylic polymer or a low polymer material such as an acrylic monomer. Furthermore, preferably, the protection film 8 includes a heat crosslinkable material in addition to a photo crosslinkable material. It is to be noted that the material used for the protection film 8 can be not only a material made only of the organic material but also a material made of the organic material with an additive of an inorganic material such as silicon. The use of the organic material with the additive of the inorganic material such as silicon makes it possible to further reduce infiltration of water, oxygen, etc. into the organic semiconductor layer 7 than in the case of using an organic protection film made only of an organic material.

The interlayer insulator 9 is formed above the protection film 8. In this embodiment, the interlayer insulator 9 is formed above the partition wall part 6 to cover the protection film 8 and fill the opening of the partition wall part 6. The interlayer insulator 9 is intended to suppress occurrence of leak current between the layers, and to planarize the surface of the organic thin-film transistor 10. The interlayer insulator 9 can be formed using, for example, an organic material such as a resist and an inorganic material such as Spin On Glass (SOG).

In this way, by forming the interlayer insulator 9, it is possible to cause the protection film 8 to exercise the function of suppressing deterioration in characteristics of the organic semiconductor layer 7 and cause the interlayer insulator 9 to exercise the function of insulating the layers, and to thereby realize the separation of functionalities using these two films of the protection film 8 and the interlayer insulator 9. Accordingly, it is possible to suppress deterioration in the characteristics of the organic semiconductor layer 7 and to reduce current leakage between the layers. Thus, it is possible to realize the organic thin-film transistor 10 which is highly reliable.

As shown in FIG. 1B, the organic thin-film transistor 10 manufactured in this way includes the wired substrate (TFT array substrate) including the scanning lines (gate lines) 11 formed above the substrate 1 and video signal lines (source lines) 12. In addition, the electrodes in the organic thin-film transistor 10 may also be extended to serve also as lines. For example, as shown in FIG. 1B, the gate electrode 2 and the drain electrode 4D are extended to serve as lines. In FIG. 1B, the gate electrode 2 and the scanning lines 11 are formed in the same layer, and thus these elements are formed by patterning at the same time. In addition, the drain electrode 4D and the video signal lines 12 are formed in the same layer, and thus these elements are formed by patterning at the same time.

Figure 2:
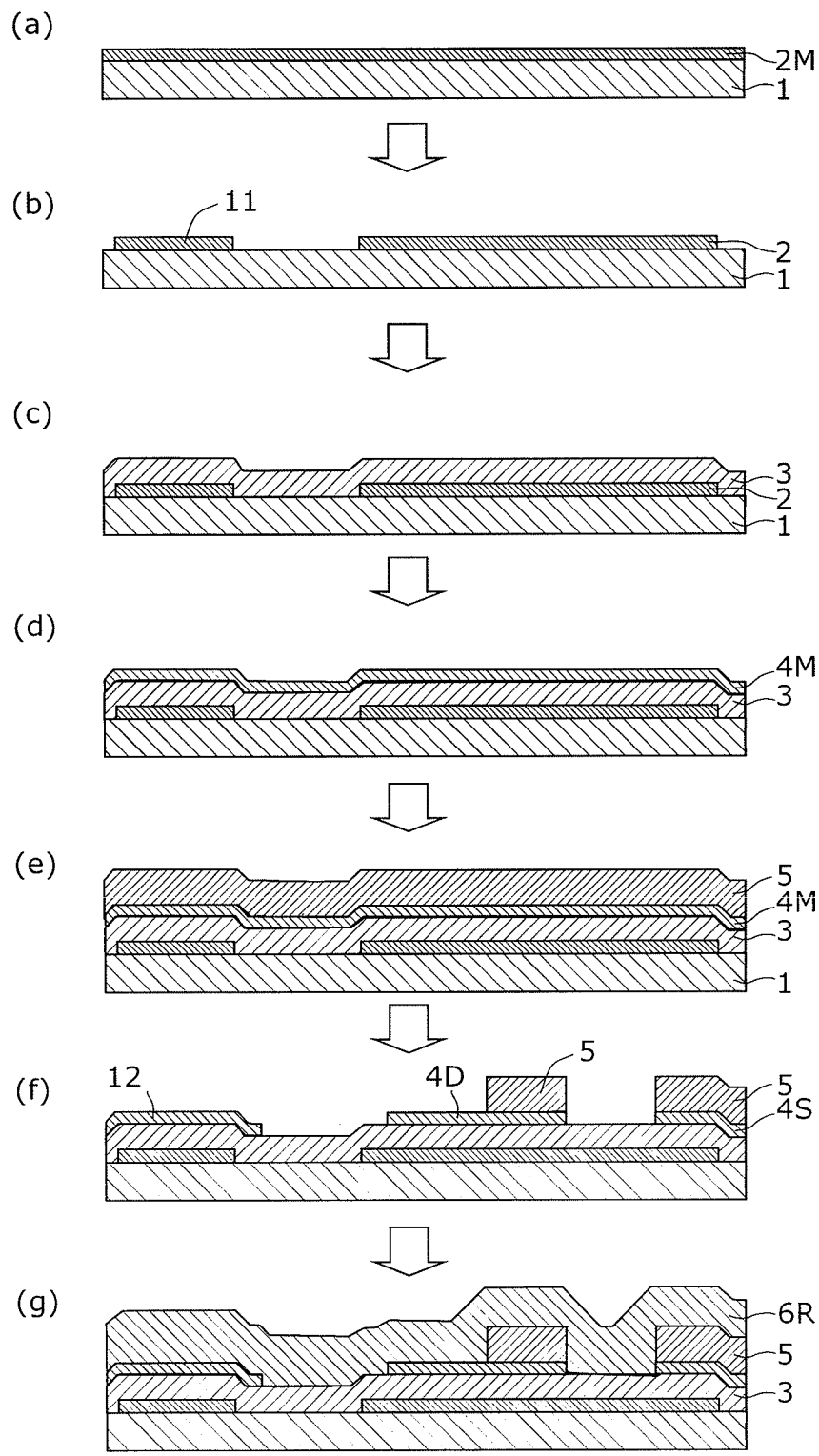
[FIG. 2]
Figure 3:
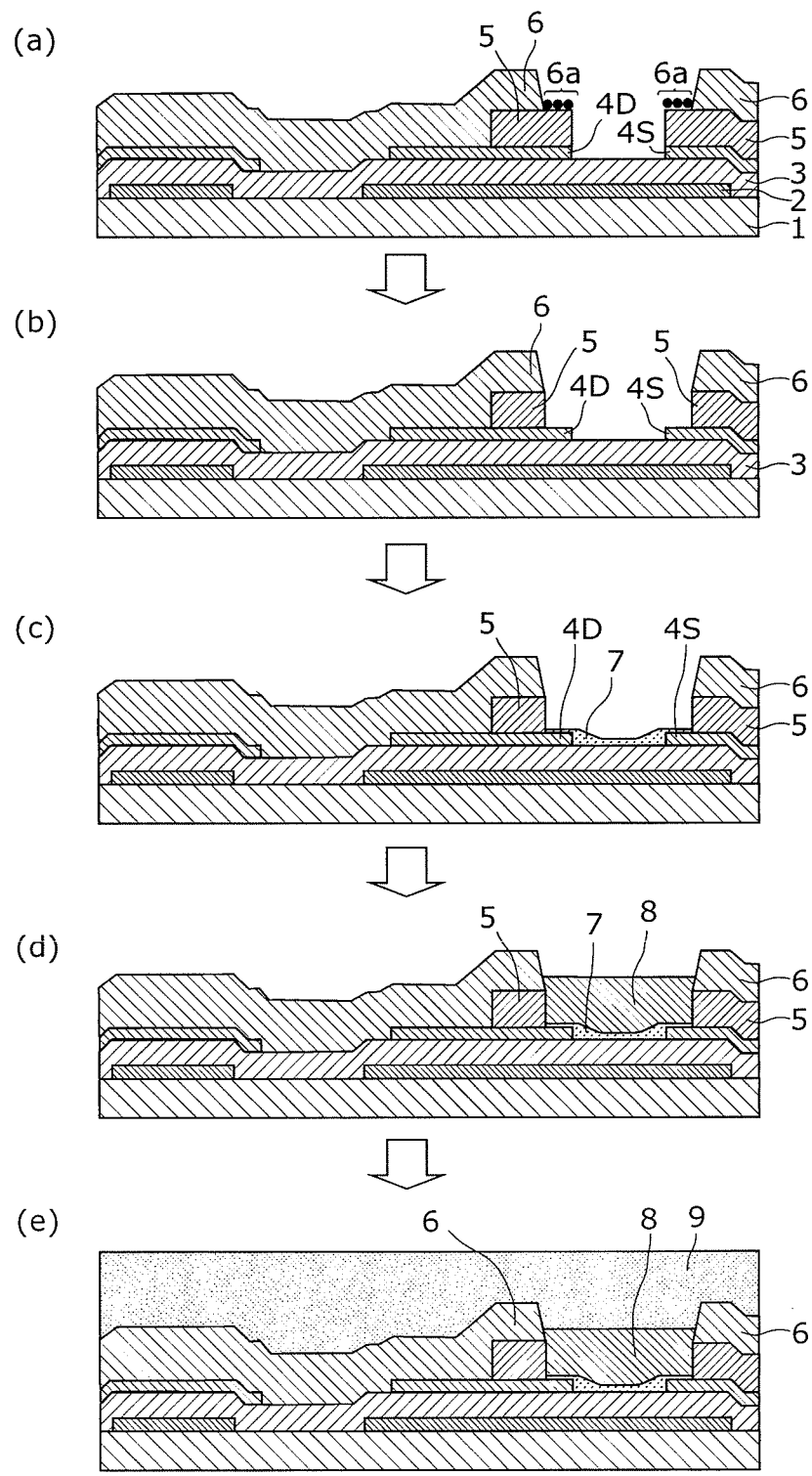
[FIG. 3]

Next, with reference to FIG. 2 and FIG. 3, a description is given of a method of manufacturing the organic thin-film transistor 10 according to Embodiment 1 of the present invention. Each of FIG. 2 and FIG. 3 is composed of cross-sectional views for explaining processes in the method of manufacturing the organic thin-film transistor according to Embodiment 1 of the present invention.

First, as shown in (a) of FIG. 2, a first metal film (gate metal film) 2M is formed by depositing the material for the gate electrode 2 above the substrate 1 such as a glass substrate. The first metal film 2M is formed by sputtering or vapor depositing using Mo, Al, Cu, W, Ti, Cr, MoW, or the like.

Next, as shown in (b) of FIG. 2, the first metal film 2M is patterned using photolithography or etching to form the gate electrode 2 having a predetermined shape above the substrate 1. Wet etching or dray etching can be used as etching for the first metal film 2M. As shown in (b) of FIG. 2, by patterning the first metal film 2M, it is possible to form the gate electrode 2 and also the wiring such as the scanning lines 11 in the same layer at the same time.

Subsequently, as shown in (c) of FIG. 2, a gate insulator 3 is formed above the gate electrode 2. In this embodiment, the gate insulator 3 is formed above the entire substrate 1 to cover the gate electrode 2. The gate insulator 3 can be formed using a plasma CVD or a coating method according to the material. For example, when an inorganic insulator such as a silicon oxide film or a silicon nitride film is used as the material for the gate insulator 3, the gate insulator 3 can be formed using a plasma CVD. In addition, when an organic insulator made of polyimide, polyvinyl phenol, polypropylene, or the like, the gate insulator 3 can be formed using a coating method.

Subsequently, a contact hole may be formed above the gate insulator 3 above the gate electrode 2 as necessary. The contact hole is formed in order to, for example, electrically connect either the source electrode or the drain electrode in another organic thin-film transistor adjacent to the organic thin-film transistor 10 and the gate electrode 2 of the organic thin-film transistor 10. In this case, the contact hole can be formed by patterning using a photolithography method when the gate insulator 3 is a film containing a photosensitive agent and formed using a coating method. In addition, when the gate insulator 3 is a film not containing any photosensitive agent and formed using a plasma CVD, it is possible to form a contact hole by dry etching or wet etching after forming a resist by patterning.

Next, as shown in (d) of FIG. 2, a second metal film (source drain metal film) 4M is formed by depositing a material for the source electrode 4S and the drain electrode 4D above the entire surface of the gate insulator 3. At this time, when the gate electrode 2 is below a contact hole, the contact hole is filled with the second metal film 4M to form a contact hole. The second metal film 4M is formed using, for example, Mo, W, Cu, Al, Ni, Au, Ag, MoW, MoN, or the like using sputtering or vapor deposition. In this embodiment, a MoW single-layer is formed.

Next, as shown in (e) of FIG. 2, a sacrificial layer 5 is formed by depositing a predetermined material above the entire surface of the second metal film 4M. The sacrificial layer 5 can be formed using a metal material or an insulation material according to sputtering, vapor deposition, or plasma CVD according to the material. As described above, it is preferable to use, as the material for the sacrificial layer 5, a material having a large etching selection ratio with each of the materials of the source electrode 4S, the drain electrode 4D, and the partition wall part 6. The sacrificial layer 5 used in this embodiment is a layer made of an insulation material.

Next, as shown in (f) of FIG. 2, the sacrificial layer 5 and the second metal film 4M are patterned by two times of photolithography and etching to form the source electrode 4S and the drain electrode 4D which are paired, have a predetermined shape, and face each other and to form the sacrificial layer 5 having a predetermined shape above the source electrode 4S and the drain electrode. At this time, the second metal film 4M is removed by etching so that the gate insulator 3 is exposed.

As shown in the same diagram, the sacrificial layer 5 is partly etched so as to keep partly covering the end portions of the source electrode 4S and the drain electrode 4D facing each other. More specifically, the sacrificial layer 5 above the source electrode 4S is etched to have an opening-side edge which is vertically flat with the drain-electrode-side edge of the source electrode 4S. In addition, the sacrificial layer 5 above the drain electrode 4D is etched to have a sourceelectrode-side edge which is vertically flat with the source-electrode-side edge of the drain electrode 4D.

The etching used for the sacrificial layer 5 and the second metal film 4M in this process can be wet etching or dry etching. In addition, when patterning the second metal film 4M, it is possible to form by patterning the source electrode 4S and the drain electrode 4D and the wiring above the TFT array substrate at the same time. In other words, it is possible to form the wiring above the TFT array substrate and the source electrode 4S and the drain electrode 4D using the same material at the same time. For example, as shown in the diagram, it is possible to form the video signal lines 12 by patterning the second metal film 4M.

Next, as shown in (g) of FIG. 2, a partition wall layer 6R is formed by applying a predetermined material for the partition wall part 6 above the entire surface above the substrate 1. In this way, it is possible to form the partition wall layer 6R to cover the sacrificial layer 5, the source electrode 4S, the drain electrode 4D, and the exposed gate insulator 3 etc. In this embodiment, the partition wall layer 6R is formed to have a film thickness of 1 μm using the photosensitive resin.

Next, as shown in (a) of FIG. 3, the partition wall layer 6R is patterned to re-expose the gate insulator 3 between the source electrode 4S and the drain electrode 4D and partly expose the sacrificial layer 5 above the source electrode 4S and the drain electrode 4D, so that an opening is formed above the gate electrode 2. In this way, it is possible to form the partition wall part 6 having a predetermined shape, the opening, and the partition wall portion (bank). The opening of the partition wall part 6 is formed correspondingly to the part above which the organic semiconductor layer is formed. More specifically, the opening is formed so that the end portions of the source electrode 4S and the drain electrode 4D are exposed in the opening in a top plan view, in other words, in this process, so that the end portions of the sacrificial layer 5 positioned above the end portions of the source electrode 4S and the drain electrode 4D are exposed in the opening in a top plan view.

The partition wall layer 6R can be patterned by exposing or developing the partition wall layer 6R. At this time, as shown in the drawing, residues 6a of the partition wall layer 6R are left above the exposed surfaces of the end portions of the sacrificial layer 5. The residues 6a of the partition wall layer 6R are remainders after the development of the partition wall layer 6R, and are of a photosensitive material composing the partition wall layer 6R or a material transformed from the photosensitive material.

It is to be noted that a predetermined surface treatment may be performed onto the partition wall part 6 using fluorine or the like after the formation of the opening in the partition wall layer 6R, in order to provide the surface of the partition wall part 6 with repellency to liquid.

Next, as shown in (b) of FIG. 3, the sacrificial layer 5 exposed in the opening of the partition wall part 6 is removed by etching using, as a mask, the partition wall portion of the partition wall part 6 so as to expose the end portions of the source electrode 4S and the drain electrode 4D positioned below the sacrificial layer 5. In other words, in this process, the portion of the sacrificial layer 5 formed above the end portions of the source electrode 4S and the drain electrode 4D are removed by etching so that the end portions of the source electrode 4S and the drain electrode 4D are exposed in the opening of the partition wall part 6 in a top plan view. In this embodiment, the sacrificial layer 5 has been etched by dry etching. In this way, the sacrificial layer 5 is etched to have an opening-side edge which is vertically flat with the edge of the opening in the partition wall part 6.

In this process, since the end portions of the sacrificial layer 5 exposed in the opening of the partition wall part 6 are removed, the residues 6a of the partition wall layer 6R above the end portions of the sacrificial layer 5 are removed together with the sacrificial layer 5. In other words, the residues 6a of the partition wall layer 6R are removed by lift-off at the time of etching of the end portions of the sacrificial layer 5. In this way, the residues 6a of the partition wall layer 6R are not left above the source electrode 4S and the drain electrode 4D, and it is possible to clean the surfaces of the end portions of the source electrode 4S and the drain electrode 4D.

Next, a solution (an organic semiconductor solution) including an organic semiconductor material is applied to the inside of the opening of the partition wall part 6 using an ink jet method. At this time, the solution including the organic semiconductor material is spread on the upper surface of the exposed gate insulator 3 and also on the upper surfaces of the end portions of the source electrode 4S and the drain electrode 4D exposed in the opening. The solution including the organic semiconductor material spread in the opening is guarded by the opposing inner wall surfaces (side surfaces) of the sacrificial layer 5 and the opposing partition wall portions (the inner wall surfaces of the opening) of the partition wall part 6, which defines an area in which the solution including the organic semiconductor material is applied. In this way, it is possible to prevent the solution including the organic semiconductor material from flowing outside the opening of the partition wall part 6.

Subsequently, the solution including the organic semiconductor material is dried by performing a predetermined heat treatment on the solution so as to crystallize the organic semiconductor material. In this way, as shown in (c) of FIG. 3, it is possible to form the organic semiconductor layer 7 having a defined outer periphery inside the opening of the partition wall part 6. In this embodiment, the organic semiconductor layer 7 is formed to cover from the upper surface of the end portion of the source electrode 4S to the upper surface of the end portion of the drain electrode 4D so as to cover the upper surface of the exposed gate insulator 3.

Here, desirably, when applying the organic semiconductor solution using the ink jet method, the solution is dropped around the center of the opening of the partition wall part 6. By doing so, the solution including the organic semiconductor material is spread in the inside of the opening of the partition wall part 6. In this way, it is possible to form the organic semiconductor layer 7 which has an even film thickness. In addition, examples of organic semiconductor materials include a soluble organic material such as a pentacene, phthalocyanine-based, or porphyrin material. In addition, preferably, the heat in the predetermined heat treatment has a temperature at which the organic semiconductor material included in the solution is crystallized without being decomposed by the heat and at which the solvent in the solution can be vaporized. In this embodiment, the heat treatment has been performed at a temperature around 200 degrees Celsius.

Next, as shown in (d) of FIG. 3, the solution including an overcoat material which is a material for the protection film 8 is applied to the inside of the opening of the partition wall part 6 from above the organic semiconductor layer 7 using an ink jet method. At this time, the inner wall surfaces of the sacrificial layer 5 and the partition wall portions of the partition wall part 6 function as guards which define the application area for the solution including the overcoat material. Thus, it is possible to prevent the solution including the overcoat material from flowing outside the opening. After the application of the solution including the overcoat material to the predetermined area, a predetermined heat treatment is performed on the solution. By doing so, it is possible to dry the solution including the overcoat material to form the protection film 8 having a defined periphery.

At this time, when the overcoat material included in the solution includes a heat crosslinkable material, it is possible to increase the protection function of the protection film 8 by performing the heat treatment. In addition, when the overcoat material included in the solution includes a photo crosslinkable material, it is possible to additionally perform a process of irradiating light such as UV light so that the molecules in the overcoat material are bonded, resulting in a finer molecule structure and a strong polymer bonding. In this way, it is possible to increase the shielding effect of the protection film 8 against oxygen, water, or impurities.

Here, desirably, when applying the solution including the overcoat material using the ink jet method, the solution is dropped around the center of the opening of the partition wall part 6. By doing so, the solution including the overcoat material is spread in the inside of the opening of the partition wall part 6. In this way, it is possible to form the protection film 8 which has an even film thickness. Although the overcoat material is applied using an ink jet method in this embodiment, a protection film obtainable by full surface application by a spin coating method can also provide a similar effect as long as the protection film has a necessary film thickness above the organic semiconductor.

Next, as shown in (e) of FIG. 3, an interlayer insulator 9 is formed above the entire surface above the substrate 1 including the protection film 8. The interlayer insulator 9 is formed to have intended thicknesses to flatten its upper surface. The interlayer insulator 9 can be formed by applying a predetermined material such as SOG.

In this way, it is possible to form the organic thin-film transistor 10 according to this embodiment.

Figure 4:
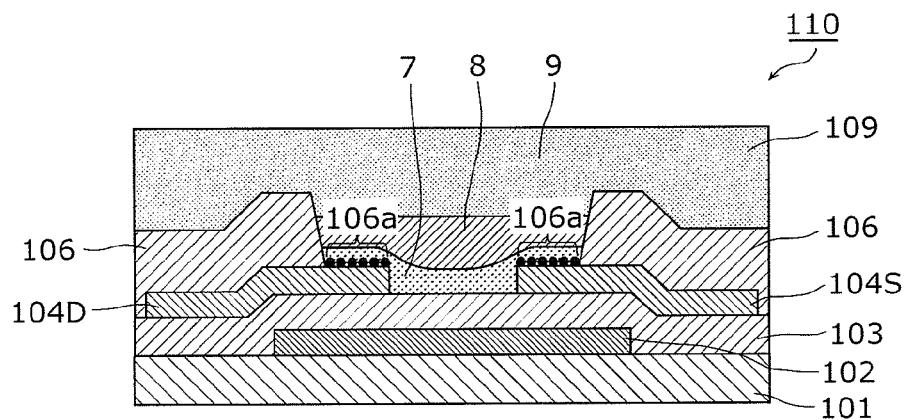
[FIG. 4]
Figure 5:
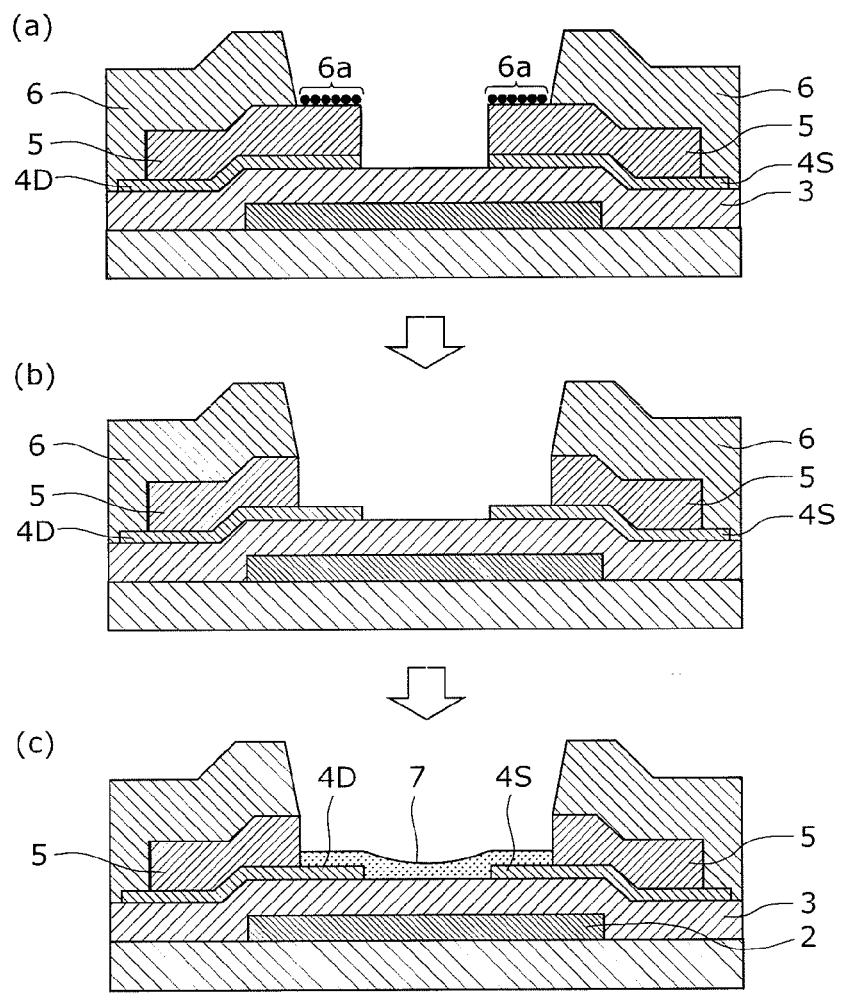
[FIG. 5]

Next, with reference to FIG. 4 and FIG. 5, a description is given of an effect provided by the organic thin-film transistor 10 according to this embodiment. FIG. 4 is a diagram for explaining a problem in a conventional organic thin-film transistor. FIG. 5 is composed of cross-sectional views for explaining characteristic processes in the method of manufacturing the organic thin-film transistor according to Embodiment 1 of the present invention.

As shown in FIG. 32 and FIG. 33, the method of manufacturing the conventional organic thin-film transistor 100 is intended to expose the end portions of the source electrode 104S and the drain electrode 104D in the opening by removing the partition wall layer 106R above the end portions of the source electrode 104S and the drain electrode 104D when forming the opening in the partition wall layer 106R. Accordingly, as shown in FIG. 4, in the conventional organic thin-film transistor 100, residues 106a of the partition wall layer 106R are left on the surfaces of the exposed end portions of the source electrode 104S and the drain electrode 104D, and the organic semiconductor layer 107 is formed above the end portions of the source electrode 104S and the drain electrode 104D with the residues 106 left. As a result, crystallizability of the organic semiconductor layer 107 is damaged, contact resistance between the source electrode 104S (drain electrode 104D) and the organic semiconductor layer 7 is increased, and the TFT characteristics of the organic thin-film transistor 100 is deteriorated.

On the other hand, in the organic thin-film transistor 10 according to this embodiment, the partition wall layer 6R is formed, via the sacrificial layer 5, above the end portions of the source electrode 4S and the drain electrode 4D, and as shown in (a) of FIG. 5, residues 6a of the partition wall layer 6R are left not on the surfaces of the source electrode 4S and the drain electrode 4D but on the surface of the sacrificial layer 5 when forming the opening in the partition wall layer 6R. Subsequently, as shown in (b) of FIG. 5, the residues 6a of the partition wall layer 6R are removed by etching together with the sacrificial layer 5 above the end portions of the source electrode 4S and the drain electrode 4D when the sacrificial layer 5 is removed by etching, so as to form the organic semiconductor layer 7 in the opening of the partition wall part 6 as shown in (c) of FIG. 5. In this way, since it is possible to form the organic semiconductor layer 7 in a state where the residues 6a of the partition wall layer 6R are not left on the surfaces of the source electrode 4S and the drain electrode 4D, the interface surfaces between the respective end portions of the source electrode 4S and the drain electrode 4D and the organic semiconductor layer 7 are cleaned. In this way, it is possible to achieve an excellent crystallizability of the organic semiconductor layer 7, and to suppress increase in the contact resistance between the source electrode 4S (drain electrode 4D) and the organic semiconductor layer 7 caused by the residues 6a of the partition wall layer 6R. Accordingly, it is possible to realize the organic thin-film transistor having excellent TFT characteristics. In particular, since it is possible to enlarge the diameters of grains of crystals in the organic semiconductor layer 7, it is possible to achieve the thin-film transistor having excellent ON characteristics.

Figure 6A:
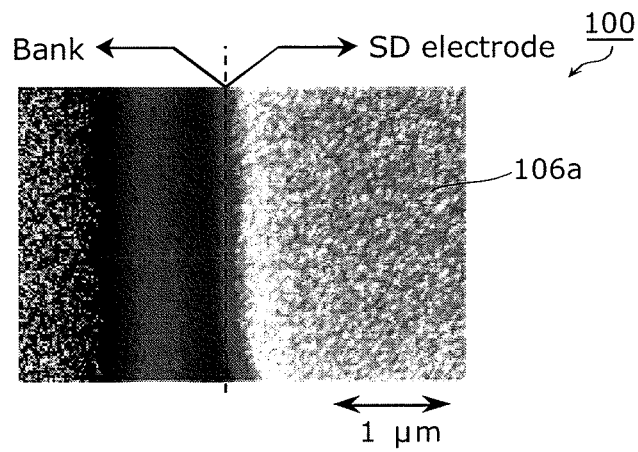
[FIG. 6A]
Figure 6B:
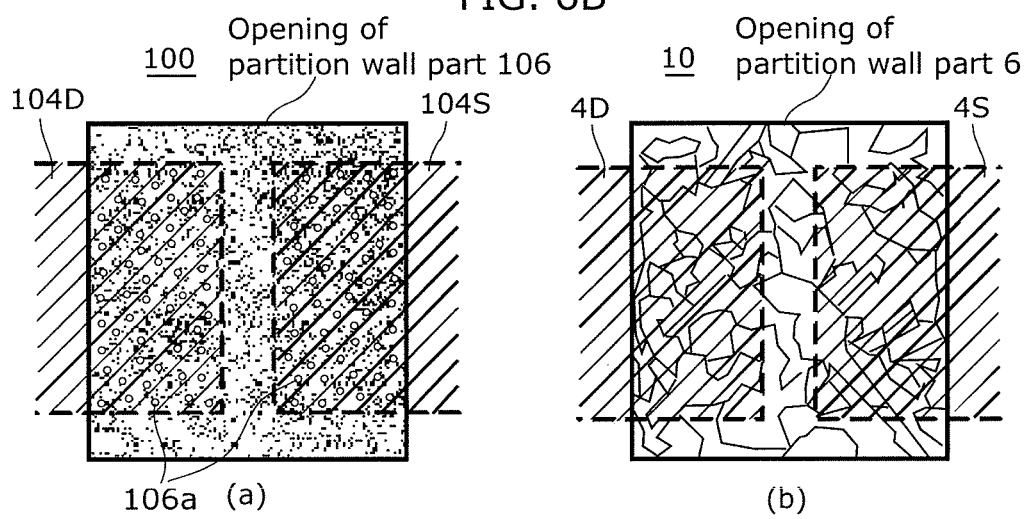
[FIG. 6B]
FIG. 6B schematically shows (a) a state of crystals in an organic semiconductor layer in the organic thin-film transistor (in the conventional example) shown in FIG. 4, and (b) a state of crystals in an organic semiconductor layer in the organic thin-film transistor (in the present invention) according to Embodiment 1 of the present invention shown in FIG. 1A.
Figure 6C:
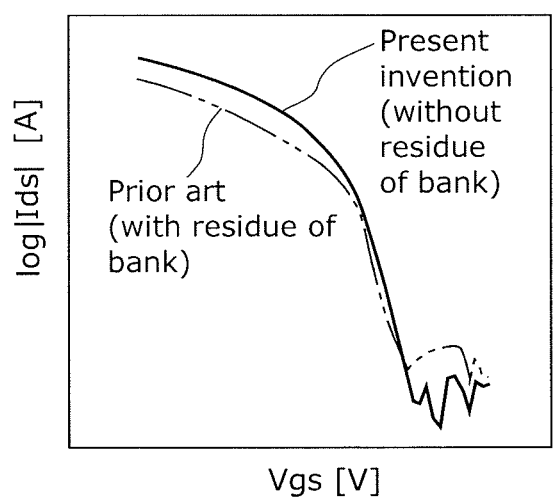
[FIG. 6C]

Next, with reference to FIG. 6A to FIG. 6C, descriptions are given of influences of the residues of the partition wall layer left above the source electrode or the drain electrode in the organic thin-film transistor. FIG. 6A is a surface SEM photograph in the conventional organic thin-film transistor shown in FIG. 4, and shows the surface of the partition wall part 106 and the surface which is of the source electrode 104S and exposed in the opening of the partition wall part 106. FIG. 6B schematically shows (a) a state of crystals in an organic semiconductor layer in the organic thin-film transistor (in the prior art) shown in FIG. 4, and (b) a state of crystals in the organic semiconductor layer in the organic thin-film transistor (in the present invention) according to Embodiment 1 of the present invention shown in FIG. 1A. In addition, FIG. 6C is a diagram showing a relationship (transfer characteristics) between the organic thin-film transistor according to Embodiment 1 of the present invention shown in FIG. 1A and the conventional organic thin-film transistor shown in FIG. 4.

First, as shown in FIG. 6A, in the conventional organic thin-film transistor 100 shown in FIG. 4, it is possible to identify the residues 106a of the partition wall part 106 on the surface of the source electrode 104S. In FIG. 6A, many white grains are the residues 106a of the partition wall part 106. The residues 106a (not shown) of the partition wall part 106 are also left on the surface of the drain electrode 104D.

In this way, in the conventional organic thin-film transistor 100, since the residues 106a of the partition wall part 106 are left on the surfaces of the source electrode 104S and the drain electrode 104D, the organic semiconductor layer 107 has a structure made of small grain crystals as shown in (a) of FIG. 6B.

On the other hand, in the organic thin-film transistor 10 according to this embodiment, since the residues 6a of the partition wall part 6R are removed when the sacrificial layer 5 above the end portions of the source electrode 4S and the drain electrode 4D are removed, the residues 6a of the partition wall layer 6R are not left on the surfaces of the source electrode 4S and the drain electrode 4D. In this way, since acceleration of crystal growth in the organic semiconductor layer 7 is not hindered by the residues 6a of the partition wall layer 6R, the organic semiconductor layer 7 has a structure composed of crystals having large grain diameters, as shown in (b) of FIG. 6B. In addition, the same diagram shows that the crystals extending from above the source electrode 4S and the drain electrode 4D have grown to be large so that they cover the area (channel area) between the source electrode 4S and the drain electrode 4D.

Accordingly, the organic thin-film transistor 10 according to this embodiment has the organic semiconductor layer having crystal grain diameters larger than those of the conventional organic thin-film transistor 100. Thus, it is possible to achieve the organic thin-film transistor having excellent ON characteristics. In contrast, in the conventional organic thin-film transistor 100, the crystal state of the organic semiconductor layer 107 is deteriorated due to the presence of the residues 106a of the partition wall part 106, which increases the contact resistances and decreases the ON characteristics.

FIG. 6C shows the transfer characteristics of the organic thin-film transistor 10 according to this embodiment and the transfer characteristics of the conventional organic thin-film transistor 100 which were actually obtained. As shown in FIG. 6C, the ON characteristics of the organic thin-film transistor 10 shown as the solid line is more excellent than the ON characteristics of the conventional organic thin-film transistor 100 shown as the long-and-short dotted line.

As described above, since the organic thin-film transistor 10 according to Embodiment 1 of the present invention is formed to have the partition wall layer 6R above the source electrode 4S and the drain electrode 4D via the sacrificial layer 5, the residues 6a of the partition wall layer 6R at the time of forming the opening in the partition wall layer 6R are removed by etching together with the sacrificial layer 5 formed above the source electrode 4S and the drain electrode 4D by removing by etching the sacrificial layer 5. In this way, since it is possible to form the organic semiconductor layer 7 in a state where the residues 6a of the partition wall layer 6R do not exist on the surfaces of the source electrode 4S and the drain electrode 4D, it is possible to achieve the organic semiconductor layer 107 having an excellent crystallizability, and to suppress increase in the contact resistance between the source electrode 4S (drain electrode 4D) and the organic semiconductor layer 7 caused by the residues 6a of the partition wall layer 6R. Accordingly, it is possible to suppress decrease in ON current, and to thus achieve the organic thin-film transistor having the excellent ON characteristics.

However, performance tests on actually manufactured organic thin-film transistors showed that some of them did not have sufficiently increased characteristics. As a result of keen study in this respect, the Inventors of the present invention found the knowledge below.

As described above, since the source electrode 4S and the drain electrode 4D have clean surfaces without residues 6a of the partition wall layer 6R through lift-off of the sacrificial layer 5, the organic semiconductor layer 7 formed on the surfaces of the source electrode 4S and the drain electrode 4D is composed of crystals having large grain diameters.

On the other hand, since the sacrificial layer 5 is not formed above the gate insulator 3, it is considered that the residues 6a of the partition wall layer 6R exist above the gate insulator 3. For this reason, the crystal growth of the organic semiconductor layer 7 to be formed above the gate insulator 3 is not accelerated, and thus the organic semiconductor layer 7 is composed of crystals having small grain diameters.

In this way, the organic semiconductor layer 7 has crystal states different between the portion above the source electrode 4S (drain electrode 4D) and the portion above the gate insulator 3. In this case, the crystal structure of the organic semiconductor layer 7 is shown in (a) of FIG. 7 where the interval between the source electrode 4S and the drain electrode 4D (the distance between the source and drain electrodes: the channel length) is L, and the maximum crystal grain diameter of the organic semiconductor layer 7 is G, and L>G is satisfied. Here, since large crystal nucleuses exist above the source electrode 4S and the drain electrode 4D, at least one of the end portions of the opposing electrodes of the source electrode 4S and the drain electrode 4D protrudes toward the other in the channel area above the gate insulator 3 by G/2 at the maximum. Accordingly, as shown in (a) of FIG. 7, the organic semiconductor layer 7 when L>G is satisfied has a crystal structure in which a plurality of crystals (crystal grains) grown to have small grain diameters above the gate insulator 3 are sandwiched between crystals (crystal grains) grown to have large grain diameters from the end portions of both the source electrode 4S and the drain electrode 4D facing each other. For this reason, the organic semiconductor layer 7 shown in (a) of FIG. 7 has the crystal structure with many grain boundaries, and thus provides a decreased carrier mobility.

In this embodiment, the interval (channel length) between the source electrode 4S and the drain electrode 4D is made smaller than the average crystal grain diameter of crystals formed at least partly above at least one of the source electrode 4S and the drain electrode 4D among the crystals of the organic semiconductor layer 7. In this way, the interval between the source electrode 4S and the drain electrode 4D is smaller than the average grain diameter of the crystals positioned at least partly above at least one of the source electrode 4S and the drain electrode 4D among the crystals of the organic semiconductor layer 7. In this case, it is possible to determine the interval between the source electrode 4S and the drain electrode 4D according to the material of the organic semiconductor layer 7. In other words, it is possible to determine the interval between the source electrode 4S and the drain electrode 4D, based on the crystal size determined by the material of the organic semiconductor layer 7.

Figure 7:
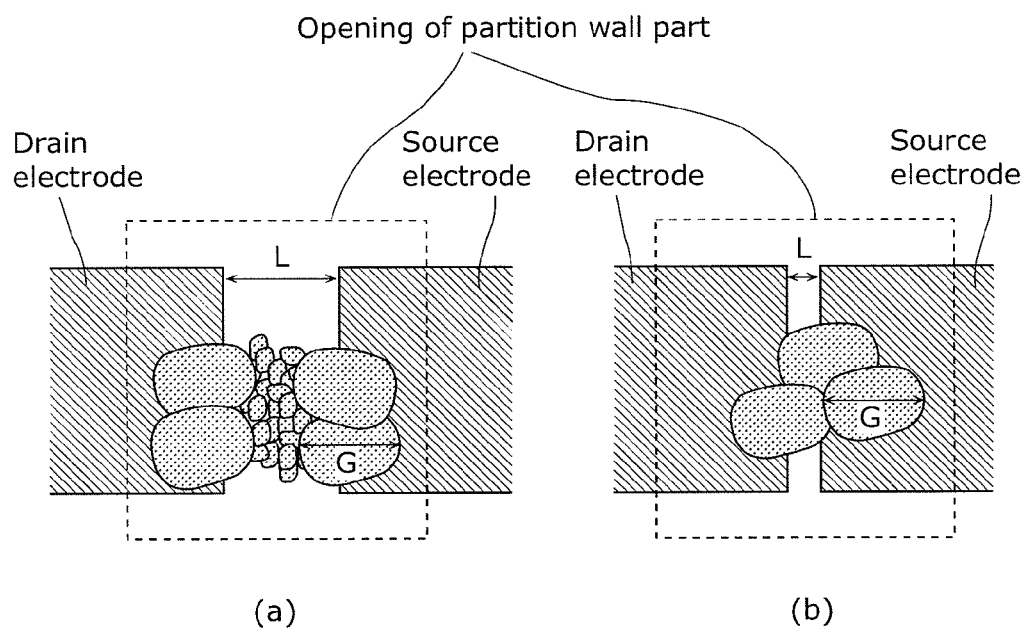
[FIG. 7]

In this way, L≤G is satisfied as shown in (b) of FIG. 7 by determining the channel length smaller than the average crystal grain diameter of the organic semiconductor layer 7 positioned above the source electrode 4S (the drain electrode 4D). In this way, the organic semiconductor layer 7 is formed so that its crystals grown from nucleuses above the source electrode 4S and the drain electrode 4D cover the channel area (between the source and drain electrodes). As a result, it is possible to reduce the number of grain boundaries in the organic semiconductor layer 7 between the source electrode 4S and the drain electrode 4D, and to thus increase the carrier mobility.

In (b) of FIG. 7, some of the crystal grains are grown from the source electrode 4S and the drain electrode 4D so as to extend over the source electrode 4S and the drain electrode 4D. However, the crystal grains do not always need to be formed to extend over the source electrode 4S and the drain electrode 4D. In addition, even in the case of (b) of FIG. 7, it is considered that crystals having small grain diameters exist above the gate insulator 3 due to the influence of the residues 5a of the partition wall layer 6R. However, the crystals having the small crystal grain diameters are present below the crystals grown to have the large grain diameters from the source electrode 4S and the drain electrode 4D, and thus the influence of the residues 5a is considered to be limited.

Here, in order to prevent the organic semiconductor layer 7 from being grown to have crystals having small grain diameters due to the influence of the residues 6a above the gate insulator 3, it is considered to remove the residues 6a above the gate insulator 3 by etching or the like. However, when the etching of the residues 6a above the gate insulator 3 is performed, the number of processes is increased. Furthermore, when the gate insulator 3 is made of an organic material, it is possible to remove by etching the residues 6a above the gate insulator 3.

In view of this, on assumption that the residues 6a exist above the gate insulator 3, this embodiment employ a structure below. As shown in (b) of FIG. 6B, the surface area of the surfaces which are of the source electrode 4S and the drain electrode 4D and exposed in the opening of the partition wall part 6 is equal to or larger than 50% of the surface area of the opening, and the occupation rate of the source electrode 4S and the drain electrode 4D is equal to or larger than 50% of the opening. In other words, in the opening of the partition wall part 6, the area (surface area) of the source electrode 4S and the drain electrode 4D above which the residues 6a do not exist is more dominant than the area (surface area) of the gate insulator 3 above which the residues 6a exist. This accelerates growth of crystals having large grain diameters, which makes it possible to easily satisfy L≤G. The occupation rate of the source electrode 4S and the drain electrode 4D with respect to the opening is preferably 70% or more.

When the occupation rate of the source electrode 4S and the drain electrode 4D was less than 50% of the opening, the organic semiconductor layer 7 has a small grain crystal structure as in the case of (a) of FIG. 6B even after removing the residues 6a above the source electrode 4S and the drain electrode 4D by forming the sacrificial layer 5.

Figure 8:
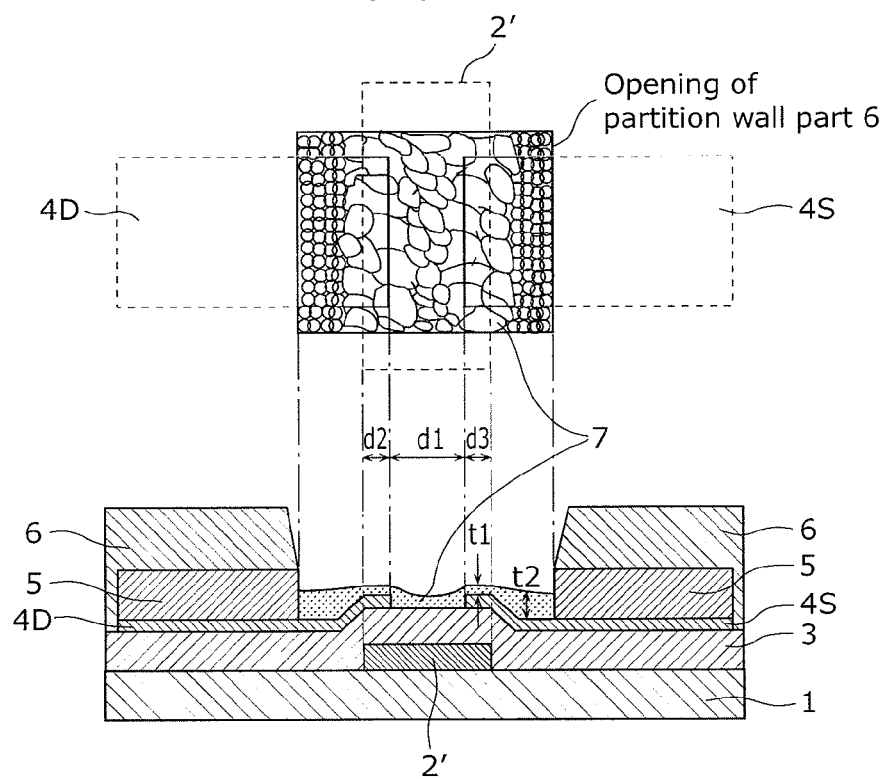
[FIG. 8]

Furthermore, in this embodiment, it is desirable that the length of an area in which each of the source electrode 4S and the drain electrode 4D exposed in the opening of the partition wall part 6 overlap with the gate electrode 2 be larger than the channel length. This point is described hereinafter with reference to FIG. 8, FIG. 9A, and FIG. 9B. FIG. 8 is composed of a top plan view and a cross-sectional view of a structure of an organic thin-film transistor according to Comparison example 1. FIG. 9A shows a top plan view and a cross-sectional view of the structure of the organic thin-film transistor according to Embodiment 1 of the present invention. FIG. 9B shows a top plan view and a cross-sectional view of a structure of another organic thin-film transistor according to Embodiment 1 of the present invention.

The thin-film transistor in this embodiment having a structure including (i) the gate electrode, (ii) the gate insulator, the source electrode, and the drain electrode, and (iii) the semiconductor layer stacked in the order of (i) to (iii) tends to have steps (recesses and protrusions) in the surface on which the semiconductor layer is formed, due to the thicknesses of the gate electrode. For example, as shown in FIG. 8, recesses and protrusions are formed in the surface of the gate insulator 3 which is the surface on which the organic semiconductor layer 7 is formed, due to the presence of the gate electrode 2'. In this way, in the case of forming the semiconductor layer using a coating method when the recesses and protrusions are formed in the surface on which the semiconductor layer is formed, the semiconductor layer tends to have thicknesses different from place to place.

In general, film forming conditions for the semiconductor layer to be formed around the channel area are adjusted to achieve the optimum film quality. However, as shown in FIG. 8, when the interval (d1) between the source electrode 4S and the drain electrode 4D (d1) is larger than either a channel-direction length (d3) of an area in which the source electrode 4S and the gate electrode 2' overlap or a channel-direction length (d2) of an area in which the drain electrode 4D and the gate electrode 2' overlap, steps are generated above the end portions of the gate electrode 2'. With the steps, the organic semiconductor layer 7 may have a larger thickness (t2) around the peripheral end portion of the opening of the partition wall part 6 than a thickness (t1) around the channel area (around the center of the opening). In this case, the organic semiconductor layer 7 is formed around the peripheral end portion of the opening under non-optimum film-forming conditions. As a result, the organic semiconductor layer 7 has poor crystallizability around the peripheral end portion of the opening than crystallizability around the channel area. For this reason, the organic semiconductor layer 7 to be grown on the surfaces of the source electrode 4S and the drain electrode 4D above the gate electrode 2' does not grow so well in the direction toward the peripheral end portion of the opening. In other words, crystals of the organic semiconductor layer 7 do not extend so well from the center portion of the opening to the periphery of the opening above the source electrode 4S and the drain electrode 4D. For this reason, the crystal growth above the source electrode 4S and the drain electrode 4D is hindered.

In view of this, as shown in FIG. 8, the organic semiconductor layer 7 is formed to have small crystal grain diameters around the peripheral portion of the opening above the source electrode 4S (drain electrode 4D) because of its large thickness, and cannot be grown to have large grain diameters in the narrow areas having the lengths d2 and d3 above the source electrode 4S and the drain electrode 4D. In this way, in the structure as shown in FIG. 8, the crystal growth is hindered on the surfaces of the source electrode 4S and the drain electrode 4D, and thus no crystals having large grain diameters are formed to transverse the channel area between the source electrode 4S and the drain electrode 4D. Accordingly, even in the case of increasing the cleanness of the surfaces of the source electrode 4S and the drain electrode 4D by removing the residues 6a of the partition wall layer 6R above the source electrode 4S and the drain electrode 4D utilizing the sacrificial layer 5, there are cases where the crystal growth of the organic semiconductor layer 7 cannot be sufficiently accelerated.

In this embodiment, as shown in FIG. 9A, the channel-direction length (d3) of the area in which the source electrode 4S and the gate electrode 2' overlap or the channel-direction length (d2) of the area in which the drain electrode 4D and the gate electrode 2' overlap are formed to be larger than the length of the interval (d1) between the source electrode 4S and the drain electrode 4D. In this way, it is possible to fully secure, at both the sides of the channel area, the areas in which the thickness of the organic semiconductor layer 7 is unlikely to vary, which makes it possible to accelerate the crystal growth of the semiconductor layer 7 above the source electrode 4S and the drain electrode 4D. As a result, as shown in FIG. 9A, it is possible to obtain, above the source electrode 4S and the drain electrode 4D, large grain crystals which transverse the source electrode 4S and the drain electrode 4D each of which has the surface already subject to the removal of the residues 6a and surface cleaning. Accordingly, it is possible to realize the organic thin-film transistor having excellent TFT characteristics.

In FIG. 9A, d1<d2 and d1<d3 are satisfied. However, one of the conditions d1<d2 and d1<d3 may be satisfied. Here, when both d1<d2 and d1<d3 are satisfied, it is possible to accelerate the crystal growth of the organic semiconductor layer 7 in the whole opening, and to thus evenly grow the crystals in the opening to have large grain diameters.

In this embodiment, as shown in FIG. 9A, the peripheral end portion of the gate electrode 2 is positioned not inward but outward from the opening of the partition wall part 6 in a top plan view. In this way, since the gate electrode 2 is formed entirely in the opening of the partition wall part 6, it is possible to reduce variation in the film thickness of the organic semiconductor layer 7 in the opening. Accordingly, it is possible to realize the organic thin-film transistor having excellent TFT characteristics.

Here, it is also good that the channel-direction end portion of the gate electrode 2 may be positioned inward from the opening of the partition wall part 6 as shown in FIG. 9B. In other words, the gate electrode 2 is formed so that the end portion is apart from the inner wall of the sacrificial layer 5 (partition wall part 6). In this way, since the channel-direction end portion of the gate electrode 2 is formed in the opening, it is possible to reduce parasitic capacitance between the gate electrode 2 and the source electrode 4S (the drain electrode 4D) more significantly than in the case of forming the gate electrode 2 entirely in the opening of the partition wall part 6. In this way, in the structure in FIG. 9B, it is possible to reduce the parasitic capacitance while maintaining the relationship between the source electrode 4S (drain electrode 4D) and either the channel length or the surface area of the opening which enable obtainment of crystals having large grain diameters. In this way, it is possible to realize the organic thin-film transistor having excellent TFT characteristics and a reduced parasitic capacitance. Accordingly, an apparatus using the organic thin-film transistor configured as in FIG. 9B can increase operation speeds.

(Variation 1 of Embodiment 1)

Figure 10A:
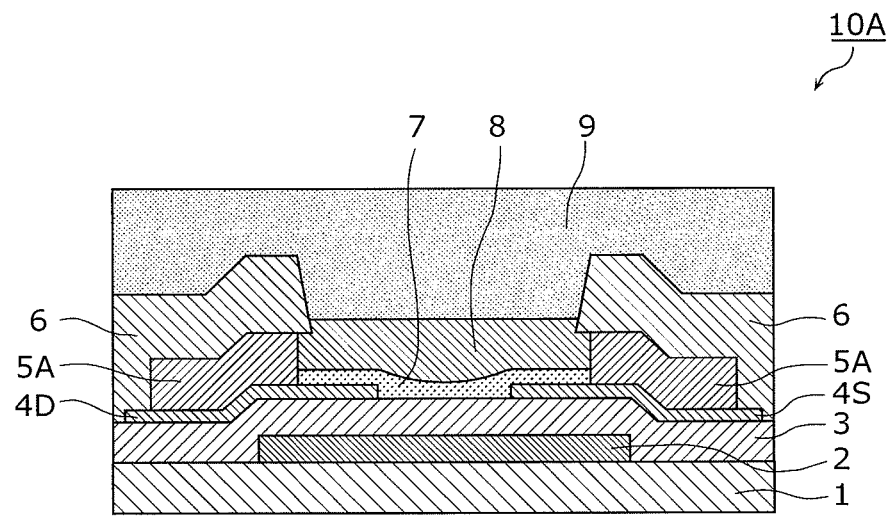
[FIG. 10A]
Figure 10B:
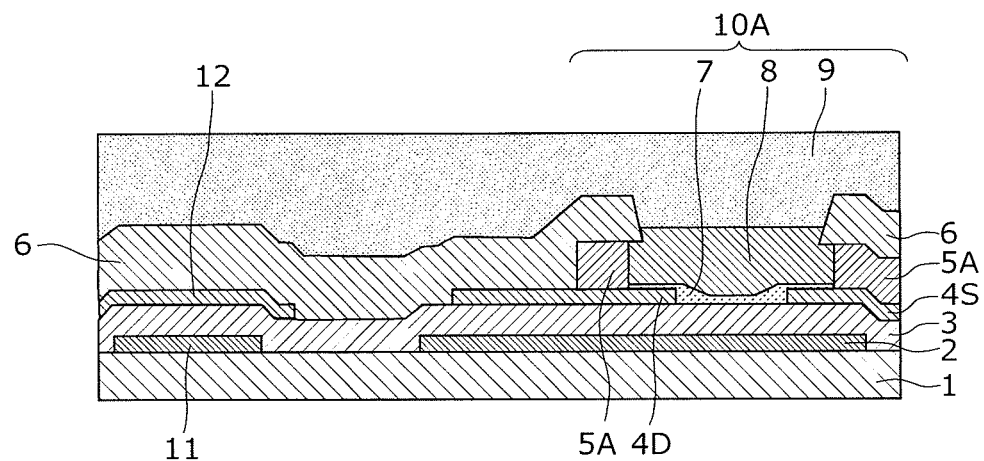
[FIG. 10B]

Next, with reference to FIG. 10A and FIG. 10B, a description is given of an organic thin-film transistor 10A according to Variation 1 of Embodiment 1 of the present invention. FIG. 10A is a cross-sectional view of a structure of the organic thin-film transistor according to Variation 1 of Embodiment 1 of the present invention, and FIG. 10B is a cross-sectional view of a structure of a wired substrate including the organic thin-film transistor according to this variation. In each of FIG. 10A and FIG. 10B, the same structural elements as in a corresponding one of FIG. 1A and FIG. 1B are assigned with the same numerical references, and detailed descriptions thereof are skipped or simplified.

As shown in FIG. 10A and FIG. 10B, the organic thin-film transistor 10A and the wired substrate according to this variation are respectively different from the organic thin-film transistor 10 and the wired substrate in FIG. 1A and FIG. 1B in that the sacrificial layer 5A has an opening-side edge positioned outward from the edge of the opening in the partition wall layer 6.

The method of manufacturing the organic thin-film transistor 10A according to this variation is similar to the method of manufacturing the organic thin-film transistor 10 according to Embodiment 1. In this variation, the end portion of the sacrificial layer 5A is etched so that the opening-side edge is positioned outward from the edge of the opening in the partition wall layer 6. In this variation, in the etching of the sacrificial layer 5 in (a) of FIG. 3, the sacrificial layer 5 is exposed by etching so that its side surface above the source electrode 4S and the opposing side surface above the drain electrode 4D become further apart from each other with respect to the edge of the opening of the partition wall part 6.

This structure can be formed by removing by wet etching the end portion of the sacrificial layer 5A exposed in the opening of the partition wall part 6. In this case, it is preferable to use, as the material for the sacrificial layer 5A, a material having a large etching selection ratio with each of the materials of the source electrode 4S, the drain electrode 4D, and the partition wall part 6. In other words, it is preferable to select the material for the sacrificial layer 5A so that the etching rate of the sacrificial layer 5A against an etching solution is larger by a certain level than the etching rates of the source electrode 4S (drain electrode 4D) and the partition wall part 6 against the etching solution. In this way, it is possible to balance the etching selection ratio between the sacrificial layer 5A and each of the source electrode 4S (the drain electrode 4D) and the partition wall part 6, and to thereby remove the side-surface part of the sacrificial layer 5A up to the outward position. The sacrificial layer 5A is preferably formed using a material which is easily etched by hydrofluoric acid.

For example, when each of the source electrode 4S and the drain electrode 4D is made of a Ni or a Ni alloy and the sacrificial layer 5A is made of Cu or a Cu alloy, it is possible to selectively etch only the sacrificial layer 5A (made of Cu or a Cu alloy) by using an etching solution containing hydrogen peroxide (1 to 10 wt %), nitric acid (0.01 to 10 wt %), and water, and having a concentration ratio of 0.5 or more between the hydrogen peroxide and nitric acid.

In addition, when each of the source electrode 4S and the drain electrode 4D is made of Mo or a Mo alloy, and the sacrificial layer 5A is made of Cu or a Cu alloy, it is possible to selectively etch (with an etching selection ratio of 10:1) only the sacrificial layer 5A (made of Cu or a Cu alloy) by using an etching solution containing hydrogen peroxide (5 to 30 wt %), organic acid (0.5 to 5 wt %) such as acetic acid, phosphate (0.2 to 5 wt %) such as sodium dihydrogenphosphate, an additive (0.2 to 5 wt %) made of a nitride such as aminotetrazole, an alanine-based additive (0.2 to 5 wt %), a fluorine compound (0.01 to 1 wt %) such as ammonium fluoride, or deionized water.

As described above, the organic thin-film transistor 10A according to this variation provides effects similar to the effects provided by the organic thin-film transistor 10 according to Embodiment 1.

(Variation 2 of Embodiment 1)

Figure 11A:
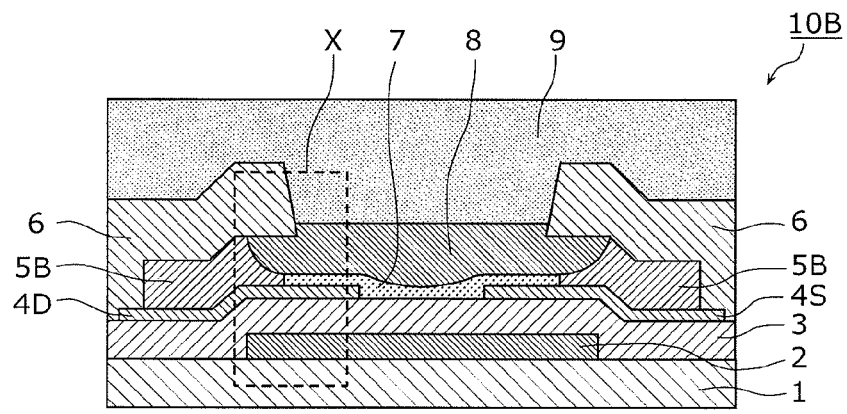
[FIG. 11A]
Figure 11B:
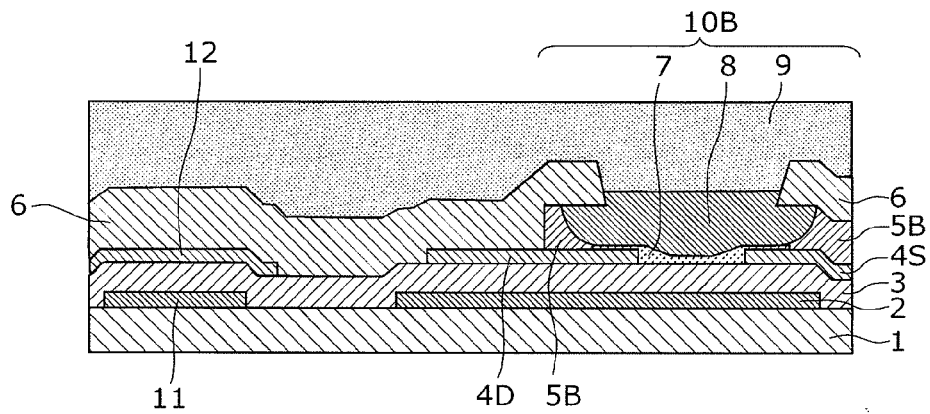
[FIG. 11B]
Figure 11C:
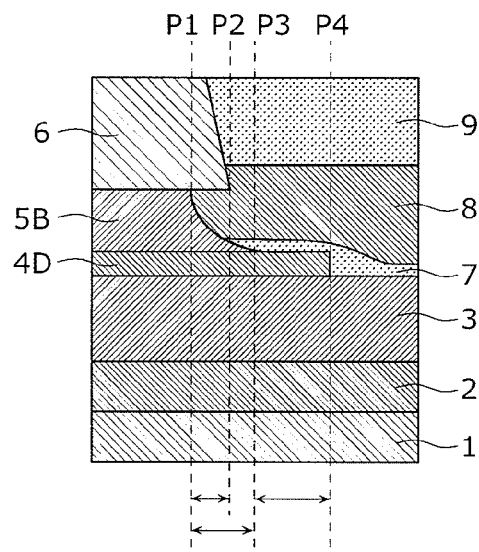
[FIG. 11C]

Next, with reference to FIG. 11A, FIG. 11B, and FIG. 11C, a description is given of an organic thin-film transistor 10B according to Variation 2 of Embodiment 1 of the present invention. FIG. 11A is a cross-sectional view of a structure of the organic thin-film transistor according to Variation 2 of Embodiment 1 of the present invention, FIG. 11B is a cross-sectional view of a structure of a wired substrate including the organic thin-film transistor according to this variation, and FIG. 11C is an enlarged cross-sectional view of the area X enclosed by the broken line shown in FIG. 11A. In FIG. 11A to FIG. 11C, the same structural elements as in FIG. 1A and FIG. 1B are assigned with the same numerical references, and detailed descriptions thereof are skipped or simplified.

As shown in FIG. 11A and FIG. 11B, the organic thin-film transistor 10B and the wired substrate according to this variation are respectively different from the organic thin-film transistor 10 and the wired substrate in FIG. 1A and FIG. 1B in that the sacrificial layer 5B has an opening-side edge positioned outward from the edge of the opening in the partition wall part 6 In addition, although Variation 1 includes the sacrificial layer 5B having the opening-side edge with a straight-line-shaped cross section, this variation includes the sacrificial layer 5B having the opening-side edge with an arc-shaped cross section.

The method of manufacturing the organic thin-film transistor 10B according to this variation is similar to the method of manufacturing the organic thin-film transistor 10A according to Variation 2. In this variation, the end portion of the sacrificial layer 5B is etched so that its opening-side edge is positioned outward from the edge of the opening in the partition wall part 6.

This structure can be formed by removing by wet etching the end portion of the sacrificial layer 5B exposed in the opening of the partition wall part 6, as in Variation 1. For example, when using the same materials for the sacrificial layer 5B, the source electrode 4S, and the drain electrode 4D as those in Variation 1, it is possible to form the structure by lengthening the etching time. Alternatively, it is possible to form the structure by selecting, as the material for the sacrificial layer 5B, a material having a larger etching selection ratio with respect to each of the source electrode 4S, the drain electrode 4D, and the partition wall part 6 than the etching selection ratio in Variation 1.

As described above, the organic thin-film transistor 10B according to this variation provides effects similar to the effects provided by the organic thin-film transistor 10 according to Embodiment 1.

In addition, as shown in FIG. 11C, assuming that P1 denotes a position which is of the edge (upper edge) of the sacrificial layer 5B and is inward of the edge (lower edge) of the opening of the partition wall part 6, P2 denotes a position of the edge (lower edge) of the opening of the partition wall part 6, P3 denotes a position of the edge (lower edge) of the sacrificial layer 5B, and P4 denotes a position of the opening-side edge of the source electrode 4S (or the drain electrode 4D), an area between P3 and P4 is an area (i) in which contact between the organic semiconductor layer 7 and the source electrode 4S (or the drain electrode 4D) is to be made, and (ii) which determines the crystal state of the organic semiconductor layer 7. Accordingly, no residue 6a of the partition wall layer 6R is left in the area between P3 and P4 because of removal of the residues 6a together with the sacrificial layer 5B. The distance between P3 and P4 is preferably 3 μm or more.

In addition, as long as an area suitable for making the contact is secured between P3 and P4, P3 may be positioned closer to the channel area side than P2, as shown in FIG. 11C. In other words, either of the following may be used: (the distance between P1 and P3)≥(the distance between P1 and P2); and (the distance between P1 and P3)<(the distance between P1 and P2).

[Embodiment 2]

Figure 12A:
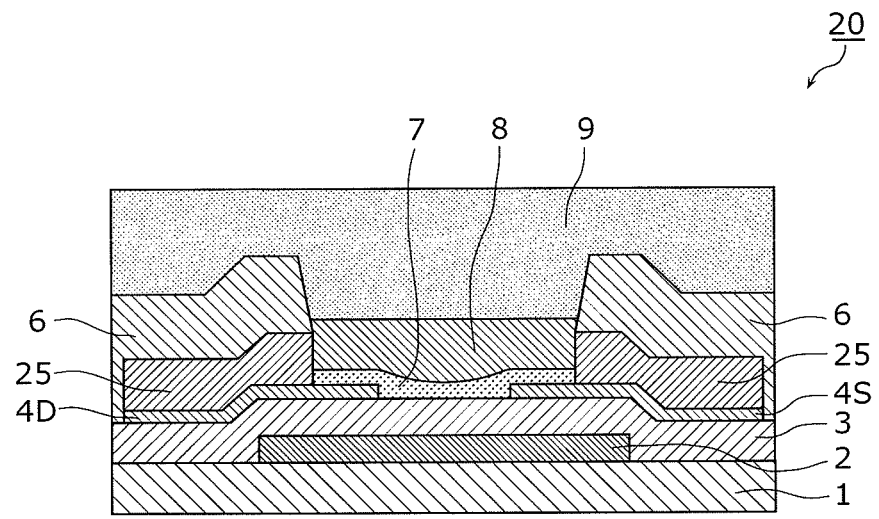
[FIG. 12A]
Figure 12B:
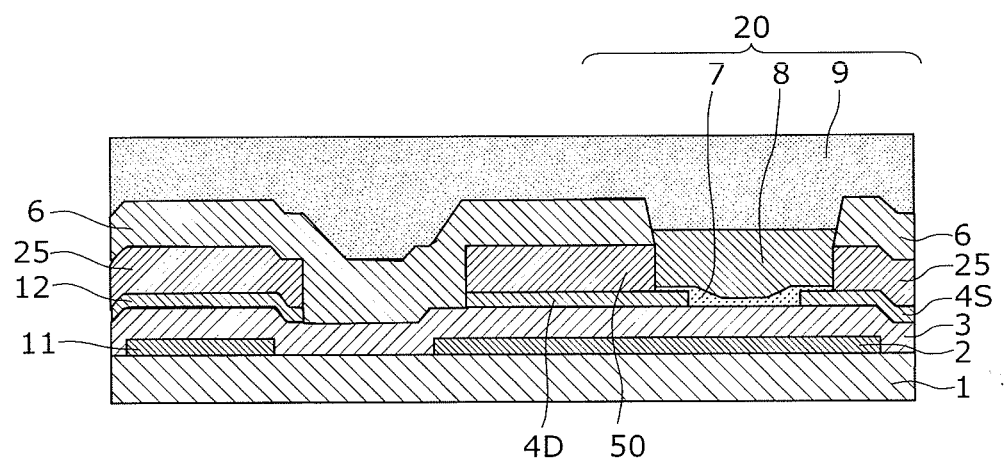
[FIG. 12B]

Next, with reference to FIG. 12A and FIG. 12B, a description is given of an organic thin-film transistor 20 according to Embodiment 2 of the present invention. FIG. 12A is a cross-sectional view of a structure of the organic thin-film transistor according to Embodiment 2 of the present invention, and FIG. 12B is a cross-sectional view of a structure of a wired substrate including the organic thin-film transistor according to Embodiment 2 of the present invention. In each of FIG. 12A and FIG. 12B, the same structural elements as in a corresponding one of FIG. 1A and FIG. 1B are assigned with the same numerical references, and detailed descriptions thereof are skipped or simplified.

As shown in FIG. 12A, the organic thin-film transistor 20 according to this embodiment is a TFT of a bottom gate type and a p-type (p-channel), and includes a substrate 1, a gate electrode 2, a gate insulator 3, a source electrode 4S, a drain electrode 4D, a sacrificial layer 25, a partition wall part 6 having an opening, and an organic semiconductor layer 7 formed in the opening of the partition wall part 6. Furthermore, the organic thin-film transistor 20 includes a protection film 8 and an interlayer insulator 9.

The organic thin-film transistor 20 according to this embodiment is different in the structure of the sacrificial layer from the organic thin-film transistor 10 according to Embodiment 1. In Embodiment 1, the sacrificial layer 25 and the second metal film 4M are separately patterned. However, in this embodiment, the sacrificial layer 25 and the second metal film 4M are collectively patterned. In this way, the sacrificial layer 25 in an area other than the opening of the partition wall part 6 is formed to have the same shape as the shapes of the source electrode 4S and the drain electrode 4D in a top plan view.

In this embodiment, the sacrificial layer 25 is also formed above the source electrode 4S and the drain electrode 4D. However, in this embodiment, the sacrificial layer 25 has a top-plan-view shape which is the same as top-plan-view shapes of the source electrode 4S and the drain electrode 4D. In this embodiment, since the end portion which is of the sacrificial layer 25 and is exposed in the opening is removed by dry etching, the sacrificial layer 25 is formed to have an edge which is vertically flat with the edge of the opening in the partition wall part 6, as in Embodiment 1. In other words, the opening-side edge of the sacrificial layer 25 and the edge of the opening in the partition wall part 6 are continuous and vertically flat.

In this embodiment, the sacrificial layer 25 is made using an insulation material which is an inorganic insulation material such as an oxide film or an organic insulation material, or a metal material such as metal, a metal alloy, or a metal compound which can be used to form the sacrificial layer 25 as in Embodiment 1.

The sacrificial layer 25 made of the metal material can be regarded as parts of the source electrode and the drain electrode because of its conductivity. In other words, the sacrificial layer 25 and the source electrode 4S (or the drain electrode 4D) can be integrally regarded as a source electrode (or a drain electrode). In this case, it is preferable that the sacrificial layer 25 be made of a material having a sheet resistance lower than the sheet resistances of the source electrode 4S and the drain electrode 4D, and can be made of Al, Cu, or the like. In this way, it is possible to substantially reduce the resistance values of the source electrode and the drain electrode including the sacrificial layer 25, and to thereby change the states of the source electrode and the drain electrode into low resistance states.

In addition, the materials composing the source electrode 4S and the drain electrode 4D can also be used as wiring such as video signal lines which are formed in the same layer in which the source electrode 4S and the drain electrode 4D are formed. In other words, by patterning the second metal film 4M, it is possible to form by patterning the source electrode 4S and the drain electrode 4D to have predetermined shapes and, at the same time, to form by patterning the wiring such as the video signal lines and the like to have predetermined shapes.

In this embodiment, the sacrificial layer 25 can be regarded integrally as parts of the source electrode and the drain electrode, and thus the sacrificial layer 25 can be used as a part of the wiring. Accordingly, by collectively patterning the sacrificial layer 25 and the second metal film 4M, it is possible to form by patterning the sacrificial layer 25 and the second metal film 4M to have the same shapes.

In this case, as described earlier, by forming the sacrificial layer 25 having the sheet resistance lower than the sheet resistance of the source electrode 4S (drain electrode 4D), it is possible to reduce the resistance value of the wiring such as the video signal lines, in addition to the resistance values of the source electrode 4S and the drain electrode 4D. In this case, the sacrificial layer 25 desirably has a film thickness larger than the film thicknesses of the source electrode 4S and the drain electrode 4D in order to secure a film thickness sufficient for changing the wiring resistance into a low resistance state. For example, the sacrificial layer 25 can have a film thickness of 100 nm to 1000 nm.

In addition, also in this embodiment, it is preferable to use, as the material for the sacrificial layer 25, a material having a large etching selection ratio with each of the materials of the source electrode 4S, the drain electrode 4D, and the partition wall part 6. In this way, it is possible to balance the etching selection ratio between the sacrificial layer 25 and each of the source electrode 4S (the drain electrode 4D) and the partition wall part 6, and to thereby easily and selectively remove only the part which is of the sacrificial layer 25 and in the opening of the partition wall part 6.

In addition, also in this embodiment, the source electrode 4S and the drain electrode 4D facing each other are formed to have end portions exposed in the opening of the partition wall part 6. In other words, the opening-side end portions of the source electrode 4S and drain electrode 4D are formed to position in the opening portion of the partition wall part 6 in a top plan view, and the partition wall part 6 is formed so as not to be positioned above the end portions in the opening.

As shown in FIG. 12B, the organic thin-film transistor 20 manufactured in this way includes the wired substrate (TFT array substrate) including the scanning lines (gate lines) 11 and video signal lines (source lines) 12 formed above the substrate 1. In addition, also in this embodiment, the electrodes in the organic thin-film transistor 20 may also be extended to serve as lines. For example, as shown in FIG. 12B, the gate electrode 2 and the drain electrode 4D are extended to serve as lines. In this case, in this embodiment, the sacrificial layer 25, the source electrode 4S, and the drain electrode 4D are collectively patterned. Since the sacrificial layer 25 also serves as the source electrode 4S and the drain electrode 4D, the sacrificial layer 25 is formed also above the extended source electrode 4S and drain electrode 4D. For example, as shown in FIG. 12B, the sacrificial layer 25 is formed also above the video signal lines 12 formed in the same layer in which the drain electrode 4D is formed. In this way, by reducing the sheet resistance of the sacrificial layer 25 as described above, it is possible to reduce the wiring resistance of the video signal lines 12.

For example, the sacrificial layer 25 may have a small work function because the contact area with the organic semiconductor layer 7 is very small, and is preferably made of, for example, a metal having a low resistance such as Al (having a work function of 4.3 eV) and Cu (having a work function of 4.6 eV). In this way, even when the wiring such as the video signal lines etc. formed to include the extended source electrode 4S and drain electrode 4D is lengthened, it is possible to suppress voltage decrease caused by the wiring. Accordingly, it is possible to realize a display apparatus which provides excellent image quality even with the use of a large display panel.

Figure 13:
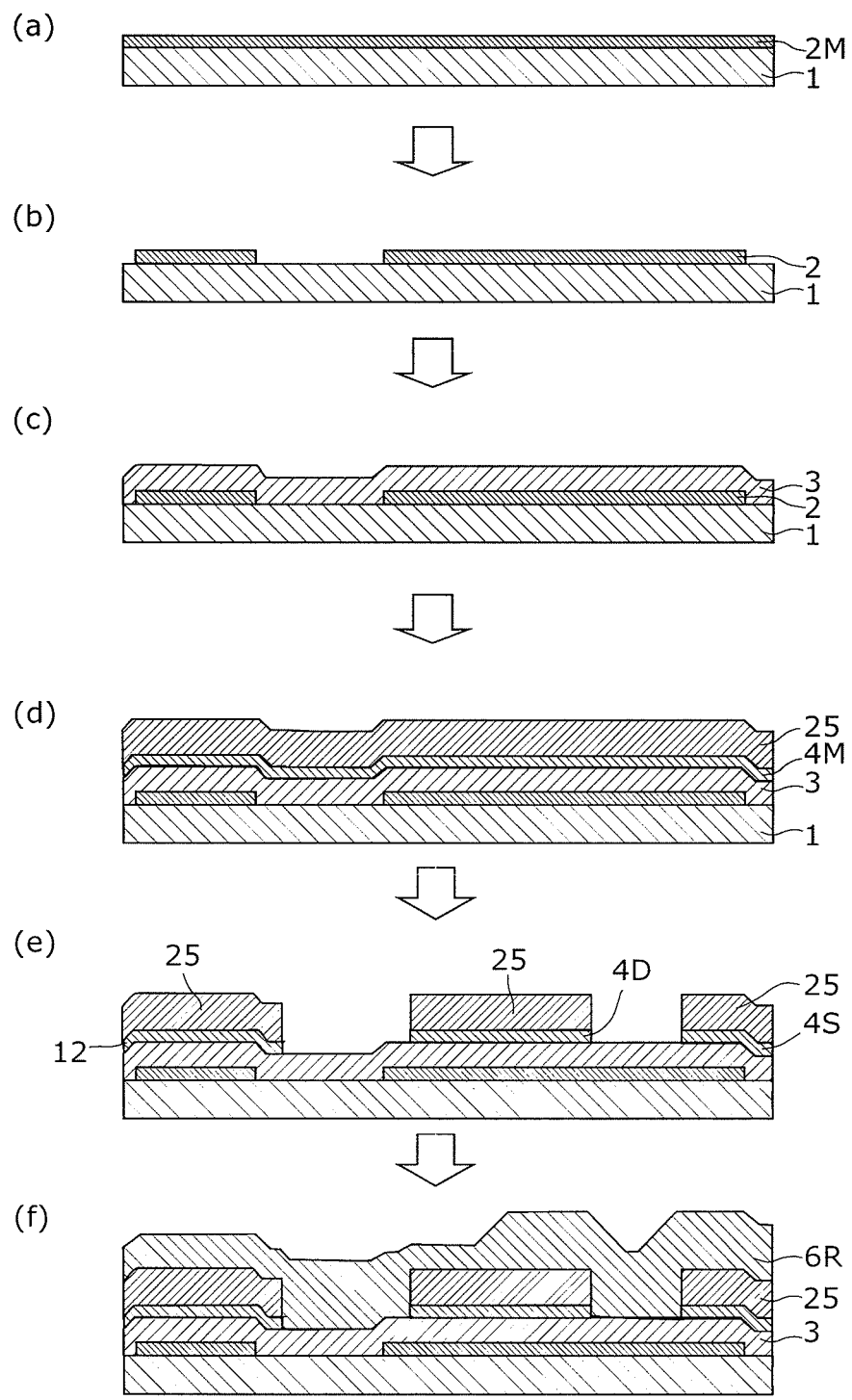
[FIG. 13]
Figure 14:
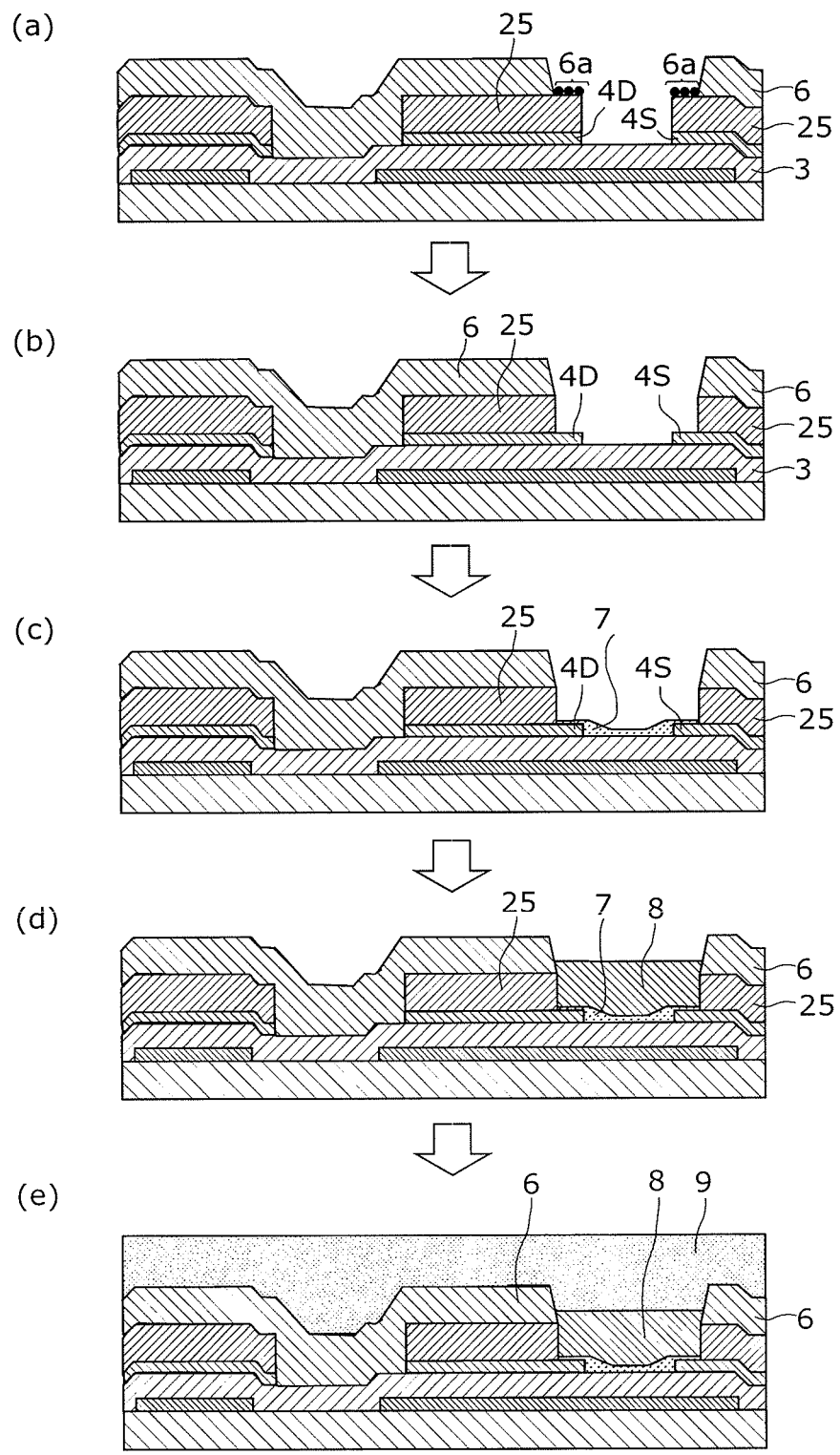
[FIG. 14]

Next, with reference to FIG. 13 and FIG. 14, a description is given of a method of manufacturing the organic thin-film transistor 20 according to Embodiment 2 of the present invention. Each of FIG. 13 and FIG. 14 is composed of cross-sectional views for explaining processes in the method of manufacturing the organic thin-film transistor according to Embodiment 2 of the present invention. In this embodiment, differences from Embodiment 1 are mainly described.

First, as in Embodiment 1, as shown in (a) of FIG. 13, a first metal film (gate metal film) 2M is formed by depositing a material for the gate electrode 2, above the substrate 1. Subsequently, as shown in (b) of FIG. 13, the first metal film 2M is patterned using photolithograpy or etching to form the gate electrode 2 having a predetermined shape. Subsequently, as shown in (c) of FIG. 13, a gate insulator 3 is formed above the gate electrode 2.

Next, as shown in (d) of FIG. 13, a second metal film (source drain metal film) 4M is formed by depositing a material for the source electrode 4S and the drain electrode 4D, above the entire surface of the gate insulator 3. Next, as shown in the diagram, a sacrificial layer 25 is formed by depositing a predetermined material, above the entire surface of the second metal film 4M, continuously from the formation of the second metal film 4M. In this embodiment, the sacrificial layer 25 is made of a metal-based material. In this case, the sacrificial layer 25 is desirably made of a material having a low sheet resistance, for example Al, Cu, or the like, as described earlier.

Next, as shown in (e) of FIG. 13, the sacrificial layer 25 and the second metal film 4M are collectively patterned through photolithography and etching at the same time. In this way, the source electrode 4S and the drain electrode 4D which are paired and have predetermined shapes can be formed, and the sacrificial layer 25 can be formed by being deposited above the source electrode 4S and the drain electrode 4D to have the same shape with the source electrode 4S and the drain electrode 4D. In addition, through the etching at this time, the gate insulator 3 is exposed between the source electrode 4S and the drain electrode 4D.

The etching performed here can be wet etching or dray etching. In addition, when collectively patterning the second metal film 4M and the sacrificial layer 25, it is possible to form by patterning the wiring above the TFT array substrate at the same time of forming by patterning the source electrode 4S, the drain electrode 4D, and the sacrificial layer 25 at the same time. In other words, it is possible to form the wiring above the TFT array substrate and the source electrode 4S (or the drain electrode 4D) and the sacrificial layer 25 using the same material at the same time. For example, as shown in the diagram, it is possible to form the video signal lines 12 on which the sacrificial layer 25 is formed by patterning the second metal film 4M and the sacrificial layer 25.

Next, as shown in (f) of FIG. 13, a partition wall layer 6R is formed by applying a predetermined material for the partition wall part 6 above the entire surface above the substrate 1. In this way, it is possible to form the partition wall layer 6R to cover the sacrificial layer 25, the source electrode 4S, the drain electrode 4D, and the exposed gate insulator 3 etc.

Next, as shown in (a) of FIG. 14, as in Embodiment 1, the partition wall layer 6R is patterned to re-expose the gate insulator 3 between the source electrode 4S and the drain electrode 4D and partly expose the sacrificial layer 25 above the source electrode 4S and the drain electrode 4D, so that an opening is formed above the gate electrode 2. In this way, it is possible to form the partition wall part 6 having a predetermined shape, and the opening and the partition wall portion (bank).

As shown in the diagram, as in Embodiment 1, residues 6a of the partition wall layer 6R exist on the exposed surfaces of the end portions of the sacrificial layer 25 after the development of the partition wall layer 6R.

Next, as shown in (b) of FIG. 14, as in Embodiment 1, the sacrificial layer 25 exposed in the opening of the partition wall part 6 is removed by etching using, as a mask, the partition wall portion of the partition wall part 6 so as to expose the end portions of the source electrode 4S and the drain electrode 4D positioned below the sacrificial layer 25. In this process, the sacrificial layer 25 is removed by etching above the end portions of the source electrode 4S and the drain electrode 4D in the portions to be exposed in the opening. In this embodiment, the sacrificial layer 25 has been etched by dry etching. In this way, the sacrificial layer 25 is etched to have an opening-side edge of the sacrificial layer 25 which is vertically flat with the edge of the opening in the partition wall part 6.

Through this process, also in this embodiment, since the end portions of the sacrificial layer 25 exposed in the opening of the partition wall part 6 are removed, the residues 6a of the partition wall layer 6R above the end portions of the sacrificial layer 25 are removed together with the sacrificial layer 25. In other words, the residues 6a of the partition wall layer 6R are removed by lift-off at the time of etching of the end portions of the sacrificial layer 25. In this way, the residues 6a of the partition wall layer 6R are not left above the source electrode 4S and the drain electrode 4D, and it is possible to clean the surfaces of the end portions of the source electrode 4S and the drain electrode 4D.

Next, as in Embodiment 1, a solution (organic semiconductor solution) including an organic semiconductor material is applied to the opening of the partition wall part 6 using an ink jet method, and then the solution including the organic semiconductor material is dried by performing a predetermined heat treatment onto the solution to crystallize the organic semiconductor material. In this way, as shown in (c) of FIG. 14, it is possible to form the organic semiconductor layer 7 inside the opening of the partition wall part 6.

Next, as shown in (d) of FIG. 14, the solution including an overcoat material which is a material for a protection film 8 is applied to the inside of the opening of the partition wall part 6 from above the organic semiconductor layer 7 using an ink jet method, and the solution is dried to form the protection film 8. Next, as shown in (e) of FIG. 14, an interlayer insulator 9 is formed above the entire surface above the substrate 1 including the protection film 8.

In this way, it is possible to form the organic thin-film transistor 20 according to this embodiment.

As described above, as in Embodiment 1, in the organic thin-film transistor 20 according to Embodiment 2 of the present invention, the residues 6a of the partition wall layer 6R at the time of forming the opening in the partition wall layer 6R are removed by etching the sacrificial layer 25 above the source electrode 4S and the drain electrode 4D. In this way, it is possible to achieve the organic semiconductor layer 107 having an excellent crystallizability and capable of suppressing increase in contact resistance and to suppress increase in the contact resistances, and to thereby achieve the organic thin-film transistor having excellent ON characteristics.

In this embodiment as in Embodiment 1, the area rate of the source electrode 4S and the drain electrode 4D with respect to the opening is equal to or larger than 50%, and the interval (channel length) between the source electrode 4S and the drain electrode 4D is smaller than an average grain diameter (average grain size) of crystals of the organic semiconductor layer 7 positioned above the source electrode 4S and the drain electrode 4D. In this way, it is possible to form the organic semiconductor layer 7 composed of large-grain crystals which transverse the source electrode 4S and the drain electrode 4D. Accordingly, it is possible to reduce the number of grain boundaries between the source electrode 4S and the drain electrode 4D, and to thereby increase the carrier mobility.

Furthermore, when forming the wiring such as the video signal lines 12 etc. using the second metal film 4M in the organic thin-film transistor 20 according to this embodiment, the sacrificial layer 25 and the second metal film 4M are collectively patterned to form the sacrificial layer 25 above the wiring including video signal lines 12. In this case, it is possible to reduce the resistance of the wiring such as the video signal lines 12 etc, by reducing the sheet resistance of the material composing the sacrificial layer 25 down to a sheet resistance below the sheet resistance of the material composing the second metal film 4M (the wiring including the video signal lines 12, the source electrode 4S, and the drain electrode 4D). In other words, it is possible to achieve the wiring which has a low resistance state.

(Variation 1 of Embodiment 2)

Figure 15A:
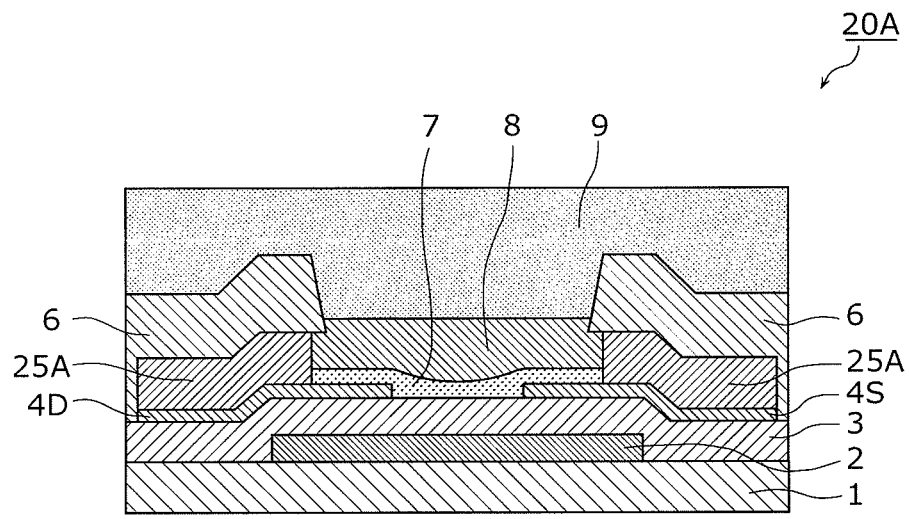
[FIG. 15A]
Figure 15B:
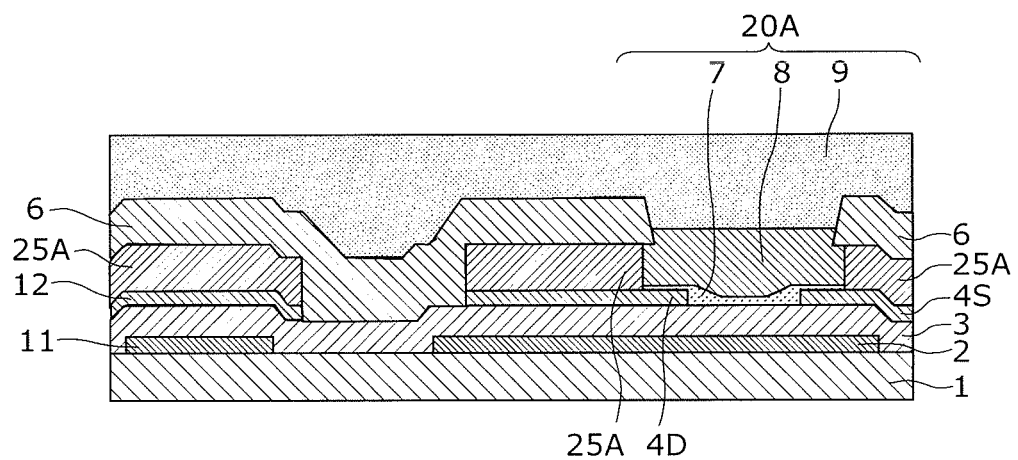
[FIG. 15B]

Next, with reference to FIG. 15A and FIG. 15B, a description is given of an organic thin-film transistor 20A according to Variation 1 of Embodiment 2 of the present invention. FIG. 15A is a cross-sectional view of a structure of the organic thin-film transistor according to Variation 1 of Embodiment 2 of the present invention, and FIG. 15B is a cross-sectional view of a structure of a wired substrate including the organic thin-film transistor according to this variation. In each of FIG. 15A and FIG. 15B, the same structural elements as in a corresponding one of FIG. 12A and FIG. 12B are assigned with the same numerical references, and detailed descriptions thereof are skipped or simplified.

As shown in FIG. 15A and FIG. 15B, the organic thin-film transistor 20A and the wired substrate according to this variation are respectively different from the organic thin-film transistor 20 and the wired substrate in FIG. 12A and FIG. 12B in that the sacrificial layer 25A has an opening-side edge positioned outward from the edge of the opening in the partition wall part 6.

The method of manufacturing the organic thin-film transistor 20A according to this variation is similar to the method of manufacturing the organic thin-film transistor 20 according to Embodiment 2. In this variation, the end portion of the sacrificial layer 25A is etched so that its opening-side edge is positioned outward from the edge of the opening in the partition wall part 6. In this variation, in the etching of the sacrificial layer 25 in (a) of FIG. 14, the exposed sacrificial layer 25 is etched so that its side surface above the source electrode 4S and the opposing side surface above the drain electrode 4D become further apart from each other with respect to the edge of the opening of the partition wall part 6.

This structure can be formed by removing by wet etching the end portion of the sacrificial layer 25A exposed in the opening of the partition wall part 6. In this case, it is preferable to use, as the material for the sacrificial layer 25A, a material having a large etching selection ratio with each of the materials of the source electrode 4S, the drain electrode 4D, and the partition wall part 6. In other words, it is preferable to select the material for the sacrificial layer 25A so that the etching rate of the sacrificial layer 25A against an etching solution is larger by a certain level than the etching rates of the source electrode 4S (drain electrode 4D) and the partition wall part 6 against the etching solution. In this way, it is possible to balance the etching selection ratio between the sacrificial layer 25A and each of the source electrode 4S (the drain electrode 4D) and the partition wall part 6 and the partition wall part 6, and to thereby remove the side-surface part of the sacrificial layer 25A up to the outward position. The sacrificial layer 25A is preferably formed using a material which is easily etched by hydrofluoric acid.

For example, when each of the source electrode 4S and the drain electrode 4D is made of a Ni or a Ni alloy, and the sacrificial layer 25A is made of Cu or a Cu alloy, it is possible to selectively etch only the sacrificial layer 25A (made of Cu or a Cu alloy) by using an etching solution containing hydrogen peroxide (1 to 10 wt %), nitric acid (0.01 to 10 wt %), and water, and having a concentration ratio of 0.5 or more between the hydrogen peroxide and nitric acid.

In addition, when each of the source electrode 4S and the drain electrode 4D is made of Mo or a Mo alloy, and the sacrificial layer 25A is made of Cu or a Cu alloy, it is possible to selectively etch (with a selection ratio of 10:1) only the sacrificial layer 25A (made of Cu or a Cu alloy) by using an etching solution containing hydrogen peroxide (5 to 30 wt %), organic acid (0.5 to 5 wt %) such as acetic acid, phosphate (0.2 to 5 wt %) such as sodium dihydrogenphosphate, an additive (0.2 to 5 wt %) made of a nitride such as aminotetrazole, an alanine-based additive (0.2 to 5 wt %), a fluorine compound (0.01 to 1 wt %) such as ammonium fluoride, or deionized water.

As described above, the organic thin-film transistor 20A according to this variation provides effects similar to the effects provided by the organic thin-film transistor 20 according to Embodiment 2.

(Variation 2 of Embodiment 2)

Figure 16A:
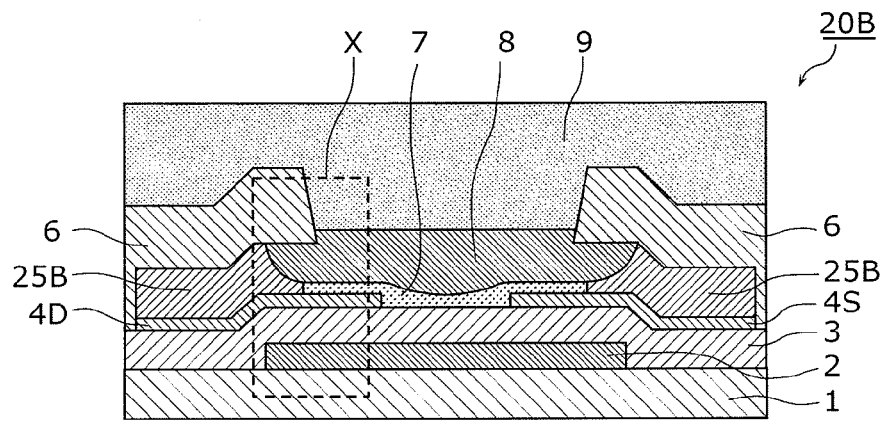
[FIG. 16A]
Figure 16B:
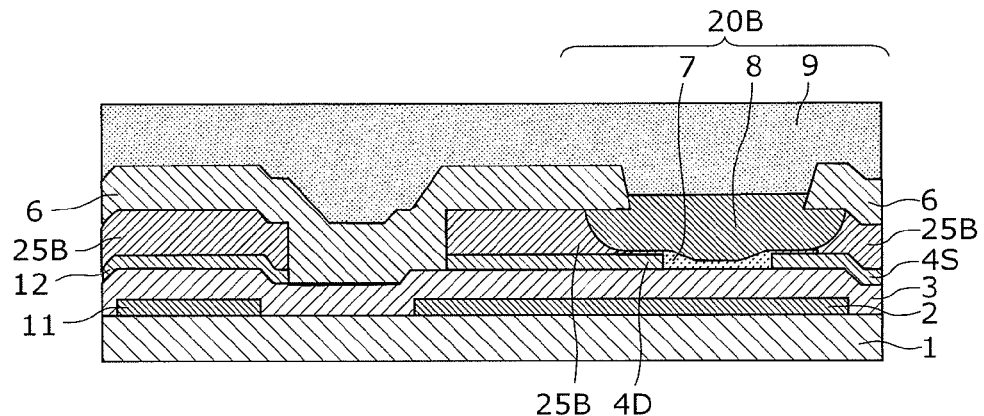
[FIG. 16B]
Figure 16C:
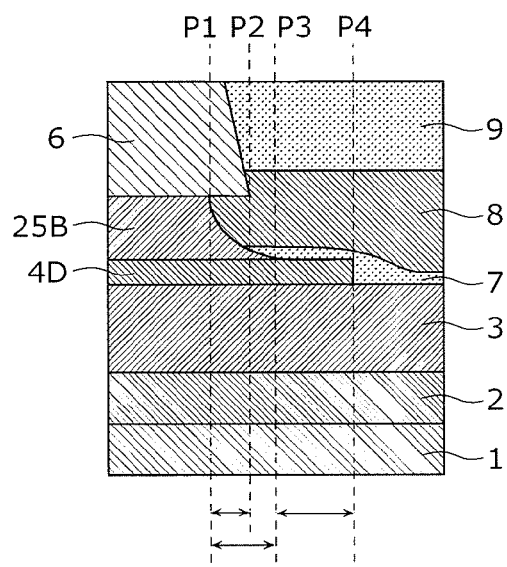
[FIG. 16C]

Next, with reference to FIG. 16A, FIG. 16B, and FIG. 16C, a description is given of an organic thin-film transistor 20B according to Variation 2 of Embodiment 2 of the present invention. FIG. 16A is a cross-sectional view of a structure of the organic thin-film transistor according to Variation 2 of Embodiment 2 of the present invention, FIG. 16B is a cross-sectional view of a wired substrate including the organic thin-film transistor according to this variation, and FIG. 16C is an enlarged cross-sectional view of the area X enclosed by the broken line shown in FIG. 16A. In FIG. 16A to FIG. 16C, the same structural elements as in FIG. 12A and FIG. 12B are assigned with the same numerical references, and detailed descriptions thereof are skipped or simplified.

As shown in FIG. 16A and FIG. 16B, the organic thin-film transistor 20B and the wired substrate according to this variation are respectively different from the organic thin-film transistor 20 and the wired substrate in FIG. 12A and FIG. 12B in that the sacrificial layer 25B has an opening-side edge positioned outward from the edge of the opening in the partition wall part 6. In addition, although Variation 1 includes the sacrificial layer 25A having the opening-side edge with a straight-line-shaped cross section, this variation includes the sacrificial layer 25B having the opening-side edge with an arc-shaped cross section.

The method of manufacturing the organic thin-film transistor 20B according to this variation is similar to the method of manufacturing the organic thin-film transistor 20 according to Variation 2. In this variation, the edge of the sacrificial layer 25B is etched so that its opening-side edge is positioned further outward from the edge of the opening in the partition wall part 6.

This structure can be formed by removing by wet etching the end portion of the sacrificial layer 25B exposed in the opening of the partition wall part 6, as in Variation 1. For example, when using the same materials for the sacrificial layer 25B, the source electrode 4S, and the drain electrode 4D as those in Variation 1, it is possible to form the structure by lengthening the etching time. Alternatively, it is possible to form the structure by selecting, as the material for the sacrificial layer 25B, a material having a larger etching selection ratio with respect to each of the source electrode 4S, the drain electrode 4D, and the partition wall part 6 than the etching selection ratio in Variation 1.

As described above, the organic thin-film transistor 20B according to this variation provides similar effects as the effects provided by the organic thin-film transistor 20 according to Embodiment 2.

In addition, as shown in FIG. 16C, no residue 6a of the partition wall layer 6R is left in the area between P3 and P4 because of removal of the residues 6a together with the sacrificial layer 25B, as in FIG. 11C. The distance between P3 and P4 is preferably 3 μm or more. In addition, as long as an area suitable for making the contact is secured between P3 and P4, P3 may be positioned closer to the channel area side than P2.

[Embodiment 3]

Figure 17A:
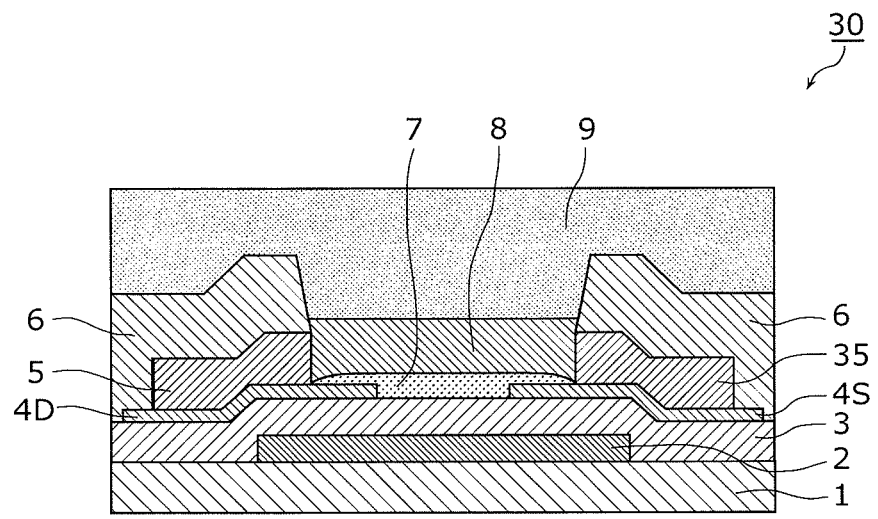
[FIG. 17A]
Figure 17B:
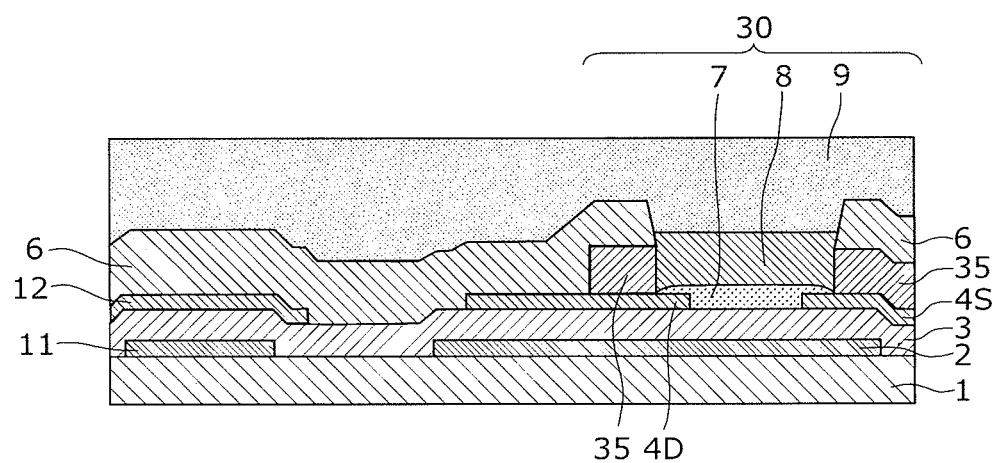
[FIG. 17B]

Next, with reference to FIG. 17A and FIG. 17B, a description is given of an organic thin-film transistor 30 according to Embodiment 3 of the present invention. FIG. 17A is a cross-sectional view of a structure of the organic thin-film transistor according to Embodiment 3 of the present invention. In each of FIG. 17A and FIG. 17B, the same structural elements as in a corresponding one of FIG. 1A and FIG. 1B are assigned with the same numerical references, and detailed descriptions thereof are skipped or simplified.

As shown in FIG. 17A, the organic thin-film transistor 30 according to this embodiment is a TFT of a bottom gate type and a p-type (p-channel), and includes a substrate 1, a gate electrode 2, a gate insulator 3, a source electrode 4S, a drain electrode 4D, a sacrificial layer 35, a partition wall part 6 having an opening formed correspondingly to a channel part 8 (an organic semiconductor layer 7), and an organic semiconductor layer 7 formed in the opening of the partition wall part 6. Furthermore, the organic thin-film transistor 10 includes a protection film 8 and an interlayer insulator 9.

The sacrificial layer 35 in this embodiment is made of a material having a higher repellency to liquid than that of the sacrificial layer 5 in Embodiment 1. In other word, the sacrificial layer 35 in this embodiment also functions as the layer having repellency to liquid. In this way, since the sacrificial layer 35 has repellency to liquid, the organic semiconductor material applied to the inside of the opening is gathered in the center area of the opening of the partition wall part 6 due to the presence of the sacrificial layer 35. In this way, it is possible to form the organic semiconductor layer 7 having a large film thickness above (the channel area) the gate electrode 2.

As a material for the sacrificial layer 35, it is possible to use an organic insulation material such as a photosensitive agent made of resin or the like or an inorganic insulation material. Desirably, a material with a fluorine additive is used for the sacrificial layer 35. Use of such a fluorine additive makes it possible to easily provide the sacrificial layer 35 with repellency to liquid. Thus, it is possible to easily gather the organic semiconductor material applied to the opening of the partition wall part 6 to the center area of the opening of the partition wall part 6. In this way, it is possible to easily increase the film thickness of the organic semiconductor layer 7 to be formed above (the channel area) of the gate electrode 2. For example, as a resin material with a fluorine additive, it is possible to use an amorphous fluorine resin (product name: Cytop made by Asahi Glass corporation).

Figure 18:
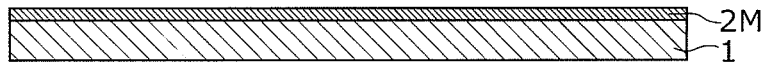
[FIG. 18]
Figure 18:
Figure 18:
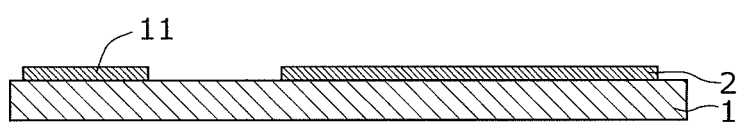
Figure 18:
Figure 18:
Figure 18:
Figure 18:
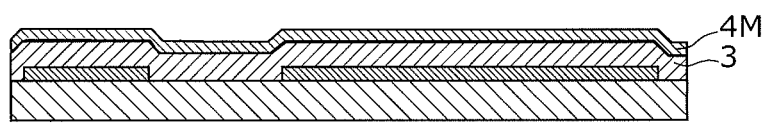
Figure 18:
Figure 18:
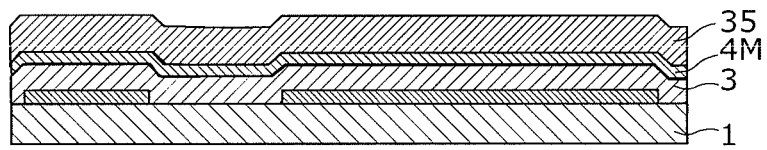
Figure 18:
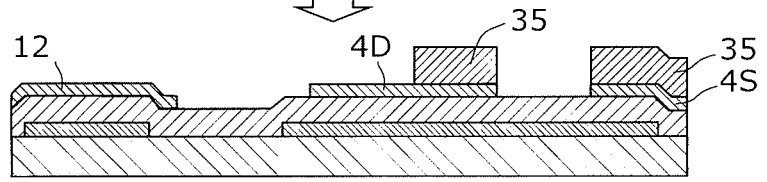
Figure 18:
Figure 18:
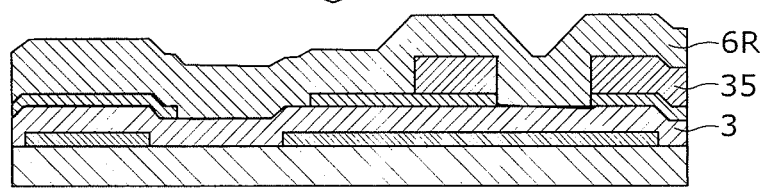
Figure 19:
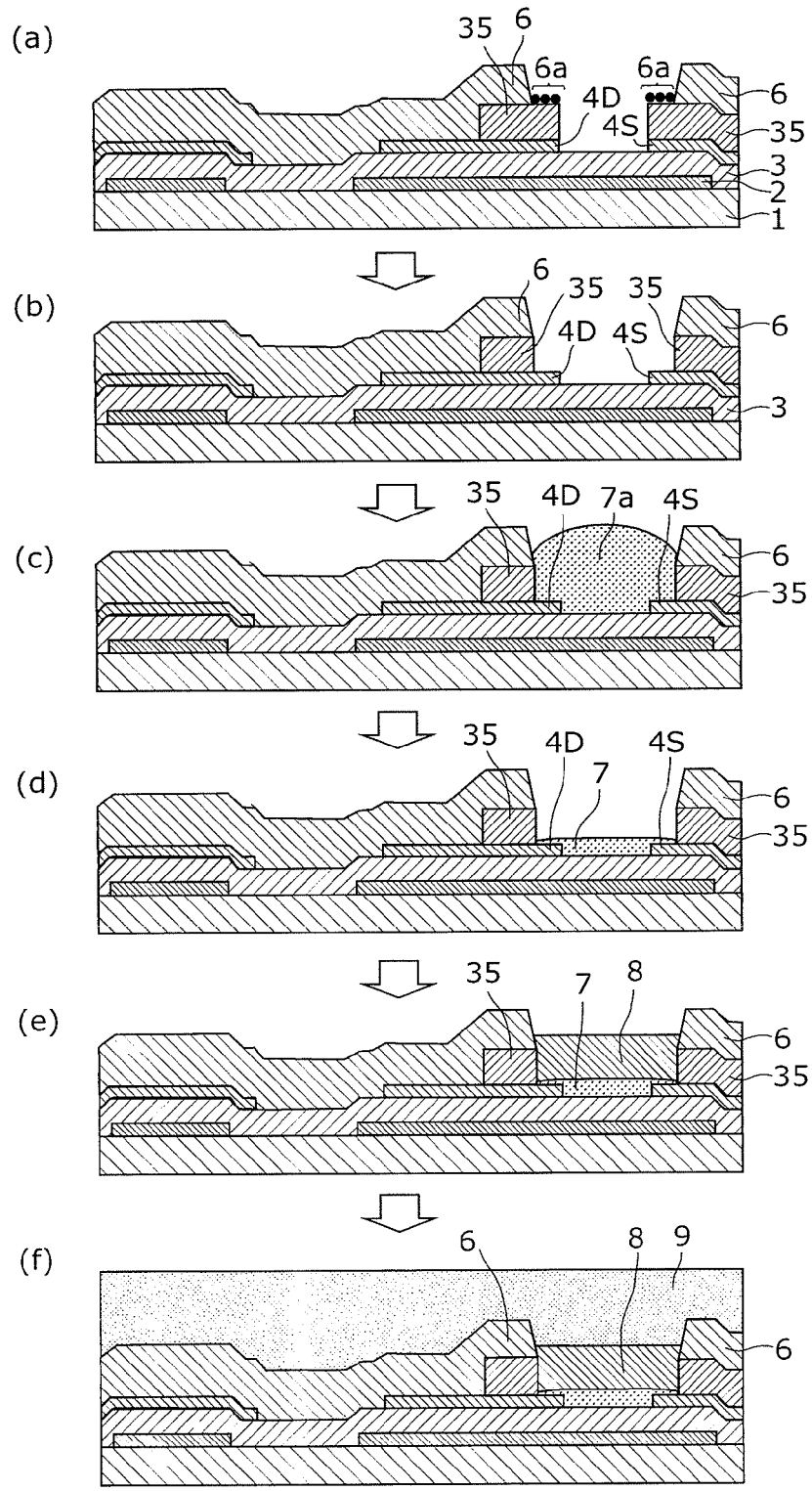
[FIG. 19]

Next, with reference to FIG. 18 and FIG. 19, a description is given of a method of manufacturing the organic thin-film transistor 30 according to Embodiment 3 of the present invention. Each of FIG. 18 and FIG. 19 is composed of cross-sectional views for explaining processes in the method of manufacturing the organic thin-film transistor according to Embodiment 3 of the present invention.

First, as in Embodiment 1, as shown in (a) of FIG. 18, a first metal film (gate metal film) 2M is formed by depositing a material for the gate electrode 2, above the substrate 1. Subsequently, as shown in (b) of FIG. 18, the first metal film 2M is patterned using photolithography or etching to form the gate electrode 2 having a predetermined shape. Subsequently, as shown in (c) of FIG. 18, a gate insulator 3 is formed above the gate electrode 2.

Next, as shown in (d) of FIG. 18, a second metal film (source drain metal film) 4M is formed by depositing a material for the source electrode 4S and the drain electrode 4D, above the entire surface of the gate insulator 3, as in Embodiment 1.

Next, as shown in (e) of FIG. 18, a sacrificial layer 35 is formed by depositing a predetermined material above the entire surface of the second metal film 4M. The sacrificial layer 35 can be made of, for example, an insulation material. Thus, an insulation material obtained by adding fluorine to a photosensitive resin is used in this embodiment. As described above, it is preferable to use, as the material for the sacrificial layer 35, a material having a large etching selection ratio with each of the materials of the source electrode 4S, the drain electrode 4D, and the partition wall part 6.

Next, as shown in (f) of FIG. 18, the sacrificial layer 35 and the second metal film 4M are patterned by two times of photolithography and etching to form the source electrode 4S and the drain electrode 4D which are paired, have a predetermined shape, and face each other, and to form the sacrificial layer 35 having a predetermined shape above the source electrode 4S and the drain electrode 4D, as in Embodiment 1. At this time, the second metal film 4M is removed by etching so that the gate insulator 3 is exposed.

Next, as shown in (g) of FIG. 18, a partition wall layer 6R is formed by applying a predetermined material for the partition wall part 6 above the entire surface above the substrate 1, as in Embodiment 1.

Next, as shown in (a) of FIG. 19, the partition wall layer 6R is patterned to re-expose the gate insulator 3 between the source electrode 4S and the drain electrode 4D and partly expose the sacrificial layer 35 above the source electrode 4S and the drain electrode 4D, so that an opening is formed above the gate electrode 2, as in Embodiment 1.

Next, as shown in (b) of FIG. 19, the sacrificial layer 35 is removed by etching, using as a mask, the partition wall portion of the partition wall part 6, so as to expose the end portions of the source electrode 4S and the drain electrode 4D positioned below the removed portion of the sacrificial layer 35, as in Embodiment 1.

In this process, since the end portions of the sacrificial layer 35 exposed in the opening of the partition wall part 6 are removed, the residues 6a of the partition wall layer 6R above the end portions of the sacrificial layer 35 are removed together with the sacrificial layer 35.

Next, as shown in (c) of FIG. 19, a solution (an organic semiconductor solution) including an organic semiconductor material is applied to the inside of the opening of the partition wall part 6 using an ink jet method. The solution including the organic semiconductor material spread in the opening is guarded by the opposing inner wall surfaces (side surfaces) of the sacrificial layer 35 and the opposing partition wall portions (the inner wall surfaces of the opening) of the partition wall part 6, which defines an area in which the solution including the organic semiconductor material is applied. In this way, it is possible to prevent the solution including the organic semiconductor material from flowing outside the opening of the partition wall part 6. Furthermore, since the solution including the organic semiconductor material is sandwiched by the sacrificial layer 35, the solution including the organic semiconductor material is inflated at the center due to surface tension.

Here, desirably, when applying the organic semiconductor solution in using the ink jet method, the solution is dropped around the center of the opening of the partition wall part 6. In addition, examples of organic semiconductor materials include a soluble organic material which is a pentacene, phthalocyanine-based, or porphyrin material, as in Embodiment 1.

Subsequently, the solution including the organic semiconductor material is dried for solidification by performing a predetermined heat treatment on the solution so as to crystallize the organic semiconductor material. In this way, as shown in (d) of FIG. 19, it is possible to form the organic semiconductor layer 7 having a defined outer periphery inside the opening of the partition wall part 6. In this embodiment, the organic semiconductor layer 7 is formed to cover from the upper surface of the end portion of the source electrode 4S to the upper surface of the end portion of the drain electrode 4D so as to cover the upper surface of the exposed gate insulator 3. In this case, the organic semiconductor layer 7 in the channel layer is grown to be thick due to the repellency effect of the organic semiconductor material of the sacrificial layer 35. In other words, the organic semiconductor layer 7 becomes thicker in the center area of the opening of the partition wall part 6 than in the peripheral area of the opening.

It is to be noted that, preferably, the heat in the predetermined heat treatment has a temperature at which the organic semiconductor material included in the solution is crystallized without being decomposed by the heat and at which the solvent in the solution can be vaporized. In this embodiment, the heat treatment has been performed at a temperature around 200 degrees Celsius.

Next, as shown in (e) of FIG. 19, the solution including an overcoat material which is a material for the protection film 8 is applied to the inside of the opening of the partition wall part 6 from above the organic semiconductor layer 7 using an ink jet method, as in Embodiment 1.

Next, as shown in (f) of FIG. 19, an interlayer insulator 9 is formed above the entire surface above the substrate 1 including the protection film 8, as in Embodiment 1. The interlayer insulator 9 is formed to have intended thicknesses to flatten its upper surface. The interlayer insulator 9 can be formed by applying a predetermined material such as SOG.

In this way, it is possible to form the organic thin-film transistor 30 according to this embodiment.

Figure 20:
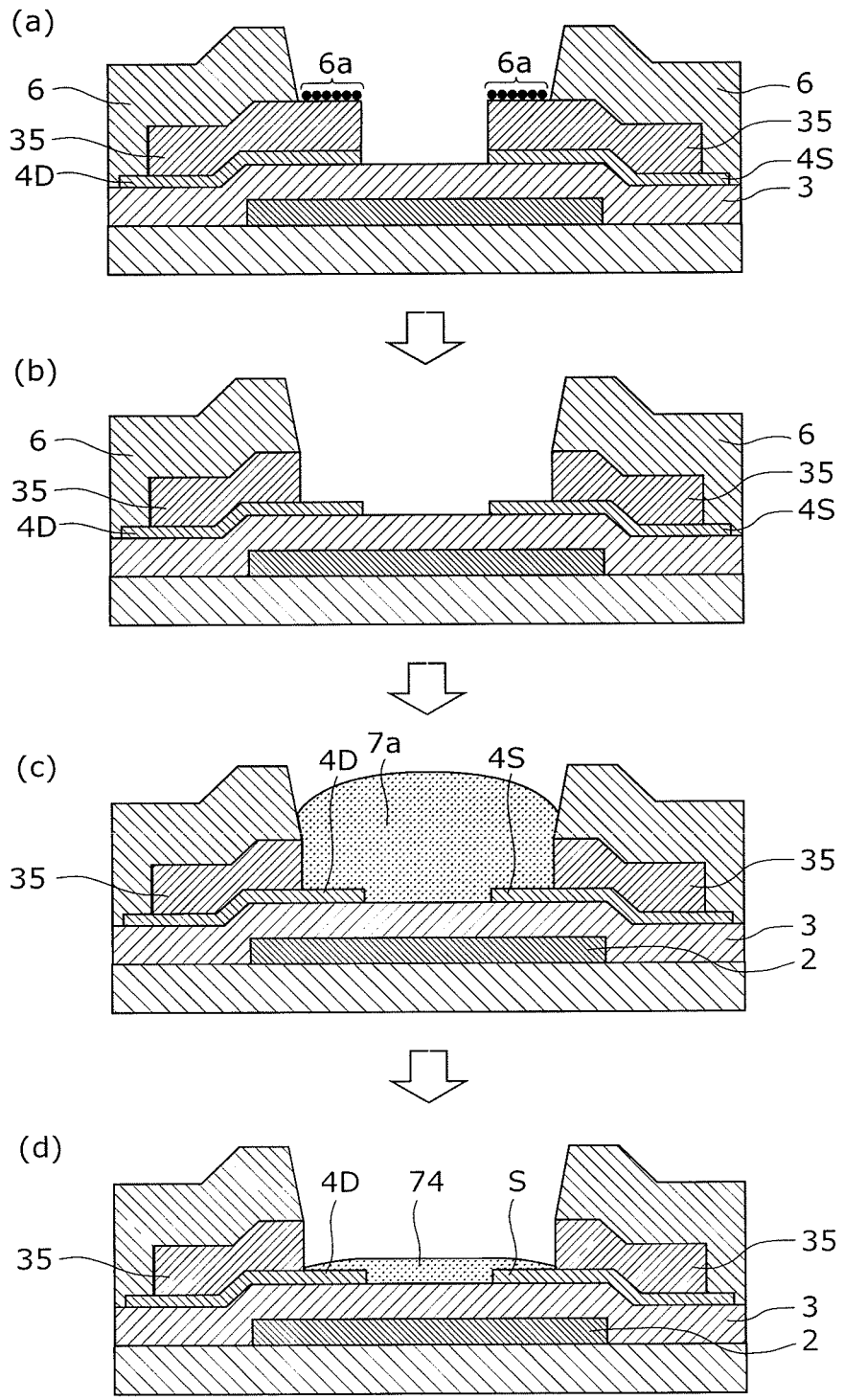
[FIG. 20]

Next, with reference to FIG. 20, a description is given of an effect provided by the organic thin-film transistor 30 according to this embodiment. FIG. 20 is a cross-sectional view for explaining characteristic processes in the method of manufacturing the organic thin-film transistor according to Embodiment 3 of the present invention.

As described above, according to the method of manufacturing the conventional organic thin-film transistor 100 as shown in FIG. 32 and FIG. 33, residues 106a of the partition wall layer 106R exist on the surfaces of the end portions of the source electrode 104S and the drain electrode 104D, which deteriorates the TFT characteristics of the organic thin-film transistor 100.

On the other hand, in the organic thin-film transistor 30 according to this embodiment, the partition wall layer 6R is formed, via the sacrificial layer 35, above the end portions of the source electrode 4S and the drain electrode 4D, and as shown in (a) of FIG. 20, residues 6a of the partition wall layer 6R are left not on the surfaces of the source electrode 4S and the drain electrode 4D but on the surface of the sacrificial layer 35 when forming the opening in the partition wall layer 6R, as in Embodiment 1. Subsequently, as shown in (b) of FIG. 20, the residues 6a of the partition wall layer 6R are removed by etching together with the sacrificial layer 35 above the end portions of the source electrode 4S and the drain electrode 4D when the sacrificial layer 35 is removed by etching, so as to form the organic semiconductor layer 7 in the opening of the partition wall part 6 as shown in (c) and (d) of FIG. 20. In this way, since it is possible to form the organic semiconductor layer 7 in a state where the residues 6a of the partition wall layer 6R are not left on the surfaces of the source electrode 4S and the drain electrode 4D, the interface surfaces between the respective end portions of the source electrode 4S and the drain electrode 4D and the organic semiconductor layer 7 are cleaned. In this way, it is possible to achieve the organic semiconductor layer 7 having an excellent crystallizability, and to suppress increase in the contact resistance between the source electrode 4S (drain electrode 4D) and the organic semiconductor layer 7 caused by the residues 6a of the partition wall layer 6R. Accordingly, it is possible to realize the organic thin-film transistor having excellent TFT characteristics, as in Embodiment 1. In particular, since it is possible to enlarge the diameters of grains of crystals in the organic semiconductor layer 7, it is possible to achieve the thin-film transistor having excellent ON characteristics.

In this embodiment as in Embodiment 1, the area rate of the source electrode 4S and the drain electrode 4D with respect to the opening is equal to or larger than 50%, and the interval (channel length) between the source electrode 4S and the drain electrode 4D is smaller than an average grain diameter (average grain size) of crystals of the organic semiconductor layer 7 positioned above the source electrode 4S and the drain electrode 4D. In this way, it is possible to form the organic semiconductor layer 7 composed of large-grain crystals which transverse the source electrode 4S and the drain electrode 4D. Accordingly, it is possible to reduce the number of grain boundaries between the source electrode 4S and the drain electrode 4D, and to thereby increase the carrier mobility.

Furthermore, according to the organic thin-film transistor 30 according to this embodiment, since the sacrificial layer 35 has repellency to liquid, it is possible to gather the solvent of the organic semiconductor material applied to the opening of the partition wall part 6 to an area above the gate electrode 2 (channel area), and to form the organic semiconductor layer 7 having a large thickness in the channel layer. In this way, it is possible to further increase ON characteristics.

(Variation 1 of Embodiment 3)

Figure 21A:
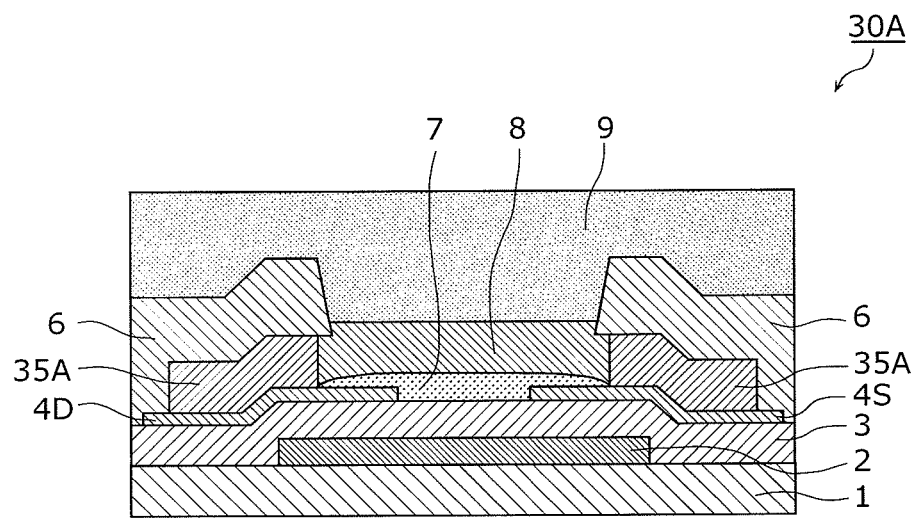
[FIG. 21A]
Figure 21B:
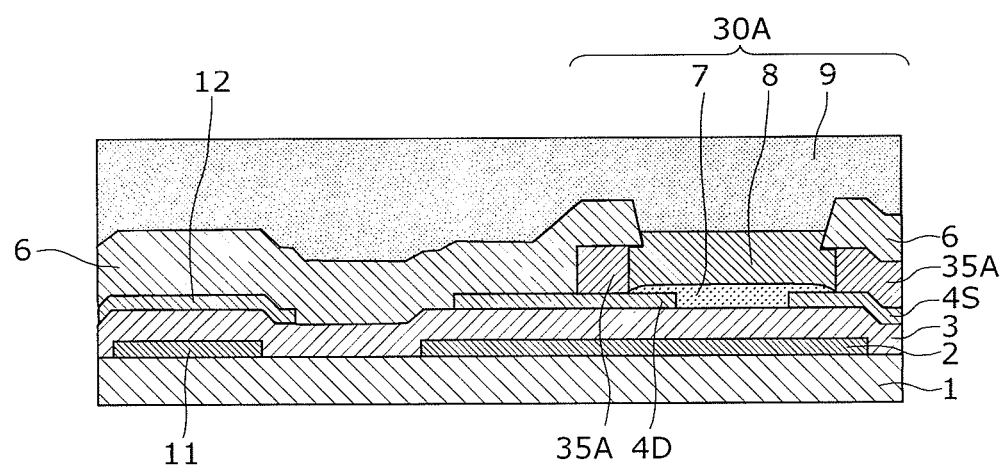
[FIG. 21B]

Next, with reference to FIG. 21A and FIG. 21B, a description is given of an organic thin-film transistor 30A according to Variation 1 of Embodiment 3 of the present invention. FIG. 21A is a cross-sectional view of a structure of the organic thin-film transistor according to Variation 1 of Embodiment 3 of the present invention, and FIG. 21B is a cross-sectional view of a structure of a wired substrate including the organic thin-film transistor according to this variation. In each of FIG. 21A and FIG. 21B, the same structural elements as in a corresponding one of FIG. 17A and FIG. 17B are assigned with the same numerical references, and detailed descriptions thereof are skipped or simplified.

As shown in FIG. 21A and FIG. 21B, the organic thin-film transistor 30A and the wired substrate according to this variation are respectively different from the organic thin-film transistor 10 and the wired substrate in FIG. 17A and FIG. 17B in that the sacrificial layer 35A has an opening-side edge positioned outward from the edge of the opening in the partition wall part 6.

The method of manufacturing the organic thin-film transistor 30A according to this variation is similar to the method of manufacturing the organic thin-film transistor 30 according to Embodiment 3. In this variation, the end portion of the sacrificial layer 35A is etched so that its opening-side edge is positioned outward from the edge of the opening in the partition wall part 6. In this variation, in the etching of the sacrificial layer 35 in (a) of FIG. 19, the exposed sacrificial layer 35 is etched so that its side surface above the source electrode 4S and the opposing side surface above the drain electrode 4D become apart from each other with respect to the edge of the opening of the partition wall part 6.

This structure can be formed by removing by wet etching the end portion of the sacrificial layer 35A exposed in the opening of the partition wall part 6. In this case, it is preferable to use, as the material for the sacrificial layer 35A, a material having a large etching selection ratio with each of the materials of the source electrode 4S, the drain electrode 4D, and the partition wall part 6. In other words, it is preferable to select the material for the sacrificial layer 35A so that the etching rate of the sacrificial layer 35A against an etching solution is larger by a certain level than the etching rates of the source electrode 4S (drain electrode 4D) and the partition wall part 6 against the etching solution. In this way, it is possible to balance the etching selection ratio between the sacrificial layer 35A and each of the source electrode 4S (the drain electrode 4D) and the partition wall part 6, and to thereby remove the side-surface part of the sacrificial layer 35A up to the outward position. The sacrificial layer 35A is preferably formed using a material which is easily etched by hydrofluoric acid.

As described above, the organic thin-film transistor 30A according to this variation provides effects similar to the effects provided by the organic thin-film transistor 30 according to Embodiment 3.

(Variation 2 of Embodiment 3)

Figure 22A:
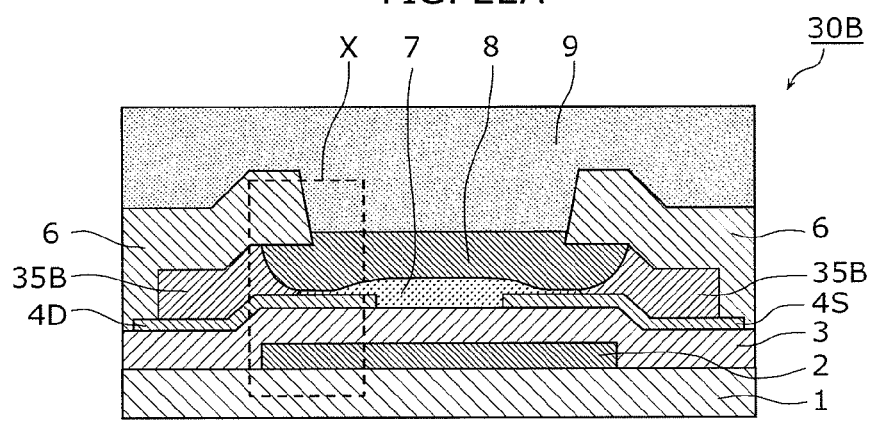
[FIG. 22A]
Figure 22B:
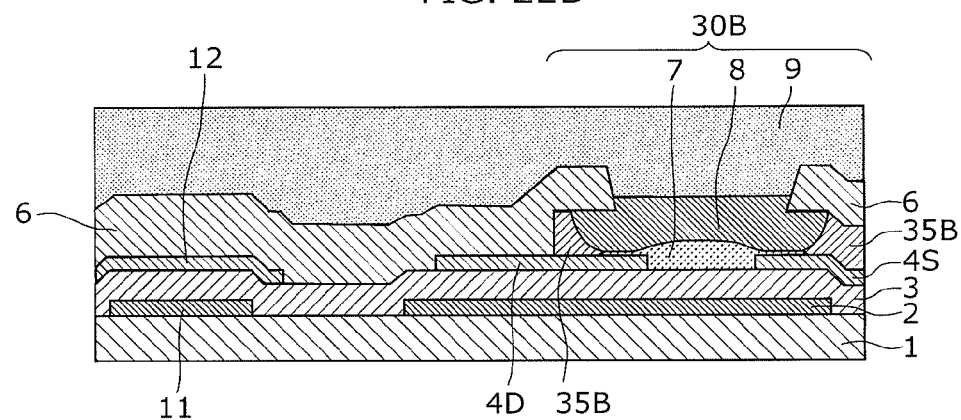
[FIG. 22B]
Figure 22C:
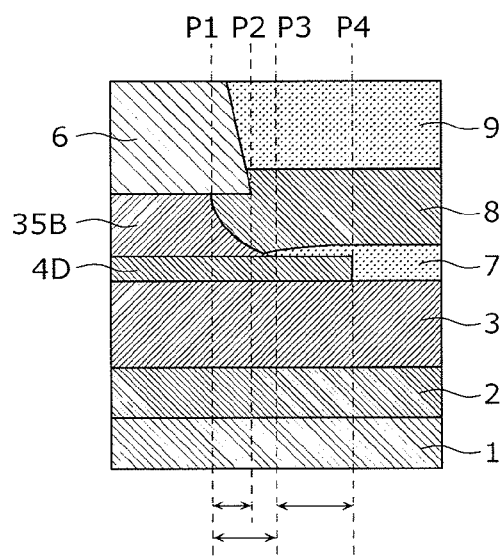
[FIG. 22C]

Next, with reference to FIG. 22A, FIG. 22B, and FIG. 22C, a description is given of an organic thin-film transistor 30B according to Variation 2 of Embodiment 3 of the present invention. FIG. 22A is a cross-sectional view of a structure of the organic thin-film transistor according to Variation 2 of Embodiment 3 of the present invention, FIG. 22B is a cross-sectional view of a structure of a wired substrate including the organic thin-film transistor according to this variation, and FIG. 22C is an enlarged cross-sectional view of the area X enclosed by the broken line shown in FIG. 22A. In FIG. 22A to FIG. 22C, the same structural elements as in FIG. 17A and FIG. 17B are assigned with the same numerical references, and detailed descriptions thereof are skipped or simplified.

As shown in FIG. 22A and FIG. 22B, the organic thin-film transistor 30B and the wired substrate according to this variation are respectively different from the organic thin-film transistor 30 and the wired substrate in FIG. 17A and FIG. 17B in that the sacrificial layer 35B has an opening-side edge positioned outward from the edge of the opening in the partition wall part 6, as in Variation 1. In addition, although Variation 1 includes the sacrificial layer 35A having the opening-side edge with a straight-line-shaped cross section, this variation includes the sacrificial layer 35B having the opening-side edge with an arc-shaped cross section.

The method of manufacturing the organic thin-film transistor 30B according to this variation is similar to the method of manufacturing the organic thin-film transistor 30A according to Variation 2. In this variation, the end portion of the sacrificial layer 35B is etched so that its opening-side edge is positioned further outward from the edge of the opening in the partition wall part 6.

This structure can be formed by removing by wet etching the end portion of the sacrificial layer 35B exposed in the opening of the partition wall part 6, as in Variation 1. For example, when using the same materials for the sacrificial layer 35B, the source electrode 4S, and the drain electrode 4D as those in Variation 1, it is possible to form the structure by lengthening the etching time. Alternatively, it is possible to form the structure by selecting, as the material for the sacrificial layer 35B, a material having a larger etching selection ratio with respect to each of the source electrode 4S, the drain electrode 4D, and the partition wall part 6 than the etching selection ratio in Variation 1.

As described above, the organic thin-film transistor 30B according to this variation provides effects similar to the effects provided by the organic thin-film transistor 30 according to Embodiment 3.

In addition, as shown in FIG. 22C, assuming that P1 denotes a position which is of the edge (upper edge) of the sacrificial layer 35B and is inward of the edge (lower edge) of the opening of the partition wall part 6, P2 denotes a position of the edge (lower edge) of the opening of the partition wall part 6, P3 denotes a position of the edge (lower edge) of the sacrificial layer 35B, and P4 denotes a position of the opening-side edge of the source electrode 4S (or the drain electrode 4D), an area between P3 and P4 is an area (i) in which contact between the organic semiconductor layer 7 and the source electrode 4S (or the drain electrode 4D) is to be made, and (ii) which determines the crystal state of the organic semiconductor layer 7. Accordingly, no residue 6a of the partition wall layer 6R is left in the area between P3 and P4 because of removal of the residues 6a together with the sacrificial layer 35B. The distance between P3 and P4 is preferably 3 μm or more.

In addition, as long as an area suitable for making the contact is secured between P3 and P4, P3 may be positioned closer to the channel area side than P2, as shown in FIG. 22C. In other words, either of the following may be used: (the distance between P1 and P3)≥(the distance between P1 and P2); and (the distance between P1 and P3)<(the distance between P1 and P2).

[Embodiment 4]

Figure 23A:
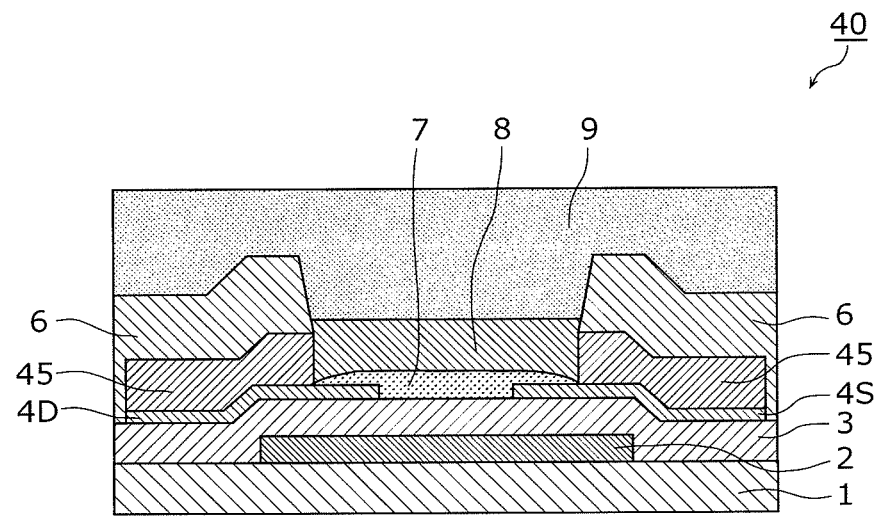
[FIG. 23A]
Figure 23B:
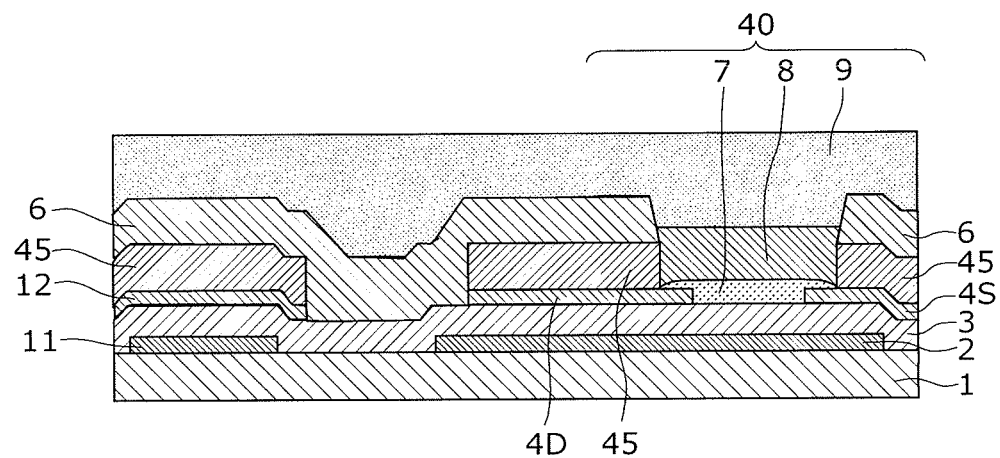
[FIG. 23B]

Next, with reference to FIG. 23A and FIG. 23B, a description is given of an organic thin-film transistor 40 according to Embodiment 4 of the present invention. FIG. 23A is a cross-sectional view of a structure of the organic thin-film transistor according to Embodiment 4 of the present invention, and FIG. 23B is a cross-sectional view of a structure of a wired substrate including the organic thin-film transistor according to Embodiment 4. In each of FIG. 23A and FIG. 23B, the same structural elements as in a corresponding one of FIG. 17A and FIG. 17B are assigned with the same numerical references, and detailed descriptions thereof are skipped or simplified.

As shown in FIG. 23A, the organic thin-film transistor 40 according to this embodiment is a TFT of a bottom gate type and a p-type (p-channel), and includes a substrate 1, a gate electrode 2, a gate insulator 3, a source electrode 4S, a drain electrode 4D, a sacrificial layer 45, a partition wall part 6 having an opening, and an organic semiconductor layer 7 formed in the opening of the partition wall part 6. Furthermore, the organic thin-film transistor 20 includes a protection film 8 and an interlayer insulator 9.

The organic thin-film transistor 40 according to this embodiment is different in the structure of the sacrificial layer from the organic thin-film transistor 30 according to Embodiment 3. In Embodiment 3, the sacrificial layer 35 and the second metal film 4M are separately patterned. However, in this embodiment, the sacrificial layer 45 and the second metal film 4M are collectively patterned. In this way, the sacrificial layer 45 in an area other than the opening of the partition wall part 6 is formed to have the same shape as the shapes of the source electrode 4S and the drain electrode 4D in a top plan view.

In this embodiment, the sacrificial layer 45 is also formed above the source electrode 4S and the drain electrode 4D. However, in this embodiment, the sacrificial layer 45 has a top-plan-view shape which is the same as top-plan-view shapes of the source electrode 4S and the drain electrode 4D. In this embodiment, since the end portion which is of the sacrificial layer 45 and is exposed in the opening is removed by dry etching, the sacrificial layer 45 is formed to have an edge which is vertically flat with the edge of the opening in the partition wall part 6, as in Embodiment 3. In other words, the opening-side edge of the sacrificial layer 45 and the opening in the partition wall part 6 are formed to be continuous and vertically flat.

In addition, the sacrificial layer 45 can be made using an insulation material which is an organic insulation material such as a photosensitive agent made of a resin or an inorganic insulation material, as in Embodiment 3.

When the sacrificial layer 45 is made of an insulation material, the sacrificial layer 45 desirably includes a fluorine additive, as in Embodiment 3. In this way, since it is possible to increase repellency to liquid of the sacrificial layer 45, it is possible to further gather the organic semiconductor material applied to the opening of the partition wall part 6 to the center area of the opening of the partition wall part 6.

In this embodiment, it is also preferable to use, as the material for the sacrificial layer 45, a material having a large etching selection ratio with each of the materials of the source electrode 4S, the drain electrode 4D, and the partition wall part 6. In this way, it is possible to balance the etching selection ratio between the sacrificial layer 45 and each of the source electrode 4S (the drain electrode 4D) and the partition wall part 6, and to thereby easily and selectively remove only the portion which is of the sacrificial layer 45 and in the opening of the partition wall part 6.

In addition, also in this embodiment, the source electrode 4S and the drain electrode 4D facing each other are formed to have end portions exposed in the opening of the partition wall part 6. In other words, the opening-side end portions of the source electrode 4S and drain electrode 4D are formed to position in the opening portion of the partition wall part 6 in a top plan view, and the partition wall part 6 is formed so as not to be positioned above the end portions in the opening.

Figure 24:
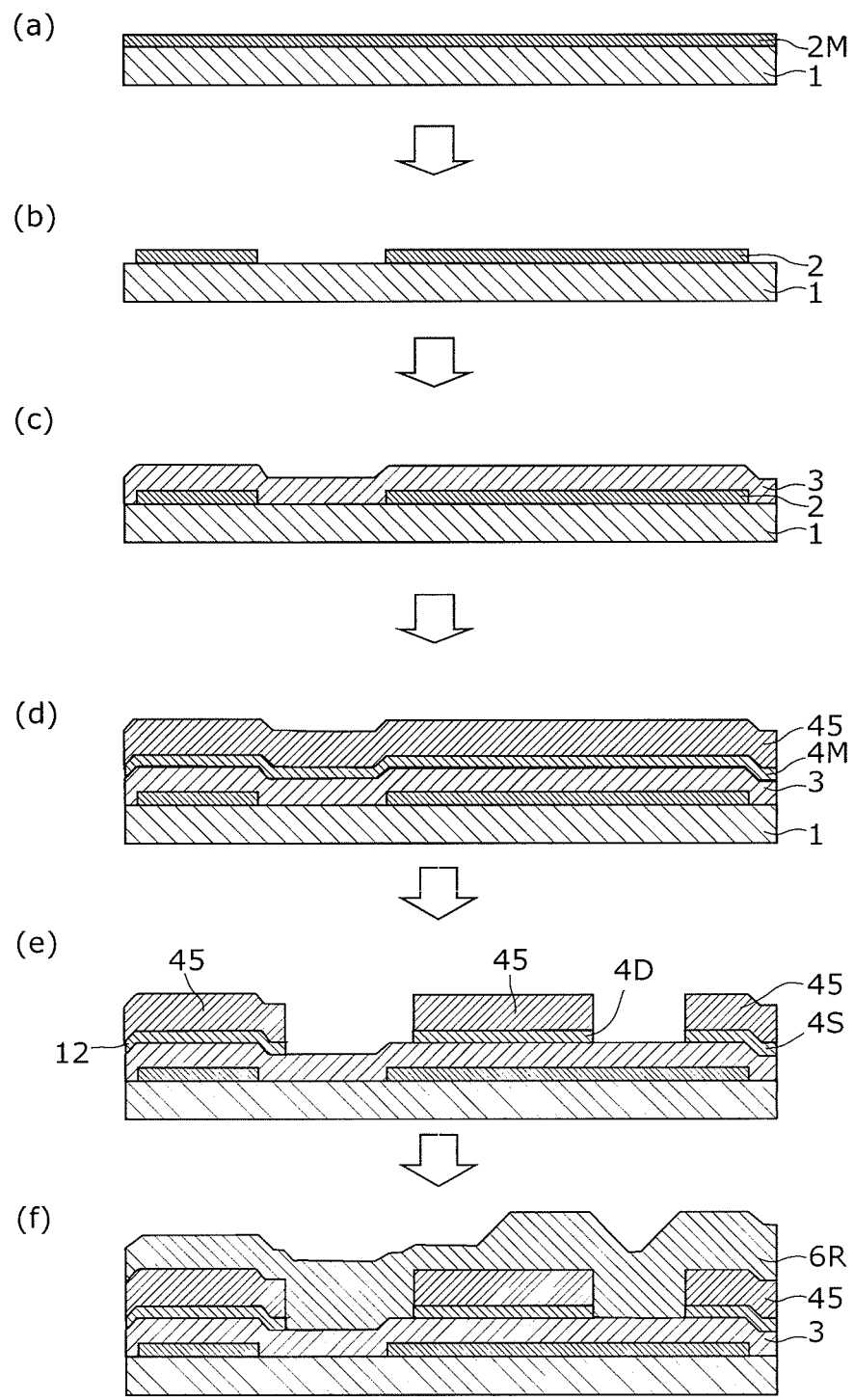
[FIG. 24]
Figure 25:
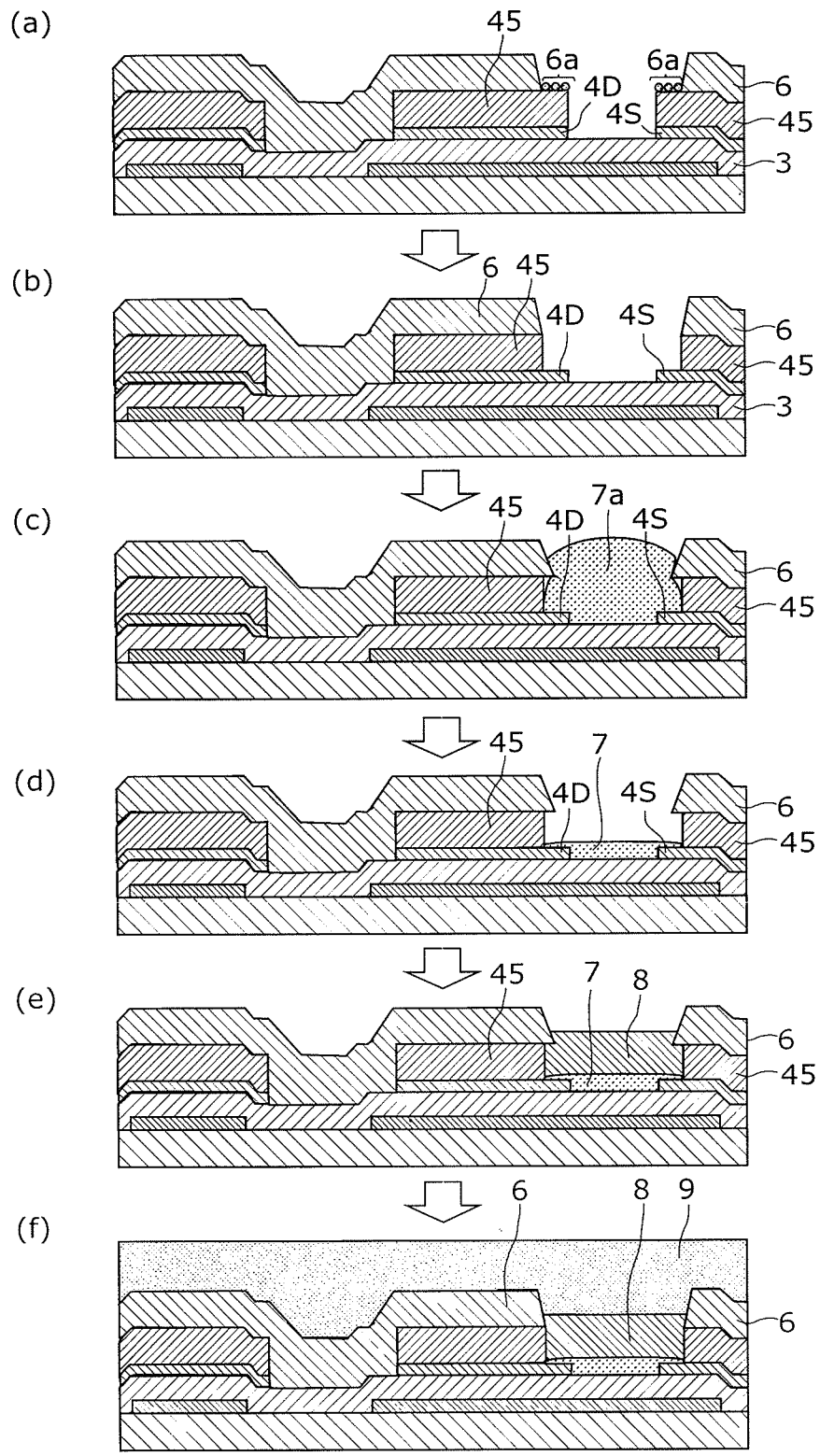
[FIG. 25]

Next, with reference to FIG. 24 and FIG. 25, a description is given of a method of manufacturing the organic thin-film transistor 40 according to Embodiment 4 of the present invention. Each of FIG. 24 and FIG. 25 is a cross-sectional view for explaining processes in the method of manufacturing the organic thin-film transistor according to Embodiment 4 of the present invention. In this embodiment, differences from Embodiment 3 are mainly described.

First, as in Embodiment 3, as shown in (a) of FIG. 24, a first metal film (gate metal film) 2M is formed above the substrate 1 by depositing a material for the gate electrode 2. Subsequently, as shown in (b) of FIG. 24, the first metal film 2M is patterned using photolithography or etching to form the gate electrode 2 having a predetermined shape. Subsequently, as shown in (c) of FIG. 24, a gate insulator 3 is formed above the gate electrode 2.

Next, as shown in (d) of FIG. 24, a second metal film (source drain metal film) 4M is formed by depositing a material for the source electrode 4S and the drain electrode 4D, above the entire surface of the gate insulator 3. Next, as shown in the diagram, a sacrificial layer 45 is formed by depositing a predetermined material above the entire surface of the second metal film 4M, continuously from the formation of the second metal film 4M.

Next, as shown in (e) of FIG. 24, the sacrificial layer 45 and the second metal film 4M are collectively patterned through photolithography and etching at the same time. In this way, the source electrode 4S and the drain electrode 4D which are paired and have predetermined shapes can be formed and the sacrificial layer 45 can be formed by depositing above the source electrode 4S and the drain electrode 4D to have the same shape with the source electrode 4S and the drain electrode 4D. In addition, through the etching at this time, the gate insulator 3 is exposed between the source electrode 4S and the drain electrode 4D.

The etching performed here can be wet etching or dray etching. In addition, when collectively patterning the second metal film 4M and the sacrificial layer 45, it is possible to form by patterning the wiring above the TFT array substrate at the same time of forming by patterning the source electrode 4S, the drain electrode 4D, and the sacrificial layer 45 at the same time.

Next, as shown in (f) of FIG. 24, a partition wall layer 6R is formed by applying a predetermined material for the partition wall part 6 above the entire surface above the substrate 1. In this way, it is possible to form the partition wall layer 6R to cover the sacrificial layer 45, the source electrode 4S, the drain electrode 4D, and the exposed gate insulator 3 etc.

Next, as shown in (a) of FIG. 25, as in Embodiment 3, the partition wall layer 6R is patterned to re-expose the gate insulator 3 between the source electrode 4S and the drain electrode 4D and partly expose the sacrificial layer 45 above the source electrode 4S and the drain electrode 4D, so that an opening is formed above the gate electrode 2. In this way, it is possible to form the partition wall part 6 having a predetermined shape, and the opening and the partition wall portion (bank).

As shown in the diagram, as in Embodiment 3, residues 6a of the partition wall layer 6R exist on the exposed surfaces of the end portions of the sacrificial layer 45 after the development of the partition wall layer 6R.

Next, as shown in (b) of FIG. 25, as in Embodiment 3, the sacrificial layer 45 exposed in the opening of the partition wall part 6 is removed by etching, using as a mask, the partition wall portion of the partition wall part 6, so as to expose the end portions of the source electrode 4S and the drain electrode 4D positioned below the sacrificial layer 45. In this process, the sacrificial layer 45 is removed by etching above the end portions of the source electrode 4S and the drain electrode 4D in the portions to be exposed in the opening. In this embodiment, the sacrificial layer 45 has been etched by dry etching. In this way, the sacrificial layer 45 is etched to have an opening-side edge which is vertically flat with the edge of the opening in the partition wall part 6.

Through this process, also in this embodiment, since the end portions of the sacrificial layer 45 exposed in the opening of the partition wall part 6 are removed, the residues 6a of the partition wall layer 6R above the end portions of the sacrificial layer 45 are removed together with the sacrificial layer 45. In other words, the residues 6a of the partition wall layer 6R are removed by lift-off at the time of etching of the end portions of the sacrificial layer 45. In this way, the residues 6a of the partition wall layer 6R are not left above the source electrode 4S and the drain electrode 4D, and it is possible to clean the surfaces of the end portions of the source electrode 4S and the drain electrode 4D.

Next, as shown in (c) of FIG. 25, a solution (an organic semiconductor solution) including an organic semiconductor material is applied to the inside of the opening of the partition wall part 6 using an ink jet method, as in Embodiment 3. At this time, since the solution including the organic semiconductor material is sandwiched by the sacrificial layer 45, the solution including the organic semiconductor material is inflated at the center due to surface tension.

Subsequently, the solution including the organic semiconductor material is dried for solidification by performing a predetermined heat treatment on the solution so as to crystallize the organic semiconductor material, as in Embodiment 3. In this way, as shown in (d) of FIG. 25, it is possible to form the organic semiconductor layer 7 inside the opening of the partition wall part 6. In this case, also in this embodiment, the organic semiconductor layer 7 in the channel layer is grown to be thick due to the repellency effect of the organic semiconductor material of the sacrificial layer 45.

Next, as shown in (e) of FIG. 25, the solution including an overcoat material which is a material for a protection film 8 is applied to the inside of the opening of the partition wall part 6 from above the organic semiconductor layer 7 using an ink jet method, and the solution is dried to form the protection film 8. Subsequently, as shown in (f) of FIG. 25, an interlayer insulator 9 is formed above the entire surface above the substrate 1 including the protection film 8.

In this way, it is possible to form the organic thin-film transistor 40 according to this embodiment.

As described above, as in Embodiment 3, in the organic thin-film transistor 40 according to Embodiment 4 of the present invention, the residues 6a of the partition wall layer 6R at the time of forming the opening in the partition wall layer 6R are removed by etching the sacrificial layer 45 above the source electrode 4S and the drain electrode 4D. In this way, it is possible to achieve the organic semiconductor layer 107 having an excellent crystallizability and to suppress increase in the contact resistances, and to thereby achieve the organic thin-film transistor having excellent ON characteristics.

In this embodiment as in Embodiment 3, the area rate of the source electrode 4S and the drain electrode 4D with respect to the opening is equal to or larger than 50%, and the interval (channel length) between the source electrode 4S and the drain electrode 4D is smaller than an average grain diameter (average grain size) of crystals of the organic semiconductor layer 7 positioned above the source electrode 4S and the drain electrode 4D. In this way, it is possible to form the organic semiconductor layer 7 composed of large-grain crystals which transverse the source electrode 4S and the drain electrode 4D. Accordingly, it is possible to reduce the number of grain boundaries between the source electrode 4S and the drain electrode 4D, and to thereby increase the carrier mobility.

In addition, also in this embodiment, the solvent of the organic semiconductor material applied to the opening of the partition wall part 6 due to the presence of the sacrificial layer 45, and thus it is possible to form the organic semiconductor layer 7 having a large thickness in the channel area. In this way, it is possible to further increase the ON characteristics.

(Variation 1 of Embodiment 4)

Figure 26A:
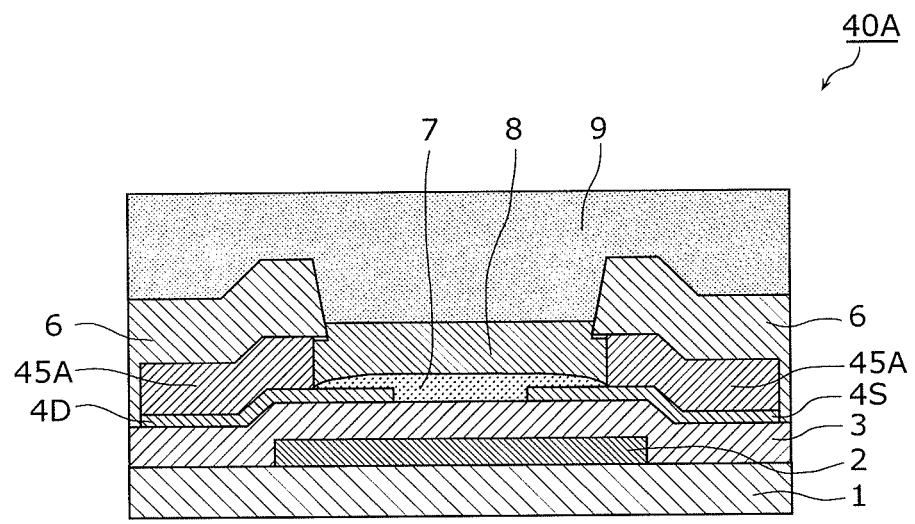
[FIG. 26A]
Figure 26B:
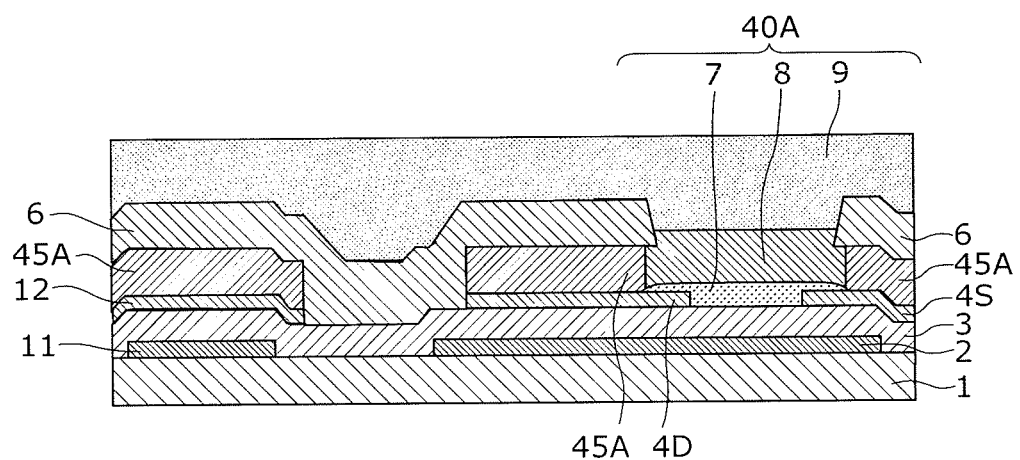
[FIG. 26B]

Next, with reference to FIG. 26A and FIG. 26B, a description is given of an organic thin-film transistor 40A according to Variation 1 of Embodiment 4 of the present invention. FIG. 26A is a cross-sectional view of a structure of the organic thin-film transistor according to Variation 1 of Embodiment 4 of the present invention, and FIG. 26B is a cross-sectional view of a structure of a wired substrate including the organic thin-film transistor according to this variation. In each of FIG. 26A and FIG. 26B, the same structural elements as in a corresponding one of FIG. 23A and FIG. 23B are assigned with the same numerical references, and detailed descriptions thereof are skipped or simplified.

As shown in FIG. 26A and FIG. 26B, the organic thin-film transistor 40A and the wired substrate according to this variation are respectively different from the organic thin-film transistor 40 and the wired substrate in FIG. 23A and FIG. 23B in that the sacrificial layer 45A has an opening-side edge positioned outward from the edge of the opening in the partition wall layer 6.

The method of manufacturing the organic thin-film transistor 40A according to this variation is similar to the method of manufacturing the organic thin-film transistor 40 according to Embodiment 4. In this variation, the end portion of the sacrificial layer 45A is etched so that the opening-side edge is positioned outward from the edge of the opening in the partition wall layer 6. In other words, in this variation, in the etching of the sacrificial layer 45 in (a) of FIG. 25, the exposed sacrificial layer 45 is etched so that its side surface above the source electrode 4S and the opposing side surface above the drain electrode 4D are apart from each other with respect to the edge of the opening of the partition wall part 6.

This structure can be formed by removing by wet etching the end portion of the sacrificial layer 45A exposed in the opening of the partition wall part 6. In this case, it is preferable to use, as the material for the sacrificial layer 45A, a material having a large etching selection ratio with each of the materials of the source electrode 4S, the drain electrode 4D, and the partition wall part 6. In other words, it is preferable to select the material for the sacrificial layer 45A so that the etching rate of the sacrificial layer 45A against an etching solution is larger by a certain level than the etching rates of the source electrode 4S (drain electrode 4D) and the partition wall part 6 against the etching solution. In this way, it is possible to balance the etching selection ratio between the sacrificial layer 45A and each of the source electrode 4S (the drain electrode 4D) and the partition wall part 6, and to thereby remove the side-surface part of the sacrificial layer 45A up to the outward position. The sacrificial layer 45A is preferably formed using a material which is easily etched by hydrofluoric acid.

As described above, the organic thin-film transistor 40A according to this variation provides effects similar to the effects provided by the organic thin-film transistor 40 according to Embodiment 4.

(Variation 2 of Embodiment 4)

Figure 27A:
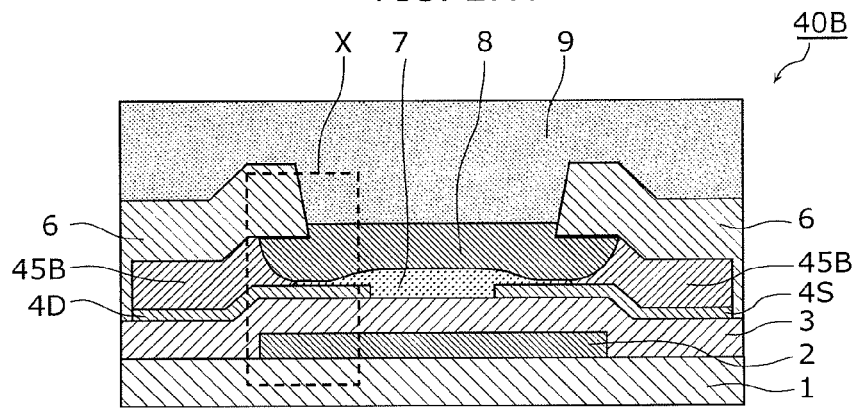
[FIG. 27A]
Figure 27B:
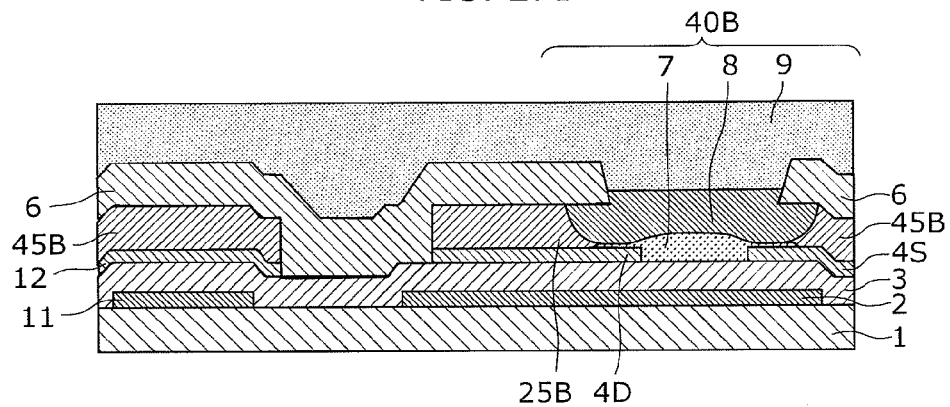
[FIG. 27B]
Figure 27C:
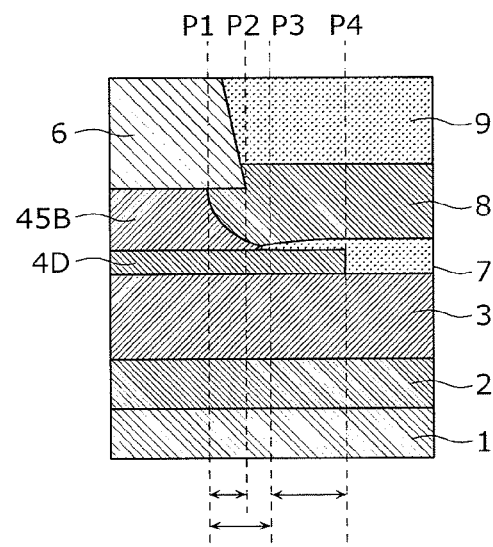
[FIG. 27C]

Next, with reference to FIG. 27A, FIG. 27B, and FIG. 27C, a description is given of an organic thin-film transistor 40B according to Variation 2 of Embodiment 4 of the present invention. FIG. 27A is a cross-sectional view of a structure of the organic thin-film transistor according to Variation 2 of Embodiment 4 of the present invention, FIG. 27B is a cross-sectional view of a structure of a wired substrate including the organic thin-film transistor according to this variation, and FIG. 27C is an enlarged cross-sectional view of the area X enclosed by the broken line shown in FIG. 27A. In FIG. 27A to FIG. 27C, the same structural elements as in FIG. 23A and FIG. 23B are assigned with the same numerical references, and detailed descriptions thereof are skipped or simplified.

As shown in FIG. 27A and FIG. 27B, as in Variation 1, the organic thin-film transistor 40B and the wired substrate according to this variation are respectively different from the organic thin-film transistor 40 and the wired substrate in FIG. 23A and FIG. 23B in that the sacrificial layer 45B has an opening-side edge positioned outward from the edge of the opening in the partition wall layer 6. In addition, although Variation 1 includes the sacrificial layer 45A having the opening-side edge with the straight-line-shaped cross section, this variation includes the sacrificial layer 45B having an opening-side edge with an arc-shaped cross section.

The method of manufacturing the organic thin-film transistor 40B according to this variation is similar to the method of manufacturing the organic thin-film transistor 40 according to Variation 2. In this variation, the end portion of the sacrificial layer 45B is etched so that its opening-side edge is positioned further outward from the edge of the opening in the partition wall layer 6.

This structure can be formed by removing by wet etching the end portion of the sacrificial layer 45B exposed in the opening of the partition wall part 6, as in Variation 1. For example, when using the same materials for the sacrificial layer 45B, the source electrode 4S, and the drain electrode 4D as those in Variation 1, it is possible to form the structure by lengthening the etching time. Alternatively, it is possible to form the structure by selecting, as the material for the sacrificial layer 45B, a material having a larger etching selection ratio with respect to each of the source electrode 4S, the drain electrode 4D, and the partition wall part 6 than the etching selection ratio in Variation 1.

As described above, the organic thin-film transistor 40B according to this variation provides effects similar to the effects provided by the organic thin-film transistor 40 according to Embodiment 1.

In addition, as shown in FIG. 27C, no residue 6a of the partition wall layer 6R is left in the area between P3 and P4 because of removal of the residues 6a together with the sacrificial layer 45B, as in FIG. 22C. The distance between P3 and P4 is preferably 3 µm or more. In addition, as long as an area suitable for making the contact is secured between P3 and P4, P3 may be positioned closer to the channel area side than P2.

[Embodiment 5]

Next, an example of applying the organic thin-film transistor according to each of the above embodiments to a display device is described with reference to FIG. 28. In this embodiment, the organic thin-film transistor according to Embodiment 1 is described based on the example of applying the organic thin-film transistor according to Embodiment 1 to the organic EL display device.

Figure 28:
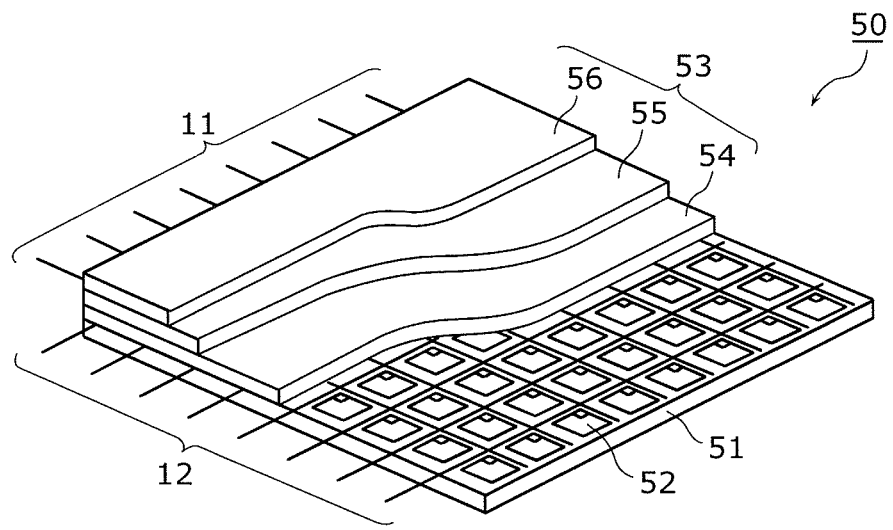
[FIG. 28]

FIG. 28 is a partially cutaway perspective view of an organic EL display device according to Embodiment 5 of the present invention. The aforementioned organic thin-film transistor can be used as any of a switching transistor and a driver transistor of an active matrix substrate in the organic EL display device.

As shown in FIG. 28, the organic EL display device 50 includes: an active matrix substrate (TFT array substrate) 51; a plurality of pixels 52 arranged in a matrix above the active matrix substrate 51; an organic EL elements 53 formed correspondingly to the respective pixels 52; a plurality of scanning lines (gate lines) formed along the row direction of the pixels 52; a plurality of video signal lines (source lines) 12 formed along the column direction of the pixels 52; and a power source line 13 (not shown) formed in parallel to the video signal lines 12. Each of the organic EL elements 53 includes a positive electrode 54, an organic EL layer 55, and a negative electrode 56 (transparent electrode) stacked sequentially above the active matrix substrate 51. Actually, a plurality of positive electrodes 54 are formed correspondingly to the respective pixels 52. In addition, a plurality of organic EL layers 55 are formed correspondingly to the respective pixels 52, and each of the organic EL layers 55 is a stack including an electron transport layer, a light emitting layer, and a hole transport layer.

Figure 29:
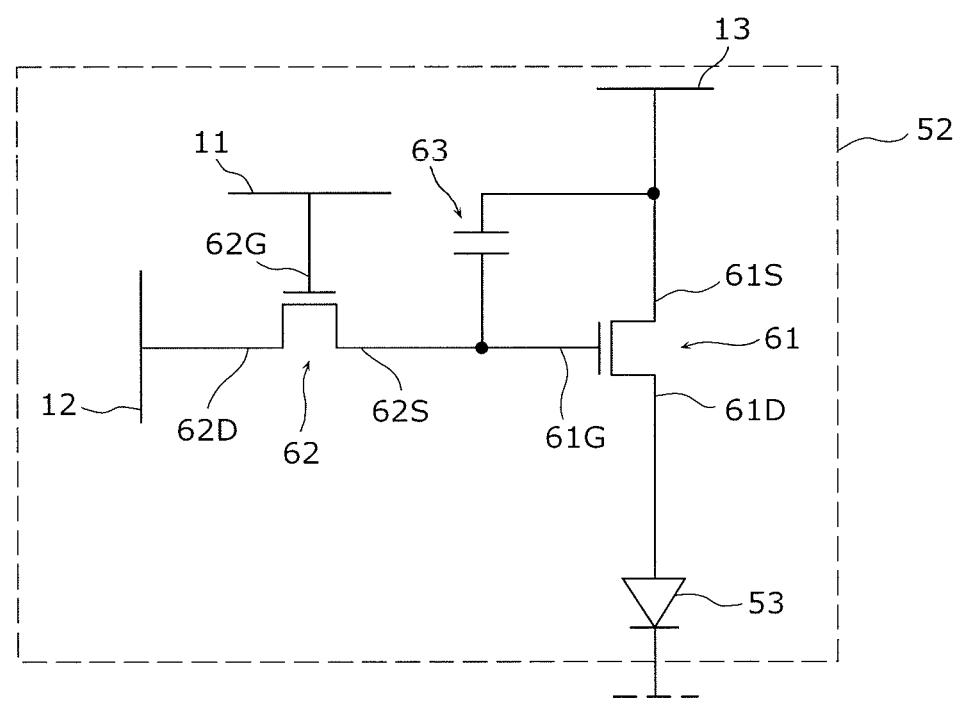
[FIG. 29]

Next, the circuit structure of the pixels 52 in the organic EL display device 50 is described with reference to FIG. 29. FIG. 29 is a diagram showing a circuit structure of pixels each including the organic thin-film transistor according to Embodiment 5 of the present invention.

As shown in FIG. 29, the pixels 52 are defined by the scanning lines 11 and the video signal lines 12 which are orthogonal to each other, and each of the pixels 52 includes a driver transistor 61, a switching transistor 62, a capacitor 63, and an organic EL element 53.

The driver transistor 61 is the transistor that drives the organic EL element 53, and the switching transistor 62 is the transistor for selecting (switching), among the pixels 52, to target pixels to which a video signal voltage is to be supplied.

In the driver transistor 61, a gate electrode 61G is connected to a source electrode 62S of the switching transistor, a source electrode 62S is connected to a power source line 13, and a drain electrode 61D is connected to an anode of the organic EL device 53 via a relay electrode.

In addition, in the switching transistor 62, a gate electrode 62G is connected to a corresponding one of the scanning lines 11, a drain electrode 62D is connected to a corresponding one of the video signal lines 12, a source electrode 62S is connected to a capacitor 63 and a gate electrode 61G of the driver transistor 61.

In this structure, when a gate signal input to the scanning lines 11 switches on the switching transistor 62, the video signal voltage supplied via the video signal line 12 is written into the capacitor 63. The video signal voltage written into the capacitor 63 is held during a one-frame period. This video signal voltage changes the conductance of the driver transistor 61 in an analog manner, which causes a driving current corresponding to a light emission gradation to flow from the positive electrode (anode) to the negative electrode (cathode) of the organic EL element 53 so as to cause the organic EL element to emit light.

In this embodiment, the organic thin-film transistor according to Embodiment 1 is used. However, the organic thin-film transistor according to another one of the embodiments and variations may be used instead. Although the organic thin-film transistor including the organic EL element has been described in this embodiment, it is possible to apply the present invention to another display device including an active matrix substrate. In addition, it is possible to use the display device configured as described above as a flat panel display, and apply the display device to various kinds of electric appliances such as television sets, personal computers, mobile phones, each including a display panel.

(Variation)

Figure 30A:
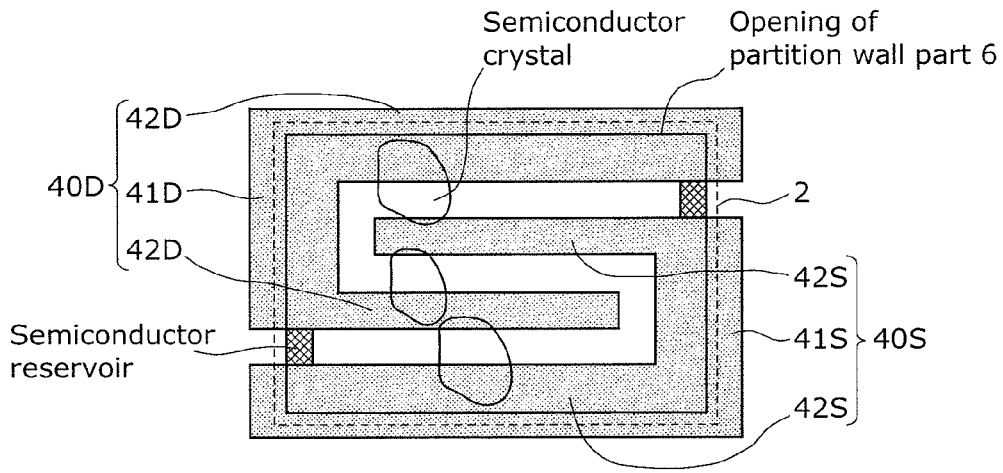
[FIG. 30A]
Figure 30B:
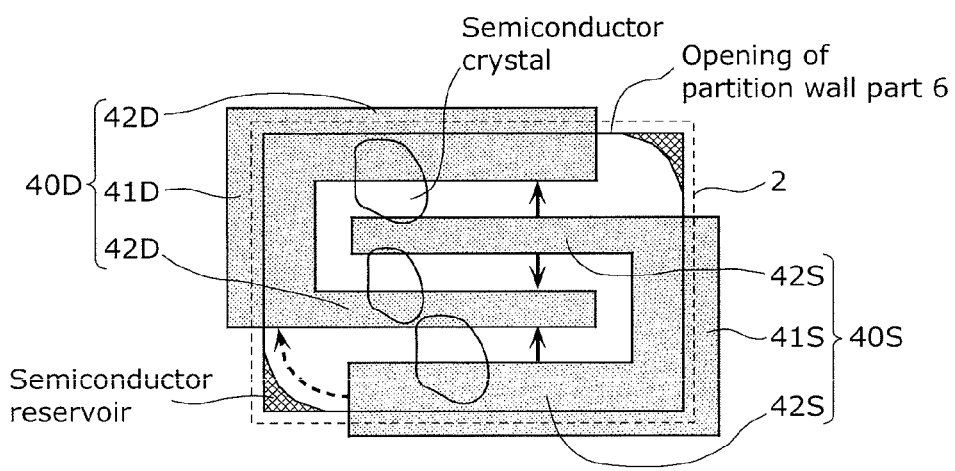
[FIG. 30B]

Hereinafter, with reference to FIG. 30A and FIG. 30B, a description is given of an organic thin-film transistor according to Variation of the present invention. FIG. 30A shows a top plan view of a structure of an organic thin-film transistor according to Comparison example 2. FIG. 30B is a top plan view of a structure of an organic thin-film transistor according to a variation of the present invention.

In the inner peripheral portion of the opening of the partition wall part 6, the material of the organic semiconductor layer 7 applied to the inside of the opening is likely to rise along the partition wall layer (inner wall), which is likely to increase the thickness of the resulting semiconductor layer. For this reason, in the inner peripheral portion of the opening of the partition wall part 6, the organic semiconductor layer 7 tends to be made of crystals having small crystal grain diameters. As a result, it may be impossible to obtain excellent TFT characteristics due to occurrence of a hump phenomenon.

For example, as shown in FIG. 30A, when the source electrode 40S and the drain electrode 40D are comb-shaped electrodes, the applied organic semiconductor material may be accumulated, as semiconductor reservoir, at the inner peripheral portion of the opening of the partition wall part 6. In this case, the crystallizability of the organic semiconductor layer 7 decreases (results in small grain diameters), which causes a hump phenomenon.

Accordingly, in this variation, as shown in FIG. 30B, the comb-shaped portions of the source electrode 40S and the drain electrode 40D which are comb-shaped electrodes are arranged so that the tips of the comb-tooth portions are apart from each other with respect to the opening which has a rectangular shape of the partition wall part 6. In other words, the tips of the comb-tooth portions of the source electrode 40S and drain electrode 40D are positioned inward of the opening from the inner peripheral (outside) portion of the opening. Hereinafter, this is described in detail.

As shown in FIG. 30B, the source electrode 40S includes a main member 41S formed along a side (first side) of the opening which is rectangular, and two sub members (comb-tooth portions) 42S formed extending from the end portions of the main member 41S. One of the two sub members 42S is formed along a side (second side) of the rectangular opening. Likewise, the drain electrode 40D includes a main member 41D formed along a side (third side) of the rectangular opening, and two sub members (comb-tooth portions) 42D formed extending from both the end portions of the main member 41D. One of the two sub members 42D is formed along a side (fourth side) of the rectangular opening. The source electrode 40S and the drain electrode 40D are configured to touch each other. In other words, the sub members (comb-tooth portions) 42S of the source electrode 40S and the sub members (comb-tooth portions) 42D of the drain electrode 40D are arranged alternately to face each other.

In this variation, the sub members 42S of the source electrode 40S formed along the side (second side) of the opening are formed backward of the side (third side) so that the tips are apart from the side (third side) of the opening. Likewise, the sub members 42D of the drain electrode 40D formed along the side (fourth side) of the opening are formed backward of the side (first side) so that the tips are apart from the side (first side) of the opening.

In this way, it is possible to form the structure in which the portions in contact with the inner peripheral portion of the opening are not included in the channel area. In this way, even when the organic semiconductor layer 7 has small crystal grain diameters at the inner peripheral portion of the opening, it is possible to reduce the influence of the crystals having the small grain diameters onto the TFT characteristics.

With reference to FIG. 30B, an example is shown in which semiconductor reservoir occurs at a corner portion of the opening, and the organic semiconductor layer 7 is formed to have crystals having small grain diameters at the corner portion. As described above, the tips of the sub members (comb-tooth portions) of the source electrode 40S and the drain electrode 40D are apart from the edge of the opening. Thus, as shown in the broken arrow, it is possible to increase an effective channel length (make a change into a high resistance state) at the corner portion, and to minimize the influence of the crystals having the small grain diameters at the corner portion. It is to be noted that current flowing between the source electrode 40S and the drain electrode 40D passes through channel areas having shortest sides as shown in the solid arrows.

In this way, according to this variation, it is possible to suppress occurrence of a hump phenomenon even when semiconductor reservoir occurs inside the opening, and to thus realize the organic thin-film transistor having excellent TFT characteristics.

The organic thin-film transistors and methods of manufacturing the same according to the present invention have been described above based on the embodiments and variations. However, the present invention is not limited to the embodiments. Those skilled in the art will readily appreciate that various modifications may be made in these exemplary embodiments and that variations of the embodiments may be obtained by arbitrarily combining the structural elements and functions in these embodiments without materially departing from the scope of the present invention. These modifications and variations are also included in the present invention. Although only some exemplary embodiments have been described in detail above.

INDUSTRIAL APPLICABILITY

The organic thin-film transistor according to the present invention is widely available to display devices such as television sets, personal computers, and mobile phones or other various kinds of electric appliances.

REFERENCE SIGNS LIST 1, 101 Substrate
2, 2', 61G, 62G, 102 Gate electrode
2M, 102M First metal film
3, 103 Gate insulator
4S, 40S, 61S, 62S, 104S Source electrode
4D, 40D, 61D, 62D, 104D Drain electrode
4M, 104M Second metal film
5, 5A, 5B, 25, 25A, 25B, 35, 35A, 35B, 45, 45A, 45B Sacrificial layer
6, 106 Partition wall part
6a, 106a Residue
6R, 106R Partition wall layer
7, 107 Organic semiconductor layer
8, 108 Protection film
9, 109 Interlayer insulator
10, 10A, 10B, 20, 20A, 20B, 30, 30A, 30B, 40, 40A, 40B, 100 Organic thin-film transistor
11 Scanning line
12 Video signal line
13 Power source line
41S, 41D Main member
42S, 42D Sub member
50 Organic EL display device
51 Active matrix substrate
52 Pixel
53 Organic EL element
54 Positive electrode
55 Organic EL device
56 Negative electrode
61 Driver transistor
62 Switching transistor
63 Capacitor

The invention claimed is:

1. An organic thin-film transistor manufacturing method, comprising:
   forming a gate electrode above a substrate;
   forming a gate insulator above the gate electrode;
   forming a source electrode and a drain electrode spaced apart above the gate insulator;
   forming a sacrificial layer above the source electrode and the drain electrode;
   forming a partition wall layer above the sacrificial layer;
   forming an opening by patterning the partition wall layer to expose the gate insulator between the source electrode and the drain electrode and expose a part of the sacrificial layer above the source electrode and the drain electrode;
   removing the exposed part of the sacrificial layer to expose the source electrode and the drain electrode; and
   forming, in the opening, an organic semiconductor layer to cover exposed top surfaces of the source electrode and the drain electrode and a top surface of the gate insulator,
   wherein the exposed top surfaces of the source electrode and the drain electrode in the opening occupy 50% or more of a surface area of the opening,
   the source electrode and the drain electrode are spaced apart at an interval which is smaller than an average granular diameter of crystals each of which is at least partly positioned above at least one of the source electrode and the drain electrode among the crystals of the organic semiconductor layer, and
   in a top plan view, the source electrode exposed in the opening and the gate electrode overlap in a first area, the drain electrode exposed in the opening and the gate electrode overlap in a second area, and each of the first and second areas has, along a channel direction, a side having a length larger than the interval between the source electrode and the drain electrode.

2. The organic thin-film transistor manufacturing method according to claim 1,
   wherein, in a top plan view, the gate electrode has an end portion positioned outward from the opening.

3. The organic thin-film transistor manufacturing method according to claim 1,
   wherein, in a top plan view, the gate electrode has an end portion positioned inward from the opening.

4. The organic thin-film transistor manufacturing method according to claim 1,
   wherein the opening is rectangular,
   the source electrode is a comb-shaped electrode having a comb-tooth portion formed along a first side of the opening,
   the drain electrode is a comb-shaped electrode having a comb-tooth portion formed along a second side of the opening, the drain electrode being disposed such that at least one tooth of the comb-tooth portion of the drain electrode is positioned between teeth of the comb-tooth portion of the source electrode, and
   at least one of the comb-tooth portion of the source electrode and the comb-tooth portion of the drain electrode has a tip which is apart from a third side different from the first side and the second side of the opening.

5. The organic thin-film transistor manufacturing method according to claim 1,
   wherein the forming of a source electrode and a drain electrode spaced apart and the forming of a sacrificial layer include:
   forming a metal film above the gate insulator;
   forming the sacrificial layer above the metal film;
   patterning the sacrificial layer; and
   patterning the metal film to form the source electrode and the drain electrode.

6. The organic thin-film transistor manufacturing method according to claim 1,
   wherein the forming of a source electrode and a drain electrode spaced apart and the forming of a sacrificial layer include:
   forming a metal film above the gate insulator;
   forming the sacrificial layer above the metal film; and
   collectively patterning the sacrificial layer and the metal film.

7. The organic thin-film transistor manufacturing method according to claim 1,
wherein the sacrificial layer comprises one of a metal, a metal alloy, or a metal compound.

8. The organic thin-film transistor manufacturing method according to claim 7,
wherein the sacrificial layer has a sheet resistance lower than a sheet resistance of the source electrode and a sheet resistance of the drain electrode.

9. The organic thin-film transistor manufacturing method according to claim 1,
wherein the sacrificial layer comprises an insulation material.

10. The organic thin-film transistor manufacturing method according to claim 1,
wherein the sacrificial layer comprises a material having repellency to liquid.

11. The organic thin-film transistor manufacturing method according to claim 10,
wherein the sacrificial layer comprises a fluorine additive.

12. The organic thin-film transistor manufacturing method according to claim 1,
wherein, in the forming of an organic semiconductor layer, the organic semiconductor layer is formed by applying, to the opening, an organic semiconductor solution for forming the organic semiconductor layer and performing heat treatment on the organic semiconductor solution.

13. An organic thin-film transistor comprising:
a substrate;
a gate electrode above the substrate;
a gate insulator above the gate electrode;
a source electrode and a drain electrode above the gate insulator;
a sacrificial layer above the source electrode and the drain electrode;
a partition wall part above the sacrificial layer, and having an opening in which the gate insulator above the gate electrode is exposed; and
an organic semiconductor layer in the opening,
wherein the sacrificial layer is exposed, in the opening, the source electrode and the drain electrode,
the organic semiconductor layer covers, in the opening, exposed top surfaces of the source electrode and the drain electrode and a top surface of the gate insulator,
the exposed top surfaces of the source electrode and the drain electrode in the opening occupy 50% or more of a surface area of the opening,
the source electrode and the drain electrode are spaced apart at an interval which is smaller than an average granular diameter of crystals each of which is at least partly positioned above at least one of the source electrode and the drain electrode among the crystals of the organic semiconductor layer, and
in a top plan view, the source electrode exposed in the opening and the gate electrode overlap in a first area, the drain electrode exposed in the opening and the gate electrode overlap in a second area, and each of the first and second areas has, along a channel direction, a side having a length larger than the interval between the source electrode and the drain electrode.

14. The organic thin-film transistor according to claim 13,
wherein, in a top plan view, the gate electrode has an end portion positioned outward from the opening.

15. The organic thin-film transistor according to claim 13,
wherein, in a top plan view, the gate electrode has an end portion positioned inward from the opening.

16. The organic thin-film transistor according to claim 13,
wherein the opening is rectangular,
the source electrode is a comb-shaped electrode having a comb-tooth portion formed along a first side of the opening,
the drain electrode is a comb-shaped electrode having a comb-tooth portion formed along a second side of the opening, the drain electrode being disposed such that at least one tooth of the comb-tooth portion of the drain electrode is positioned between teeth of the comb-tooth portion the source electrode, and
at least one of the comb-tooth portion of the source electrode and the comb-tooth portion of the drain electrode has a tip which is apart from a third side different from the first side and the second side of the opening.

17. The organic thin-film transistor according to claim 13,
wherein the sacrificial layer is above a part of the source electrode and a part of the drain electrode.

18. The organic thin-film transistor according to claim 13,
wherein the sacrificial layer has a top-pla-view shape identical to top-plan-view shapes of the source electrode and the drain electrode in an area other than the opening of the partition wall layer.

19. The organic thin-film transistor according to claim 13,
wherein the sacrificial layer has, at a side of the opening, an edge which is vertically flat with an edge of the opening in the partition wall layer.

20. The organic thin-film transistor according to claim 13,
wherein the sacrificial layer has, at a side of the opening, an edge which is positioned outward from an edge of the opening in the partition wall layer.

21. The organic thin-film transistor according to claim 13,
wherein the sacrificial layer comprises one of a metal, a metal alloy, or a metal compound.

22. The organic thin-film transistor according to claim 21,
wherein the sacrificial layer has a sheet resistance lower than a sheet resistance of the source electrode and a sheet resistance of the drain electrode.

23. The organic thin-film transistor according to claim 13,
wherein the sacrificial layer comprises an insulation material.

24. The organic thin-film transistor according to claim 13,
wherein the sacrificial layer comprises a material having repellency to liquid.

25. The organic thin-film transistor according to claim 24,
wherein the sacrificial layer comprises a fluorine additive.

26. The organic thin-film transistor according to claim 13,
wherein the organic semiconductor layer is a layer formed using a coating method.

\* \* \* \* \*